(12) United States Patent
Morino et al.

(10) Patent No.: US 7,821,076 B2
(45) Date of Patent: Oct. 26, 2010

(54) SEMICONDUCTOR DEVICE

(75) Inventors: Naozumi Morino, Tokyo (JP); Atsushi Hiraiwa, Tokyo (JP); Kazutoshi Oku, Tokyo (JP); Toshiaki Ito, Tokyo (JP); Motoshige Igarashi, Tokyo (JP); Takayuki Sasaki, Tokyo (JP); Masao Sugiyama, Tokyo (JP); Hiroshi Yanagita, Tokyo (JP); Shinichi Watarai, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 13 days.

(21) Appl. No.: 12/422,278

(22) Filed: Apr. 12, 2009

(65) Prior Publication Data

US 2009/0278204 A1    Nov. 12, 2009

(30) Foreign Application Priority Data

May 9, 2008    (JP) .............................. 2008-123634

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 27/01 | (2006.01) |
| H01L 27/12 | (2006.01) |
| H01L 31/0392 | (2006.01) |
| H01L 23/62 | (2006.01) |

(52) U.S. Cl. ...................... 257/371; 257/338; 257/350; 257/351; 257/357; 257/369; 257/E27.067

(58) Field of Classification Search ................. 257/338, 257/350–351, 357, 369, 371, E27.067
See application file for complete search history.

(56) References Cited

U.S. PATENT DOCUMENTS

| 5,323,043 | A | * | 6/1994 | Kimura et al. | ............... 257/371 |
| 5,373,476 | A | * | 12/1994 | Jeon | ............................ 365/226 |
| 6,025,621 | A | * | 2/2000 | Lee et al. | ...................... 257/296 |
| 6,097,067 | A | * | 8/2000 | Ouchi et al. | ................. 257/369 |
| 6,274,898 | B1 | * | 8/2001 | Mehta et al. | ................. 257/298 |

(Continued)

FOREIGN PATENT DOCUMENTS

JP      11-097560 A      4/1999

(Continued)

*Primary Examiner*—Ida M Soward
(74) *Attorney, Agent, or Firm*—Miles & Stockbridge, P.C.

(57) ABSTRACT

There is provided a technology which allows improvements in manufacturing yield and product reliability in a semiconductor device having a triple well structure. A shallow p-type well is formed in a region different from respective regions in a p-type substrate where a deep n-type well, a shallow p-type well, and a shallow n-type well are formed. A p-type diffusion tap formed in the shallow p-type well is wired to a p-type diffusion tap formed in a shallow n-type well in the deep n-type well using an interconnection in a second layer. The respective gate electrodes of an nMIS and a pMIS each formed in the deep n-type well are coupled to the respective drain electrodes of an nMIS and a pMIS each formed in the substrate using an interconnection in a second or higher order layer.

4 Claims, 36 Drawing Sheets

U.S. PATENT DOCUMENTS

| | | | |
|---|---|---|---|
| 6,307,233 B1 * | 10/2001 | Awaka et al. | 257/368 |
| 6,329,693 B1 * | 12/2001 | Kumagai | 257/371 |
| 6,387,744 B2 * | 5/2002 | Taniguchi et al. | 438/228 |
| 6,392,268 B2 | 5/2002 | Ishige | |
| 6,979,850 B2 * | 12/2005 | Hatade | 257/296 |
| 7,271,452 B2 * | 9/2007 | Arai | 257/371 |
| 7,511,347 B2 * | 3/2009 | Kajigaya et al. | 257/371 |
| 2006/0017114 A1 * | 1/2006 | Chen et al. | 257/371 |
| 2006/0232307 A1 | 10/2006 | Kanno et al. | |
| 2009/0201742 A1 * | 8/2009 | Lee et al. | 365/185.24 |

FOREIGN PATENT DOCUMENTS

| | | |
|---|---|---|
| JP | 2001-358143 A | 12/2001 |
| JP | 2005-340548 A | 12/2005 |
| JP | 2006-303753 A | 11/2006 |

* cited by examiner

SEMICONDUCTOR DEVICE

CROSS-REFERENCE TO RELATED APPLICATIONS

The disclosure of Japanese Patent Application No. 2008-123634 filed on May 9, 2008 including the specification, drawings and abstract is incorporated herein by reference in its entirety.

BACKGROUND OF THE INVENTION

The present invention relates to a semiconductor device and, more particularly, to a technology which is effective when applied to a semiconductor device formed with a well in a three-layer structure, i.e., a so-called triple well structure which has a deep well of a second conductivity type different from a first conductivity type in a substrate of the first conductivity type, and further has a shallow well of the first conductivity type in the deep well.

For example, Japanese Unexamined Patent Publication No. 2006-303753 (Patent Document 1) describes a logic circuit and an I/O circuit in a semiconductor integrated circuit device having a so-called triple well structure. In the triple well structure, a deep n-well is formed on a p-type semiconductor substrate, and an n-well for forming a p-type MISFET and a p-well for forming an n-type MISFET are formed thereon.

Japanese Unexamined Patent Publication No. Hei 11-97560 (Patent Document 2) discloses a technology which forms, in a nonvolatile semiconductor memory device having a floating gate electrode and a control gate electrode on a semiconductor substrate, an n-well in a p-type semiconductor substrate, forms a p-well in the n-well, forms an antistatic n-type diffusion layer in the p-well, and electrically couples the antistatic diffusion layer and the control gate electrode to prevent the degradation of the reliability of an insulating film due to charging during the processing of an interconnection layer by etching, or prevent a dielectric breakdown therein.

Japanese Unexamined Patent Publication No. 2005-340548 (Patent Document 3) discloses a technology which couples a floating interconnection to a clamp diode to transfer charge that has flown to the floating interconnection to the clamp diode, and thereby prevent a short circuit between the floating interconnection and a ground interconnection adjacent thereto.

Japanese Unexamined Patent Publication No. 2001-358143 (Patent Document 4) discloses a technology for a semiconductor device including at least one interconnection layer including a plurality of relay pins electrically coupled to a plurality of respective gate electrodes, and an uppermost interconnection layer including a plurality of interconnection patterns which are electrically coupled to the plurality of respective relay pins. According to the technology, the gate electrodes are wired using the uppermost-layer interconnection pattern to transfer electrification charge to a region other than the gate electrodes during the etching of the interconnection layers, and thereby prevent the degradation of gate insulating film.

[Patent Document 1]
Japanese Unexamined Patent Publication No. 2006-303753
[Patent Document 2]
Japanese Unexamined Patent Publication No. Hei 11-97560
[Patent Document 3]
Japanese Unexamined Patent Publication No. 2005-340548
[Patent Document 4]
Japanese Unexamined Patent Publication No. 2001-358143

SUMMARY OF THE INVENTION

In a SOC (System On Chip) product, a semiconductor device having a triple-well structure is used for the purpose of reducing power consumption during standby or the like. However, the semiconductor device having the triple-well structure has various technological problems described hereinbelow.

In general, for signal transfer, electrical coupling is provided as necessary between field effect transistors respectively formed in different triple well regions, and between a field effect transistor formed in a triple well region and a field effect transistor formed in a substrate region. However, a study conducted by the present inventors has revealed that, in a specified circuit, a dielectric breakdown due to a triple well structure occurs in the gate insulating film of a field effect transistor. As an effective method for preventing such a dielectric breakdown, a method can be considered which, e.g., provides electrical coupling between field effect transistors respectively formed in different triple well regions via a level shift circuit. However, the level shift circuit has been originally designed to provide coupling between regions with mutually different power supply voltages. When the level shift circuit is disposed for each signal line between regions each with the same power supply voltage, not only design is complicated, but also the level shift circuit occupies a partial region of a semiconductor device. Accordingly, the semiconductor is increased in size to cause a problem of higher product manufacturing cost or the like.

An object of the present invention is to provide a technology which allows improvements in manufacturing yield and product reliability in a semiconductor device having a triple well structure.

The above and other objects and novel features of the present invention will become apparent from the description of the present specification and the accompanying drawings.

As shown below, a brief description will be given of an embodiment of a representative aspect of the invention disclosed in the present application.

The embodiment (first method) is a semiconductor device having a deep n-type well formed in a p-type substrate, which includes a first shallow p-type well and a second shallow n-type well which are formed in mutually different regions in the substrate, a third shallow p-type well and a fourth shallow n-type well which are formed in mutually different regions in the deep n-type well, an inverter circuit including an n-channel field effect transistor formed in the first shallow p-type well in the substrate and a p-channel field effect transistor formed in the second shallow n-type well in the substrate, and an inverter circuit including an n-channel field effect transistor and a p-channel field effect transistor which are respectively formed in the third shallow p-type well and the fourth shallow n-type well in the deep n-type well. In a region different from the respective regions where the deep n-type well, the first shallow p-type well, and the second shallow n-type well are formed, a shallow p-type well is formed. A p-type diffusion tap formed in the shallow p-type well is wired to a p-type diffusion tap formed in the third shallow p-type well using an interconnection in an n-th layer. The respective gate electrodes of the n-channel field effect transistor and the p-channel field effect transistor each formed in the deep n-type well are wired to the respective drain electrodes of the n-channel field effect transistor and the p-channel field effect transistor each formed in the substrate using an interconnection in an n-th or higher order layer.

Another embodiment (second method) is a semiconductor device having a deep n-type well formed in a p-type substrate, which includes a first shallow p-type well and a second shallow n-type well which are formed in mutually different regions in the substrate, a third shallow p-type well and a fourth shallow n-type well which are formed in mutually different regions in the deep n-type well, an inverter circuit including an n-channel field effect transistor and a p-channel field effect transistor which are respectively formed in the first shallow p-type well and the second shallow n-type well in the substrate, and an inverter circuit including an n-channel field effect transistor and a p-channel field effect transistor which are respectively formed in the third shallow p-type well and the fourth shallow n-type well in the deep n-type well. In a region different from the respective regions where the deep n-type well, the first shallow p-type well, and the second shallow n-type well are formed, a shallow p-type well is formed. An n-type diffusion layer formed in the shallow p-type well is wired to an n-type diffusion tap formed in the fourth shallow n-type well using an interconnection in an n-th layer. The respective gate electrodes of the n-channel field effect transistor and the p-channel field effect transistor each formed in the deep n-type well are wired to the respective drain electrodes of the n-channel field effect transistor and the p-channel field effect transistor each formed in the substrate using an interconnection in an n-th or higher order layer.

Still another embodiment (third method) is a semiconductor device having a first deep n-type well and a second deep n-type well each formed in a p-type substrate, which includes a first shallow p-type well and a second shallow n-type well which are formed in mutually different regions in the first deep n-type well, a third shallow p-type well and a fourth shallow n-type well which are formed in mutually different regions in the second deep n-type well, an inverter circuit including an n-channel field effect transistor and a p-channel field effect transistor which are respectively formed in the first shallow p-type well and the second shallow n-type well in the first deep n-type well, and an inverter circuit including an n-channel field effect transistor and a p-channel field effect transistor which are respectively formed in the third shallow p-type well and the fourth shallow n-type well in the second deep n-type well. An n-type diffusion tap formed in the second shallow n-type well in the first deep n-type well is wired to an n-type diffusion tap formed in the fourth shallow n-type well in the second deep n-type well using an interconnection in an n-th layer. The respective drain electrodes of the n-channel field effect transistor and the p-channel field effect transistor each formed in the first deep n-type well are wired to the respective gate electrodes of the n-channel field effect transistor and the p-channel field effect transistor each formed in the second deep n-type well using an interconnection in an n-th or higher order layer.

Yet another embodiment (fourth method) is a semiconductor device having a first deep n-type well and a second deep n-type well each formed in a p-type substrate, which includes a first shallow p-type well and a second shallow n-type well which are formed in mutually different regions in the first deep n-type well, a third shallow p-type well and a fourth shallow n-type well which are formed in mutually different regions in the second deep n-type well, an inverter circuit including an n-channel field effect transistor and a p-channel field effect transistor which are respectively formed in the first shallow p-type well and the second shallow n-type well in the first deep n-type well, and an inverter circuit including an n-channel field effect transistor and a p-channel field effect transistor which are respectively formed in the third shallow p-type well and the fourth shallow n-type well in the second deep n-type well. A p-type diffusion tap formed in the first shallow n-type well in the first deep n-type well is wired to a p-type diffusion tap formed in the third shallow n-type well in the second deep n-type well using an interconnection in an n-th layer. The respective drain electrodes of the n-channel field effect transistor and the p-channel field effect transistor each formed in the first deep n-type well are wired to the respective gate electrodes of the n-channel field effect transistor and the p-channel field effect transistor each formed in the second deep n-type well using an interconnection in an n-th or higher order layer.

Still another embodiment (fifth method) is a semiconductor device having a first deep n-type well and a second deep n-type well each formed in a p-type substrate, which includes a first shallow p-type well and a second shallow n-type well which are formed in mutually different regions in the first deep n-type well, a third shallow p-type well and a fourth shallow n-type well which are formed in mutually different regions in the second deep n-type well, an inverter circuit including an n-channel field effect transistor and a p-channel field effect transistor which are respectively formed in the first shallow p-type well and the second shallow n-type well in the first deep n-type well, and an inverter circuit including an n-channel field effect transistor and a p-channel field effect transistor which are respectively formed in the third shallow p-type well and the fourth shallow n-type well in the second deep n-type well. The semiconductor device further includes a first diode including a sixth shallow p-type well and an n-type diffusion layer, and a second diode including a seventh shallow p-type well and an n-type diffusion layer in mutually different regions other than respective regions where the first and second deep n-type wells are formed. The n-type diffusion layer forming the first diode is wired to an n-type diffusion tap formed in the second shallow n-type well in the first deep n-type well using an interconnection in an n-th layer. The n-type diffusion layer forming the second diode is wired to an n-type diffusion tap formed in the fourth shallow n-type well in the second deep n-type well using the interconnection in the n-th layer. The respective drain electrodes of the n-channel field effect transistor and the p-channel field effect transistor each formed in the first deep n-type well are wired to the respective gate electrodes of the n-channel field effect transistor and the p-channel field effect transistor each formed in the second deep n-type well using an interconnection in an n-th or higher order layer.

Yet another embodiment (sixth method) is a semiconductor device having a first deep n-type well and a second deep n-type well each formed in a p-type substrate, which includes a first shallow p-type well and a second shallow n-type well which are formed in mutually different regions in the first deep n-type well, a third shallow p-type well and a fourth shallow n-type well which are formed in mutually different regions in the second deep n-type well, an inverter circuit including an n-channel field effect transistor and a p-channel field effect transistor which are respectively formed in the first shallow p-type well and the second shallow n-type well in the first deep n-type well, and an inverter circuit including an n-channel field effect transistor and a p-channel field effect transistor which are respectively formed in the third shallow p-type well and the fourth shallow n-type well in the second deep n-type well. A fifth shallow p-type well and a sixth shallow p-type well are formed in mutually different regions other than respective regions where the first and second deep n-type wells are formed. The semiconductor device further includes a diode including the sixth shallow p-type well and an n-type diffusion layer. A p-type diffusion tap formed in the fifth shallow p-type well is wired to a p-type diffusion tap formed in the third shallow p-type well in the second deep n-type well using an interconnection in an n-th layer. The n-type diffusion layer forming the diode is wired to an n-type diffusion tap formed in the second shallow n-type well in the first deep n-type well using the interconnection in the n-th layer. The respective drain electrodes of the n-channel field effect transistor and the p-channel field effect transistor each formed in the first deep n-type well are wired to the respective gate electrodes of the n-channel field effect transistor and the p-channel field effect transistor each formed in the second deep n-type well using an interconnection in an n-th or higher order layer.

Still another embodiment (seventh method) is a semiconductor device having a first deep n-type well and a second deep n-type well each formed in a p-type substrate, which includes a first shallow p-type well and a second shallow n-type well which are formed in mutually different regions in the first deep n-type well, a third shallow p-type well and a fourth shallow n-type well which are formed in mutually different regions in the second deep n-type well, an inverter circuit including an n-channel field effect transistor and a p-channel field effect transistor which are respectively formed in the first shallow p-type well and the second shallow n-type well in the first deep n-type well, and an inverter circuit including an n-channel field effect transistor and a p-channel field effect transistor which are respectively formed in the third shallow p-type well and the fourth shallow n-type well in the second deep n-type well. A first bidirectional diode and a second bidirectional diode are formed in mutually different regions other than respective regions where the first and second deep n-type wells are formed. A cathode of the first bidirectional diode, an anode of the second bidirectional diode, and an n-type diffusion tap formed in the fourth shallow n-type well are wired using an interconnection in an n-th layer. An anode of the first bidirectional diode, a cathode of the second bidirectional diode, and an n-type diffusion tap formed in the second shallow n-type well are wired using the interconnection in the n-th layer. The respective drain electrodes of the n-channel field effect transistor and the p-channel field effect transistor each formed in the first deep n-type well are wired to the respective gate electrodes of the n-channel field effect transistor and the p-channel field effect transistor each formed in the second deep n-type well using an interconnection in an n-th or higher order layer.

The following is a brief description of an effect achievable by the embodiment of the representative aspect of the invention disclosed in the present application.

In a semiconductor device having a triple well structure, a dielectric breakdown in the gate insulating film of a field effect transistor formed in a triple well region is prevented to allow improvements in manufacturing yield and product reliability.

DESCRIPTION OF THE PREFERRED EMBODIMENTS

Figure 1:
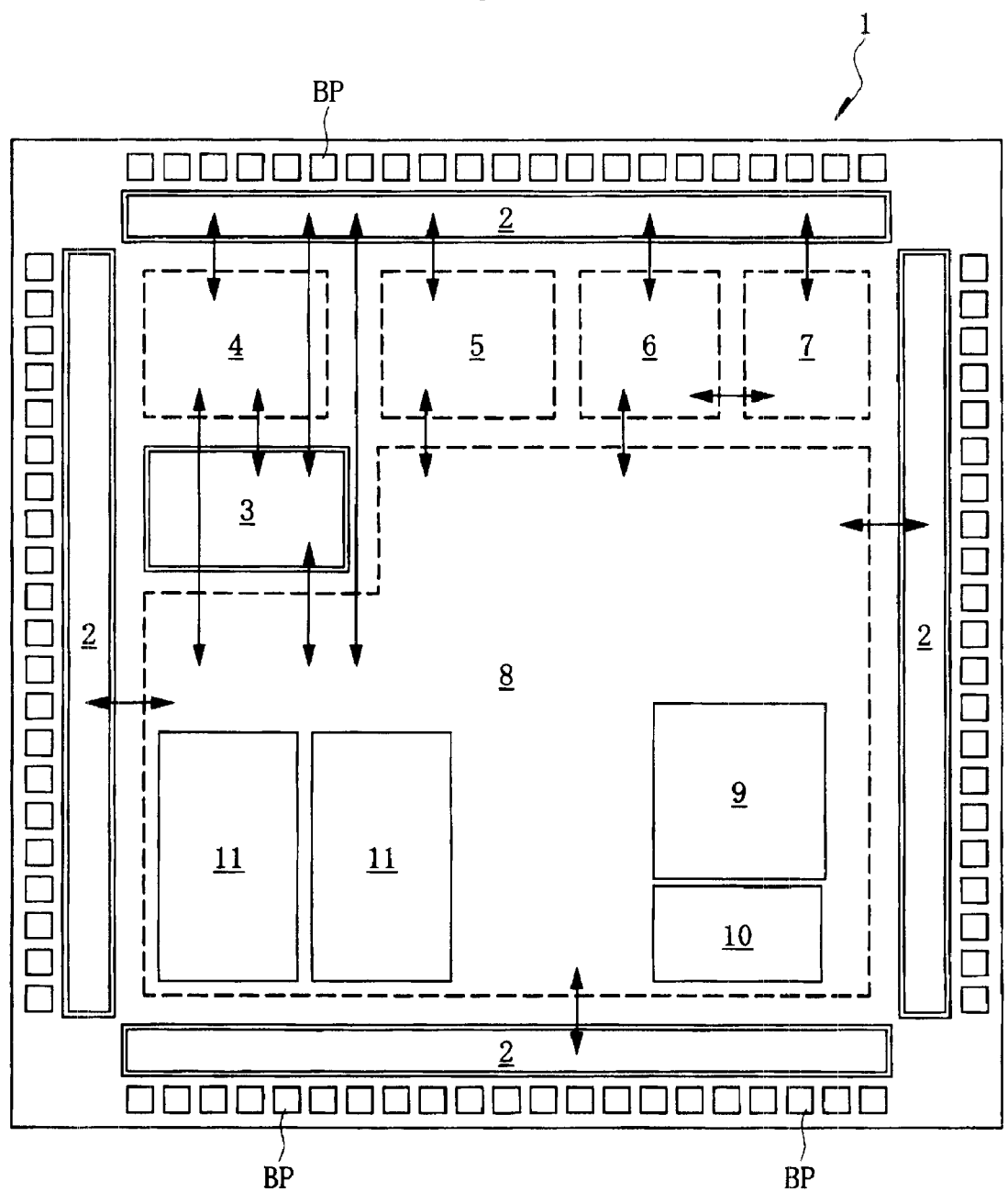
FIG. 1 is a structural view of a semiconductor device used by the present inventors for analysis.

If necessary for the sake of convenience, each of the following embodiments will be described hereinbelow by dividing it into a plurality of sections or implementations. However, they are by no means irrelevant to each other unless shown particularly explicitly, and are mutually related to each other such that one of the sections or implementations is a variation or a detailed or complementary description of some or all of the others.

When the number and the like of elements (including the number, numerical value, amount, and range thereof) are referred to in the following embodiments, they are not limited to specific numbers unless shown particularly explicitly or unless they are obviously limited to specific numbers in principle. The number and the like of the elements may be not less than or not more than specific numbers. It will be easily appreciated that, in the following embodiments, the components thereof (including also elements and steps) are not necessarily indispensable unless shown particularly explicitly or unless the components are considered to be obviously indispensable in principle. Likewise, if the configurations, positional relationship, and the like of the components and the like are referred to in the following embodiments, the configurations and the like are assumed to include those substantially proximate or similar thereto unless shown particularly explicitly or unless obviously they are not in principle. The same shall apply to the foregoing numeric value and the range.

In the drawings used in the following embodiments, even plan views may be hatched for clear illustration of the drawings. In the following embodiments, a MISFET (Metal Insulator Semiconductor Field Effect Transistor) representing a field effect transistor will be referred to as a MIS for short, a p-channel MISFET will be referred to as a pMIS for short, and an n-channel MISFET will be referred to as an nMIS for short. In the following embodiments, when a wafer is mentioned, it typically indicates a Si (Silicon) monocrystalline wafer, but it is not limited thereto. It is assumed that the term "wafer" also indicates a SOI (Silicon On Insulator) wafer, an insulating film substrate for forming an integrated circuit thereon, or the like. It is also assumed that the shapes of wafers are not limited to circular or generally circular shapes, and include a square shape, a rectangular shape, and the like.

In the following embodiments, the wording "deep well" and "shallow well" are used to describe wells forming a triple well structure. The wording "deep and shallow" is associated with a depth from the principal surface of a substrate in the thickness direction thereof, and wells are to be relatively and generally classified into the two categories of the "deep well" and the "shallow well". Accordingly, the depths of a plurality of the "deep wells" are not necessarily constant, and may be different from each other. Likewise, the depths of a plurality of the "shallow wells" are not necessarily constant, and may be different from each other. However, the plurality of "deep wells" are constantly formed deeper than the plurality of "shallow wells". The "shallow well" is formed in a substrate or in the "deep well", and the plurality of "shallow wells" may also be formed in mutually different regions in the substrate where the "deep well" is not formed, or in mutually different regions in the "deep well".

Throughout the drawings for illustrating the following embodiments, components having the same functions will be provided with the same reference numerals in principle, and a repeated description thereof will be omitted. Hereinbelow, the embodiments of the present invention will be described in detail with reference to the drawings.

First, for clearer understanding of the semiconductor devices according to the embodiments of the present invention, a description will be given of the cause of a dielectric breakdown in the gate insulating film of a MIS formed in a triple well region, which has been found by the present inventors.

As a result of a study conducted by the present inventors, it has been revealed that, when coupling holes for coupling a lower-layer interconnection and an upper-layer interconnection are formed in an insulating film formed between the lower-layer interconnection and the upper-layer interconnection, a dielectric breakdown occurs in the gate insulating film of a MIS formed in a triple well region. Because the coupling holes have been formed by a dry etching method using plasma discharge, it is presumed that the dielectric breakdown has occurred due to charging resulting from the plasma discharge. It has been further revealed that a deep well forming the triple well region is charged by the plasma discharge, and the dielectric breakdown has occurred in the gate insulating film of a MIS which intervenes a path extending from the deep well to a substrate. In particular, when the deep well occupies a large area of, e.g., 1 mm$^2$ or more, the occurrence of the dielectric breakdown has been frequently observed. The mechanism of the occurrence of a dielectric breakdown in the gate insulating film of a MIS due to charging resulting from plasma discharge is described in detail in "Plasma Charging Damage in Advanced VLSI Technology" by C. Cheung, 1998 IEDM Short Course and in "Plasma Currents, Voltages and Chargin" by J. McVittie, 1997 2nd International Symposium on Plasma Process-Induced Damage, Tutorial.

Referring to FIGS. 1 to 4, a specific description will be given of the result of analyzing a dielectric breakdown in the gate insulating film of a MIS formed in a triple well region, which has been obtained by the present inventors. FIG. 1 is a structural view of a semiconductor device used by the present inventors for analysis. FIG. 2(a) is a circuit diagram showing a first circuit in which a dielectric breakdown occurs in the gate insulating film of a MIS in a circuit portion forming the semiconductor device of FIG. 1, and FIG. 2(b) is a principal-portion cross-sectional view of circuit elements for illustrating a dielectric breakdown model. FIG. 3(a) is a circuit diagram showing a second circuit in which a dielectric breakdown occurs in the gate insulating film of a MIS in a circuit portion forming the semiconductor device of FIG. 1, and FIG. 3(b) is a principal-portion cross-sectional view of circuit elements for illustrating a dielectric breakdown model. FIG. 4(a) is a circuit diagram showing a third circuit in which a dielectric breakdown occurs in the gate insulating film of a MIS in a circuit portion forming the semiconductor device of FIG. 1, and FIG. 4(b) a principal-portion cross-sectional view of circuit elements for illustrating a dielectric breakdown model.

As shown in FIG. 1, a semiconductor device 1 has first regions (regions surrounded by the double solid frame lines in FIG. 1) where a shallow n-type well and a shallow p-type well are formed in mutually different regions in a substrate, and respective circuit elements are formed in the shallow n-type well and the shallow p-type well, and second regions (regions surrounded by the dotted frame lines in FIG. 1) where a deep n-type well is formed in a substrate, a shallow n-type well and a shallow p-type well are respectively formed in mutually different regions in the deep n-type well, and respective circuit elements are formed in the shallow n-type well and the shallow p-type well.

Examples of the first regions mentioned above include an I/O region 2 and a control logic region 3. Examples of the second regions mentioned above include an analog 1 region 4, a phase synchronization circuit region 5, an analog 2 region 6, an analog 2 control region 7, and a main logic region 8. In the main logic region 8, a CPU (Central Processing Unit) 9, a DSP (Digital Signal Processor) 10, a RAM (Random Access Memory) 11, or the like are mounted by way of example. In the peripheral region of the semiconductor device 1, a plurality of bonding pads BP are formed.

The circuit elements mentioned above are, e.g., MIS transistors, and an example of signal transfer between individual MIS transistors is shown by the bidirectional arrow in the drawing. Signal transfer is performed not only between individual MIS transistors formed in the first regions or between individual MIS transistors formed in the second region, but also between a MIS transistor formed in the first region and a MIS transistor formed in the second transistor or between a MIS transistor formed in the second region and a MIS transistor formed in another second region different from the second region mentioned above.

The present inventors have manufactured the above-mentioned semiconductor device 1 having the triple well structure, performed a functional test thereon, and recognized a dielectric breakdown in the gate insulating film of a MIS in a specified circuit. For example, the dielectric breakdown in the gate insulating film of a MIS has been recognized in each of the first circuit (1) in which the output stage of an inverter circuit formed in the first region is wired to the common gate electrode of an inverter circuit formed in the second region, a second circuit (2) in which the common gate electrode of the inverter circuit formed in the first region is wired to the output stage of the inverter circuit formed in the second region, and the third circuit (3) in which the output stage of the inverter circuit formed in the second region is coupled to the common gate electrode of an inverter circuit formed in another second region different from the second region mentioned above. An inverter circuit is a circuit including a pair of a pMIS and an nMIS in which the respective gate electrodes of the pair of a pMIS and an nMIS are coupled, the respective drain electrodes thereof are coupled, the source electrode of the pMIS is coupled to an n-type well formed with the pMIS transistor, and the source electrode of the nMIS is coupled to a p-type well formed with the nMIS.

Hereinbelow, a description will be given of a dielectric breakdown model in the gate insulating film of a MIS transistor in each of the foregoing first, second, and third circuits in which the dielectric breakdown has been recognized in the gate insulating film of the MIS transistor.

Figure 2A:
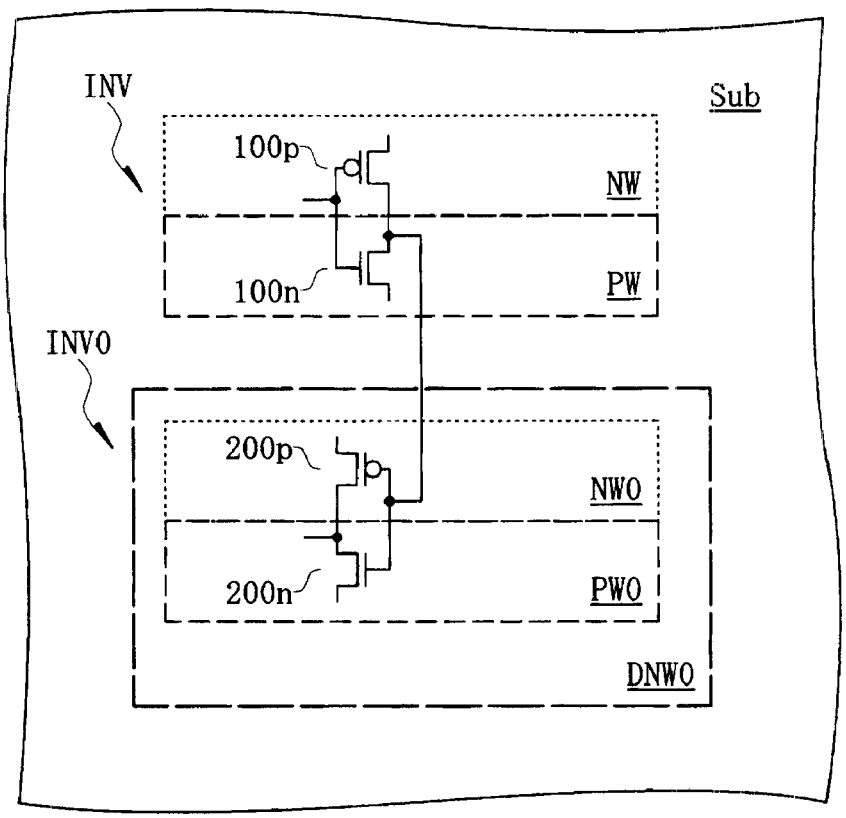
FIG. 2(a) is a circuit diagram showing a first circuit in which a dielectric breakdown occurs in the gate insulating film of a MIS in a circuit portion forming the semiconductor device of FIG. 1.

(1) As shown in FIG. 2(a), the first circuit in which the output stage of the inverter circuit formed in the first region is wired to the common gate electrode of the inverter formed in the second region includes an inverter circuit INV formed in a substrate Sub, and an inverter circuit INV0 formed in a deep n-type well DNW0.

In the p-type substrate Sub, a shallow n-type well NW and a shallow p-type well PW are formed, while in the shallow n-type well NW, a pMIS 100p is further formed. In the shallow p-type well PW, an nMIS 100n is further formed. The pMIS 100p and the nMIS 100n form the inverter circuit INV. In the deep n-type well DNW0, a shallow n-type well NW0 and a shallow p-type well PW0 are formed. In the shallow n-type well NW0, a pMIS 200p is further formed, while in the shallow p-type well PW0, an nMIS 200n is further formed. The pMIS 200p and the nMIS 200n form the inverter circuit INV0.

The respective gate electrodes of the pMIS 200p and the nMIS 200n which form the inverter circuit INV0 are electrically coupled to the respective drain electrodes of the pMIS 100p and the nMIS 100n which form the inverter circuit INV. As a result of the functional test conducted by the present inventors, it has been recognized that a dielectric breakdown has occurred in the gate insulating film of the pMIS 200p or the nMIS 200n forming the inverter circuit INV0.

Figure 2B:
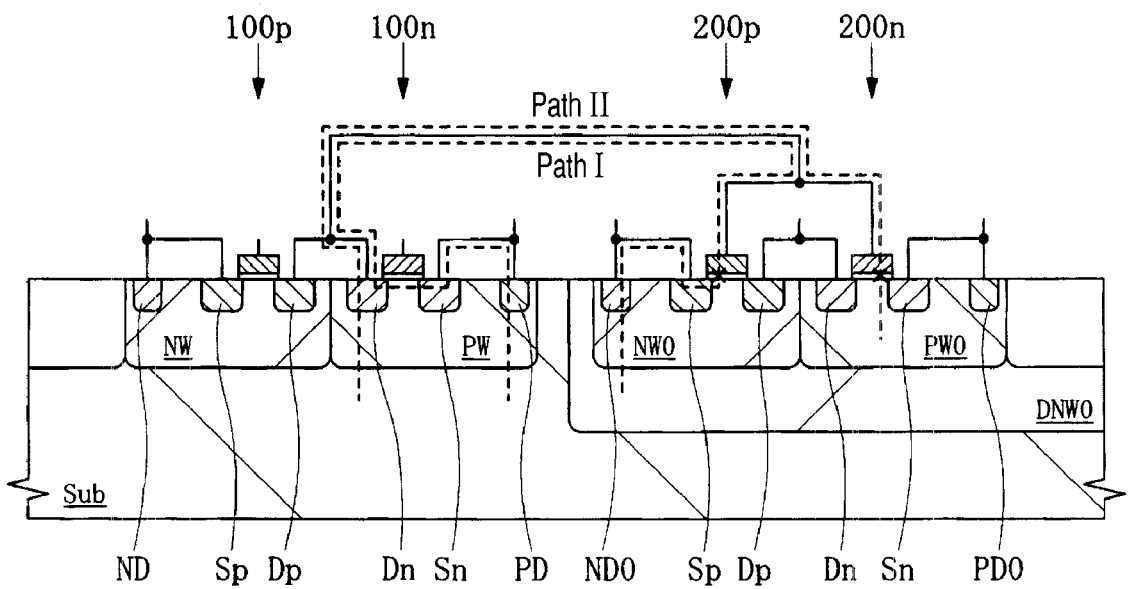
FIG. 2(b) is a principal-portion cross-sectional view of circuit elements for illustrating a dielectric breakdown model.

Referring to FIG. 2(b), a description will be given of the mechanism of the occurrence of a dielectric breakdown in the gate insulating film of the pMIS 200p or the nMIS 200n forming the inverter circuit INV0.

For example, when positive charge flows into the shallow n-type well NW0 in the deep n-type well DNW0 during manufacturing thereof due to plasma discharge associated with a dry etching method which is implemented when coupling holes are formed in an interlayer insulating film formed over an interconnection, the positive charge that has flown into the shallow n-type well NW0 is accumulated in the deep n-type well DNW0 and in the shallow n-type well NW0 because the deep n-type well DNW0 is not electrically coupled to the substrate Sub.

On the other hand, since the gate electrode of the nMIS 100n formed in the shallow p-type well PW in the substrate Sub is in a floating state, the nMIS 100n is brought into a conducting state so that a path is formed which extends from the substrate Sub to the gate electrode of the pMIS 200p formed in the shallow n-type well NW0 in the deep n-type well DNW0 via the shallow p-type well PW, a p-type diffusion tap PD, the nMIS 100n (the source electrode Sn thereof, the channel region thereof, and the drain electrode Dn thereof), and the interconnection. As a result, the potential of the gate electrode of the pMIS 200o formed in the shallow n-type well NW0 in the deep n-type well DNW0 becomes equal to the potential (0 V) of the substrate Sub. Therefore, it is presumed that the voltage applied to the gate insulating film of the pMIS 200p increases to cause a dielectric breakdown (the path I indicated by the dotted line in FIG. 2(b)).

For example, when negative charge flows into the shallow p-type well PW0 in the deep n-type well DNW0 during manufacturing thereof due to plasma discharge associated with a dry etching method which is implemented when coupling holes are formed in the interlayer insulating film formed over the interconnection, the negative charge that has flown into the shallow p-type well PW0 is accumulated therein because the shallow p-type well PW0 is formed in the deep n-type well DNW0, and the deep n-type well DNW0 is not electrically coupled to the substrate Sub.

By contrast, even when negative charge flows into the shallow p-type well PW in the substrate Sub, the negative charge that has flown into the shallow p-type well PW is discharged to the substrate Sub since the shallow p-type well PW has the same conductivity type as that of the substrate Sub. As a result, the potential of the gate electrode of the nMIS 200n formed in the shallow p-type well PW0 in the deep n-type well DNW0 becomes equal to the potential (0 V) of the substrate Sub. Therefore, it is presumed that the voltage applied to the gate insulating film of the nMIS 200n increases to cause a dielectric breakdown (the path II indicated by the dotted line in FIG. 2(b)).

Figure 3A:
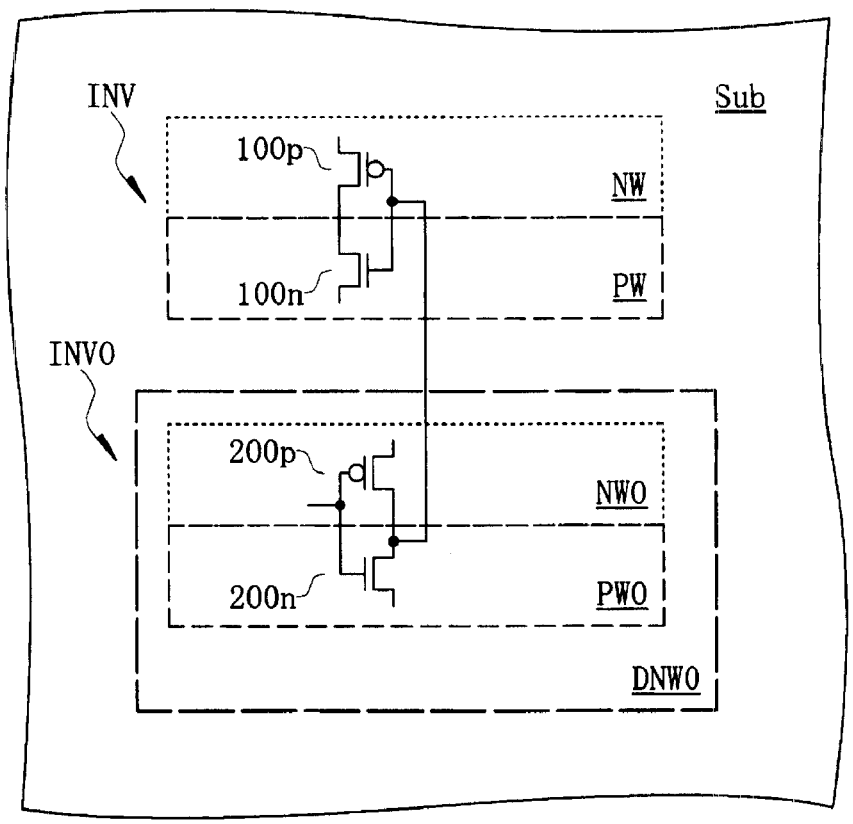
FIG. 3(a) is a circuit diagram showing a second circuit in which a dielectric breakdown occurs in the gate insulating film of a MIS in a circuit portion forming the semiconductor device of FIG. 1.

(2) As shown in FIG. 3(a), the second circuit in which the common gate electrode of the inverter circuit formed in the first region is wired to the output stage of the inverter circuit formed in the second region includes the inverter circuit INV formed in the substrate Sub, and the inverter circuit INV0 formed in the deep n-type well DNW0.

In the p-type substrate Sub, the shallow n-type well NW and the shallow p-type well PW are formed. In the shallow n-type well NW, the pMIS 100p is further formed, while in the shallow p-type well PW, the nMIS 100n is further formed. The pMIS 100p and the nMIS 100n form the inverter circuit INV. In the deep n-type well DNW0, the shallow n-type well NW0 and the shallow p- type well PW0 are formed. In the shallow n-type well NW0, the pMIS 200p is further formed. In the shallow p-type well PW0, the nMIS 200n is further formed. The pMIS 200p and the nMIS 200n form the inverter circuit INV0.

The respective gate electrodes of the pMIS 100p and the nMIS 100n which form the inverter circuit INV are electrically coupled to the respective drain electrodes of the pMIS 200p and the nMIS 200n which form the inverter circuit INV0. As a result of the functional test conducted by the present inventors, it has been recognized that a dielectric breakdown has occurred in the gate insulating film of the pMIS 100p or the nMIS 100n forming the inverter circuit INV.

Figure 3B:
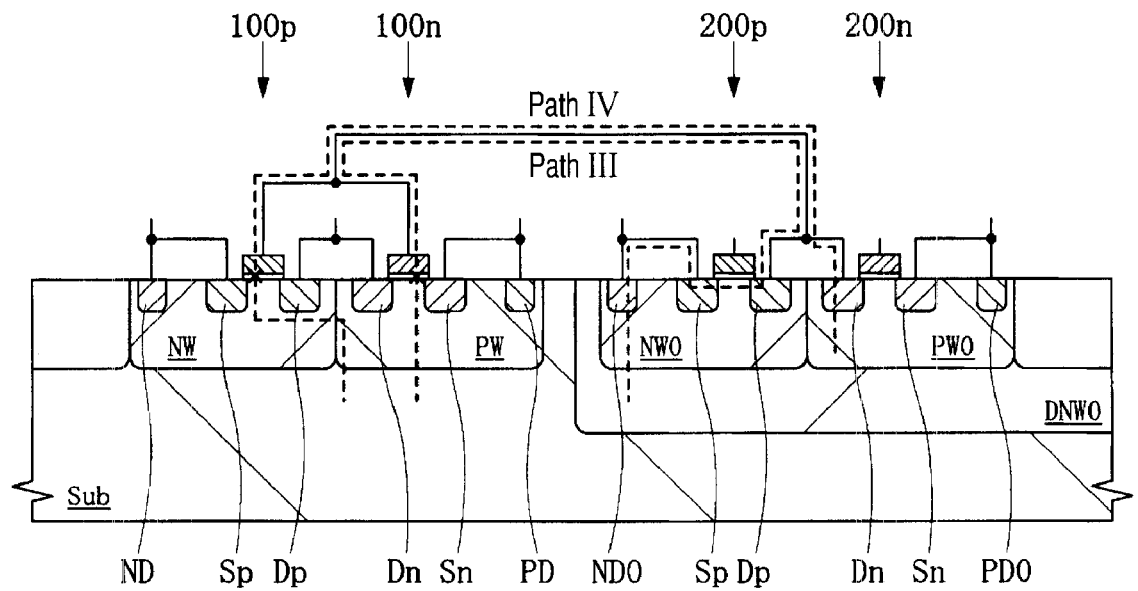
FIG. 3(b) is a principal-portion cross-sectional view of circuit elements for illustrating a dielectric breakdown model.

Referring to FIG. 3(b), a description will be given of the mechanism of the occurrence of a dielectric breakdown in the gate insulating film of the pMIS 100p or the nMIS 100n forming the inverter circuit INV.

For example, when positive charge flows into the shallow n-type well NW0 in the deep n-type well DNW0 during manufacturing thereof due to plasma discharge associated with a dry etching method which is implemented when a coupling hole is formed in the interlayer insulating film formed over the interconnection, the positive charge that has flown into the shallow n-type well NW0 is accumulated in the deep n-type well DNW0 and in the shallow n-type well NW0 because the deep n-type well DNW0 is not electrically coupled to the substrate Sub. Since the gate electrode of the pMIS 200p formed in the shallow n-type well NW0 in the deep n-type well DNW0 is in a floating state, the pMIS 200p is brought into a conducting state so that a path is formed which extends from the deep n-type well DNW0 to the gate electrode of the nMIS 100n formed in the shallow p-type well PW in the substrate Sub via the shallow n-type well NW0, an n-type diffusion tap ND0, the pMIS 200p (the source electrode Sp thereof, the channel region thereof, and the drain electrode Dp thereof), and the interconnection.

On the other hand, since the shallow p-type well PW in the substrate Sub has the same conductivity type as that of the substrate Sub, the potential of the shallow p-type well PW becomes equal to the potential (0 V) of the substrate Sub. Therefore, it is presumed that the voltage applied to the gate insulating film of the nMIS 100n formed in the shallow p-type well PW in the substrate Sub increases to cause a dielectric breakdown (the path III indicated by the dotted line in FIG. 3(b)).

For example, when negative charge flows into the shallow p-type well PW0 formed in the deep n-type well DNW0 during manufacturing thereof due to plasma discharge associated with a dry etching method which is implemented when coupling holes are formed in the interlayer insulating film formed over an interconnection, the negative charge that has flown into the shallow p-type well PW0 is accumulated therein because the shallow p-type well PW0 is formed in the deep n-type well DNW0, and the deep n-type well DNW0 is not electrically coupled to the substrate Sub.

By contrast, even when negative charge flows into the shallow p-type well PW in the substrate Sub, the negative charge that has flown into the shallow p-type well PW0 is discharged to the substrate Sub since the shallow p-type well PW has the same conductivity type as that of the substrate Sub. It is to be noted that, when the inverter circuits each including the pMIS and the nMIS which are respectively formed in the shallow n-type well and the shallow p-type well in the substrate include one in which the respective gate electrodes of the pMIS and the nMIS are wired to each other and in a floating state, a low-resistance conducting state is established between the foregoing shallow n-type well and the foregoing shallow p-type well which are formed in mutually different regions, though the description thereof using the drawings is omitted herein. Accordingly, when such an inverter circuit is present in the substrate Sub shown in FIGS. 3(a) and 3(b), the low-resistance conducting state is established between the shallow n-type well NW and the shallow p-type well PW each formed in the substrate Sub so that the respective potentials of the shallow n-type well NW and the shallow p-type well PW each formed in the substrate Sub become equal to the potential (0 V) of the substrate Sub. As a result, it is presumed that the voltage applied to each of the gate insulating films of the pMIS 100p and the nMIS 100p which are respectively formed in the shallow n-type well NW and the shallow p-type well PW in the substrate Sub increases to cause a dielectric breakdown (the line IV indicated by the dotted line in FIG. 3(b)).

Figure 4A:
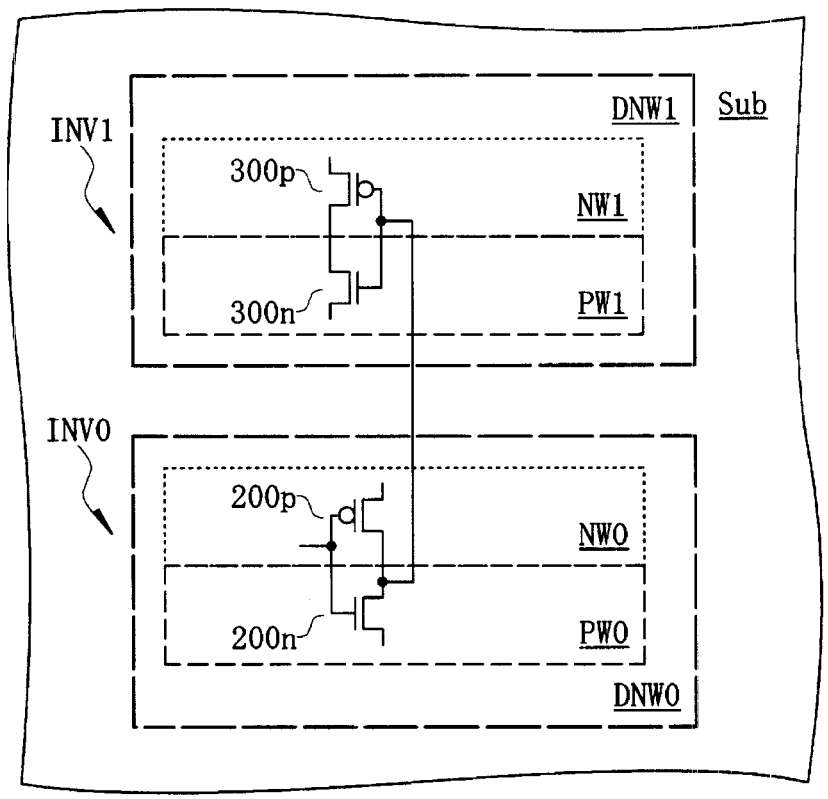
FIG. 4(a) is a circuit diagram showing a third circuit in which a dielectric breakdown occurs in the gate insulating film of a MIS in a circuit portion forming the semiconductor device of FIG. 1.

(3) As shown in FIG. 4(a), the third circuit in which the output stage of the inverter circuit formed in the second region is wired to the common gate electrode of the inverter formed in another second region different from the second region mentioned above includes the inverter circuit INV0 formed in the deep n-type well DNW0, and an inverter circuit INV1 formed in a deep n-type well DNW1.

In the deep n-type well DNW0, the shallow n-type well NW0 and the shallow p-type well PW0 are formed. In the shallow n-type well NW0, the pMIS 200$p$ is further formed, while in the shallow p-type well PW0, the nMIS 200$n$ is further formed. The area occupied by the deep n-type well DNW0 is relatively small, and less than, e.g., 1 mm$^2$. The pMIS 200$p$ and the nMIS 200$n$ form the inverter circuit INV0. In the deep n-type well DNW1, a shallow n-type well NW1 and a shallow p-type well PW1 are formed. In the shallow n-type well NW1, a pMIS 300$p$ is further formed, while in the shallow p-type well PW1, an nMIS 300$n$ is further formed. The area occupied by the deep n-type well DNW1 is relatively large, and is not less than, e.g., 1 mm$^2$. The pMIS 300$p$ and the nMIS 300$n$ form the inverter circuit INV1.

The respective drain electrodes of the pMIS 200$p$ and the nMIS 200$n$ which form the inverter circuit INV0 are electrically coupled to the respective gate electrodes of the pMIS 300$p$ and the nMIS 300$n$ which form the inverter circuit INV1. As a result of the functional test conducted by the present inventors, it has been recognized that a dielectric breakdown has occurred in the gate insulating film of the pMIS 300$p$ or the nMIS 300$n$ forming the inverter circuit INV1. A dielectric breakdown is likely to occur in the gate insulating film of each of the pMIS 300$p$ and the nMIS 300$n$ which are respectively formed in the shallow n-type well NW1 and the shallow p-type well PW1 in the deep n-type well DNW1 which occupies an area of not less than 1 mm$^2$.

Referring to FIG. 4($b$), a description will be given of the mechanism of the occurrence of a dielectric breakdown in the gate insulating film of the pMIS 300$p$ or the nMIS 300$n$ forming the inverter circuit INV1.

For example, when positive charge flows into the shallow n-type well NW1 in the deep n-type well DNW1 during manufacturing thereof due to plasma discharge associated with a dry etching method which is implemented when coupling holes are formed in the interlayer insulating film formed over the interconnection, the positive charge that has flown into the shallow n-type well NW1 is accumulated in the deep n-type well DNW1 and in the shallow n-type well NW1 because the deep n-type well DNW1 is not electrically coupled to the substrate Sub.

By contrast, when positive charge flows into the shallow n-type well NW0 in the deep n-type well DNW0, the positive charge that has flown in the shallow n-type well NW0 is accumulated in the deep n-type well DNW0 and in the shallow n-type well NW0 because the deep n-type well DNW0 is not electrically coupled to the substrate Sub. However, since the area occupied by the deep n-type well DNW0 is smaller than the area occupied by the deep n-type well DNW1, the amount of charge accumulated in the deep n-type well DNW0 is smaller than the amount of charge accumulated in the deep n-type well DNW1. Accordingly, the amount of charge charging the gate electrode of the pMIS 300$p$ in order to couple the drain electrode of the pMIS 200$p$ formed in the shallow n-type well NW0 in the deep n-type well DNW0 to the gate electrode of the pMIS 300$p$ formed in the shallow n-type well NW1 in the deep n-type well DNW1 is different from the amount of charge charging the shallow n-type well NW1 in the deep n-type well DNW1. Therefore, it is presumed that the voltage applied to the gate insulating film of the pMIS 300$p$ formed in the shallow n-type well NW1 increases to cause a dielectric breakdown (the path V indicated by the dotted line in FIG. 4($b$)).

For example, when negative charge flows into the shallow p-type well PW1 in the deep n-type well DNW1 during manufacturing thereof due to plasma discharge associated with a dry etching method which is implemented when coupling holes are formed in the interlayer insulating film formed over the interconnection, the negative charge that has flown in the shallow p-type well PW1 is accumulated therein because the shallow p-type well PW1 is formed in the deep n-type well DNW1, and the deep n-type well DNW1 is not electrically coupled to the substrate Sub. On the other hand, negative charge that has flown in the shallow p-type well PW0 in the deep n-type well DNW0 is likewise accumulated in the shallow p-type well PW0 in the deep n-type well DNW0. However, the area occupied by the p-type well PW0 is smaller than the area occupied by the p-type well PW1 so that the amount of charge accumulated in the p-type well PW1 is larger than the amount of charge accumulated in the p-type well PW0. For example, because the gate electrode of the pMIS 200$p$ formed in the shallow n-type well NW0 in the deep n-type well DNW0 is in a floating state, the pMIS 200$p$ is brought into a conducting state so that a path is formed which extends from the deep n-type well DNW0 to the gate electrode of the nMIS 300$n$ formed in the shallow p-type well PW1 in the deep n-type well DNW1 via the shallow n-type well NW0, the n-type diffusion tap ND0, the pMIS 200$n$ (the source electrode Sp thereof, the channel region thereof, and the drain electrode Dp thereof), and the interconnection. As a result, it is presumed that the voltage applied to the gate insulating film of the nMIS 300$n$ formed in the shallow p-type well PW1 in the deep n-type well DNW1 increases to cause a dielectric breakdown (the path VI indicated by the dotted line in FIG. 4($b$)).

The present inventors have verified that a dielectric breakdown occurs in the gate insulating film of a MIS not only in the first, second, and third circuits described above, but also in a fourth circuit in which, e.g., the common gate electrode of an inverter circuit formed in a deep n-type well is wired to the drain electrode of a MIS formed in the substrate and in a fifth circuit in which the output stage of an inverter circuit formed in a deep n-type well is wired to the gate electrode of a MIS formed in the deep n-type well. In each of the fourth and fifth circuits, a dielectric breakdown in the gate insulating film of a MIS can be prevented by, e.g., disposing an inverter circuit which does not contribute to a circuit operation in the deep n-type well, wiring a shallow p-type well to the substrate using a lowermost-layer interconnection, wiring the common gate electrode to a shallow n-type well using an uppermost-layer interconnection, and discharging charge accumulated in the deep n-type well. As for a method for preventing a dielectric breakdown in the gate insulating film of a MIS in the fourth and fifth circuits, it is disclosed in Japanese Patent Application No. 2008-6436 (filed by Hiraiwa, et al. on Jan. 16, 2008).

According to the result of the analysis described heretofore, in preventing a dielectric breakdown in the gate insulating film of a MIS, it is effective to reduce the voltage applied to the gate insulating film of the MIS to a value of not more than the dielectric breakdown voltage of the gate insulating film of the MIS, or eliminate the potential difference between deep wells formed in mutually different regions. Hereinbelow, a detailed description will be given of the method for preventing a dielectric breakdown in the gate insulating film of a MIS in the embodiments of the present invention.

Embodiment 1

Figure 5:
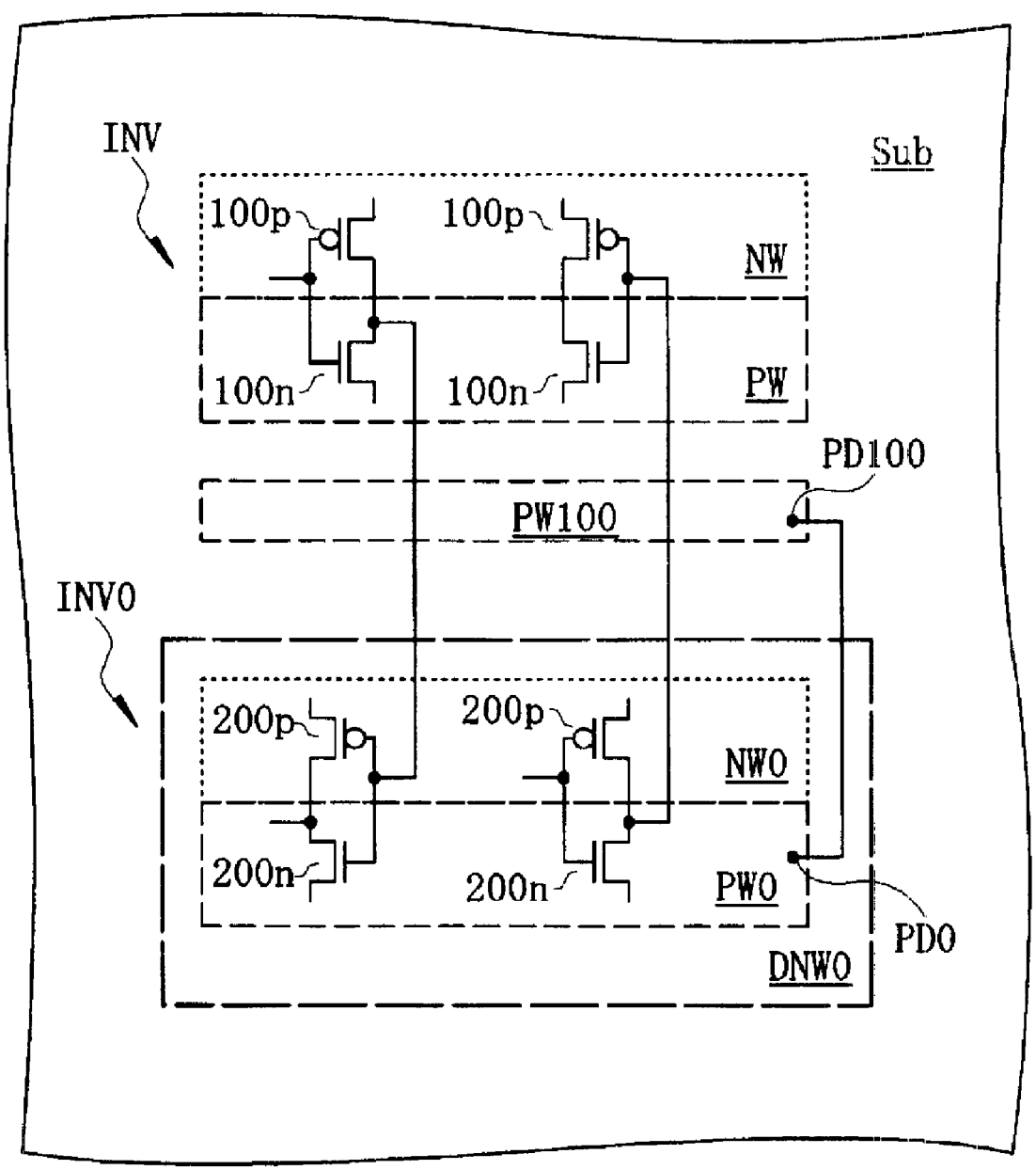
FIG. 5 is a circuit diagram illustrating a first example of a first method for preventing a dielectric breakdown in the gate insulating film of a MIS according to a first embodiment.
Figure 6:
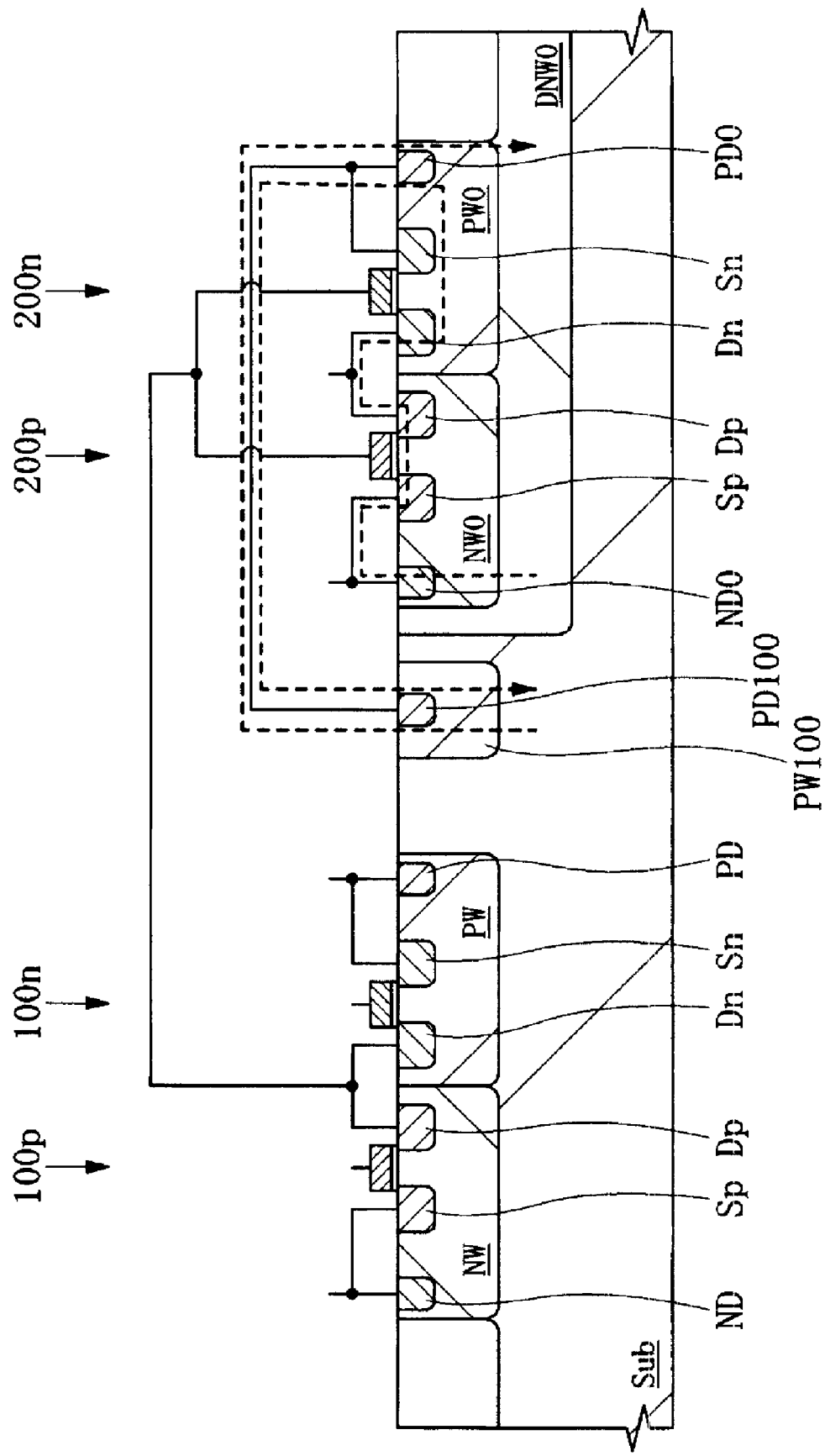
FIG. 6 is a principal-portion cross-sectional view of a first circuit illustrating the first example of the first method shown in FIG. 5 mentioned above.
Figure 7:
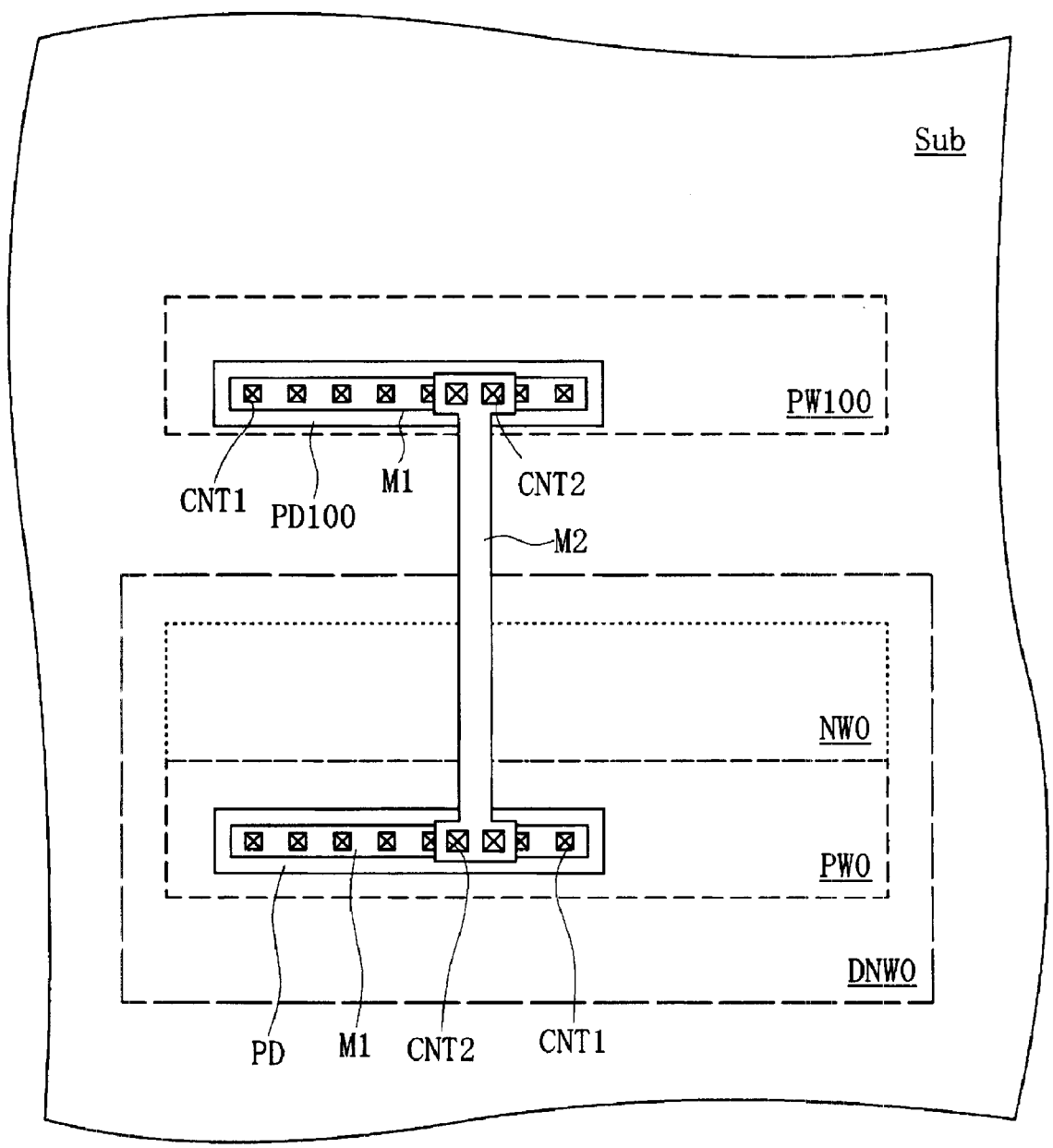
FIG. 7 is a principal-portion plan view of the first circuit illustrating the first example of the first method shown in FIG. 5 mentioned above.
Figure 8:
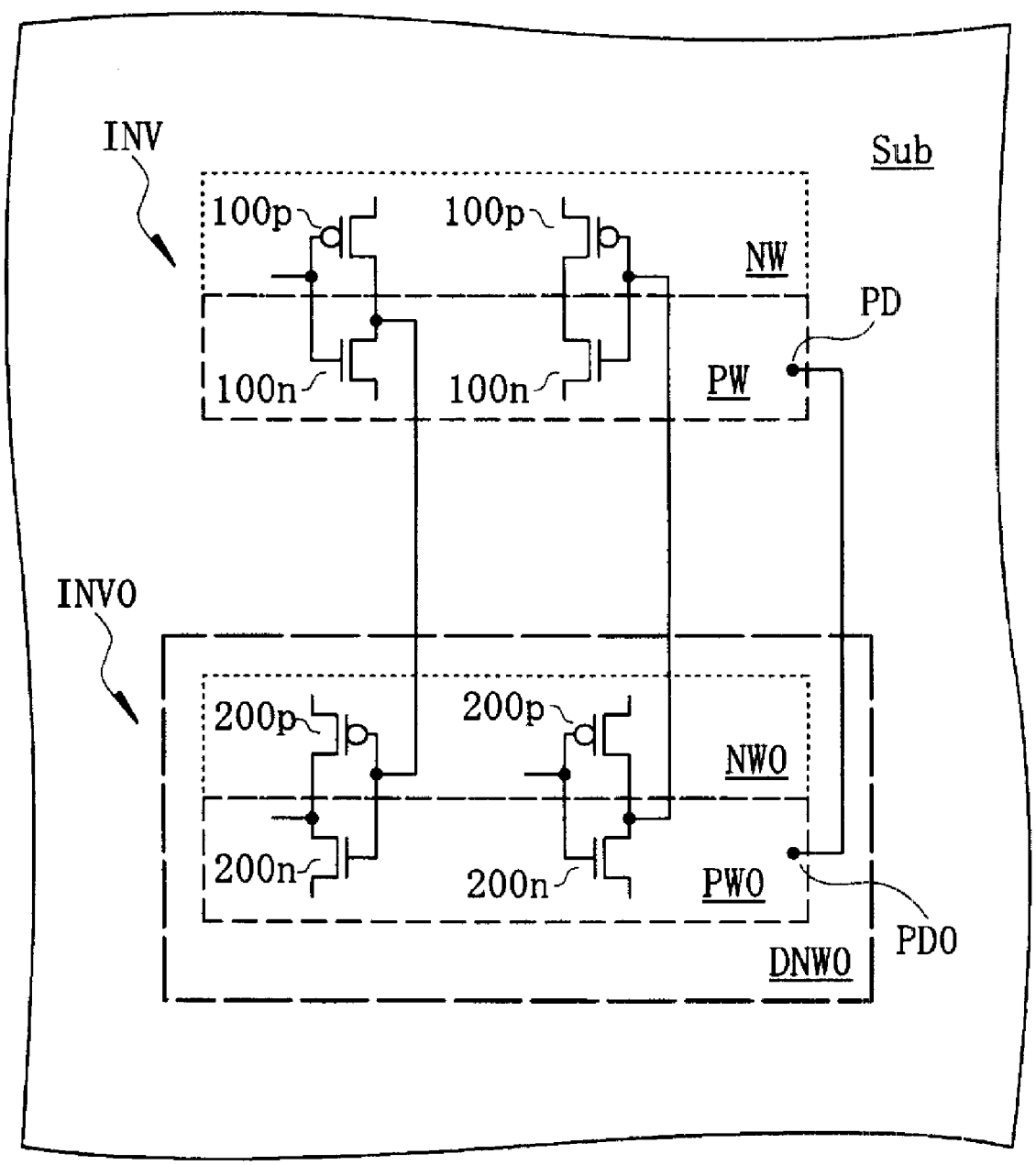
FIG. 8 is a circuit diagram illustrating a second example of the first method for preventing a dielectric breakdown in the gate insulating film of a MIS according to the first embodiment.
Figure 9:
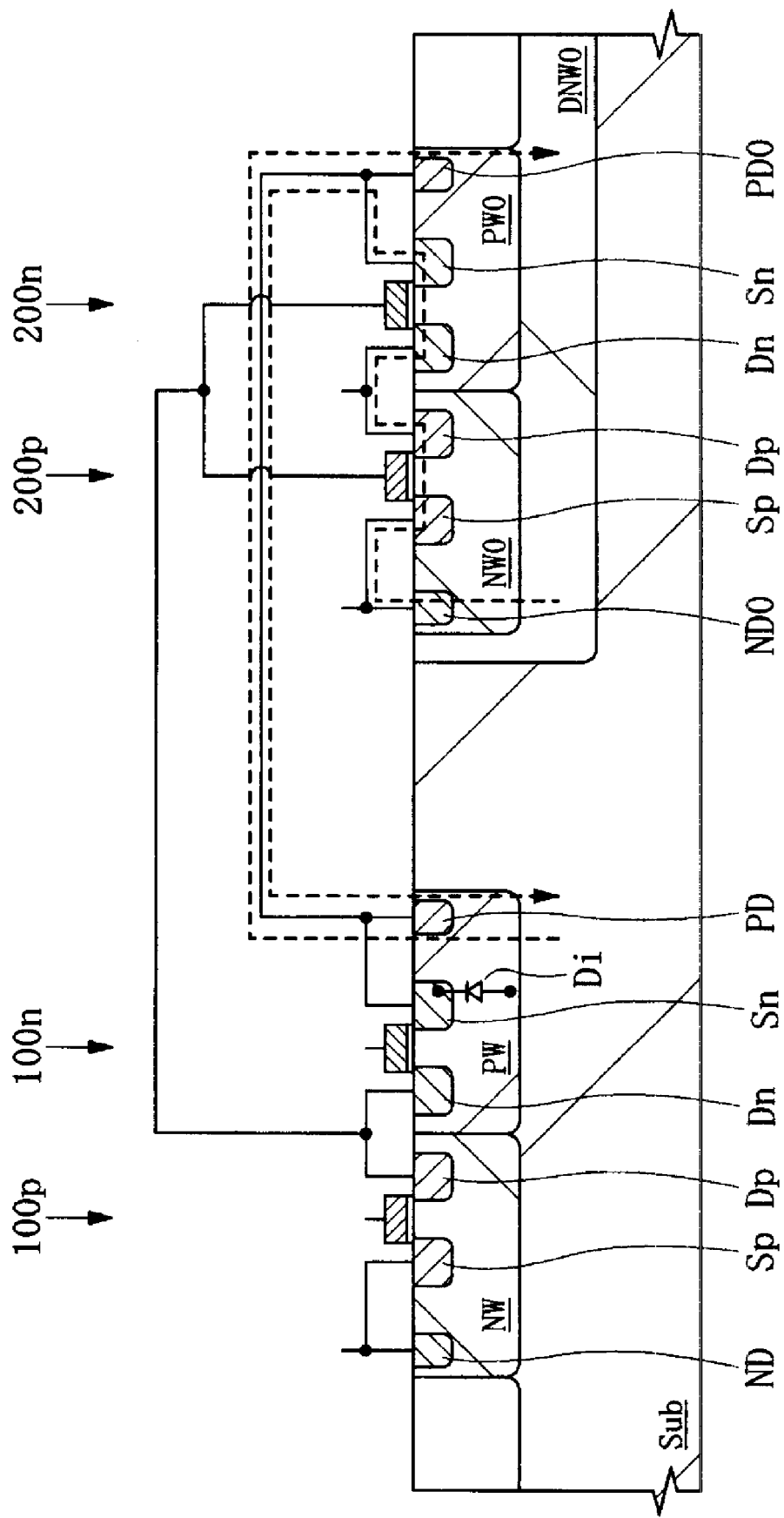
FIG. 9 is a principal-portion cross-sectional view of the first circuit illustrating the second example of the first method shown in FIG. 8 mentioned above.
Figure 10:
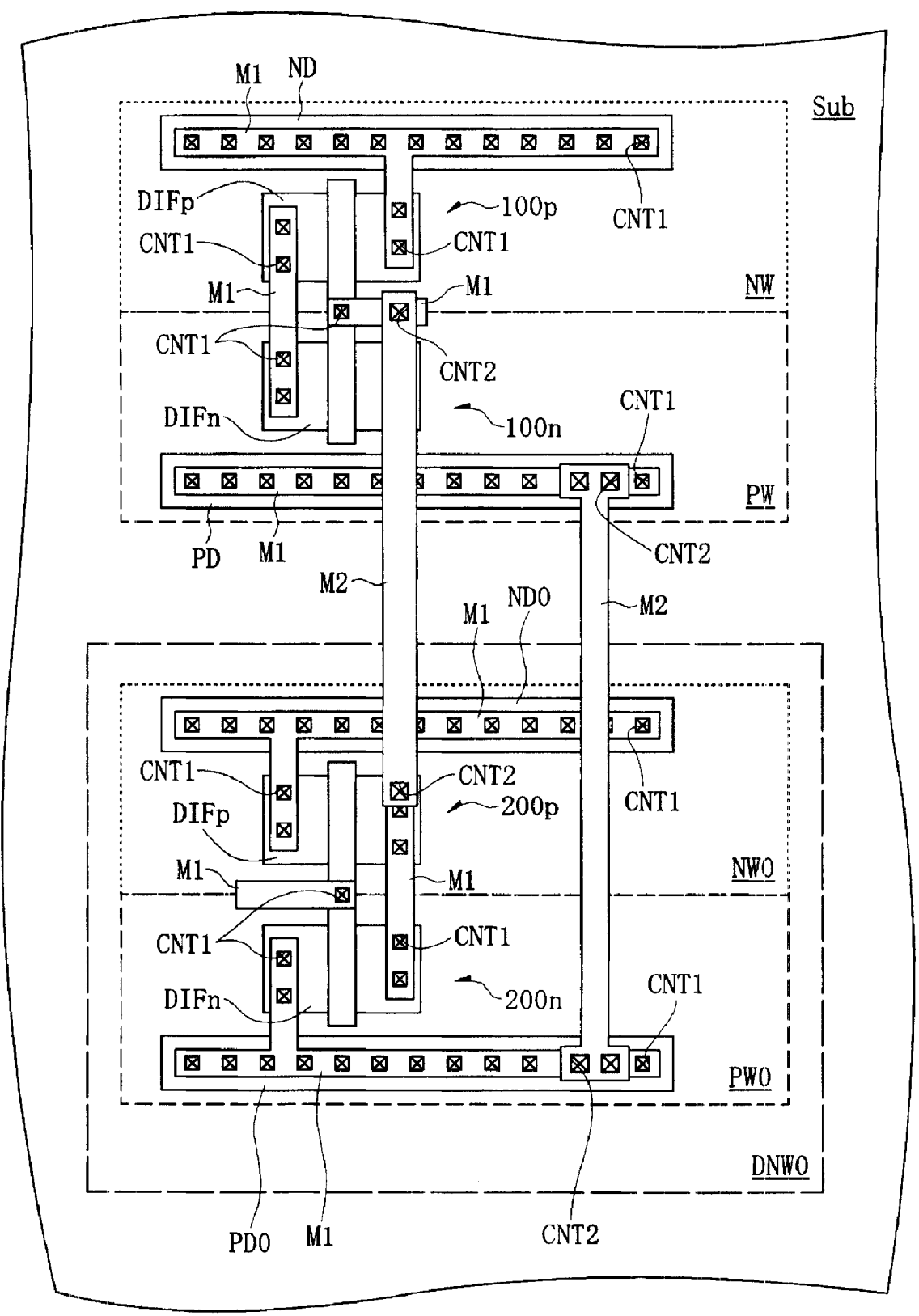
FIG. 10 is a principal-portion plan view of the first circuit illustrating the second example of the first method shown in FIG. 8 mentioned above.

In the present first embodiment, a description will be given of two examples (first and second examples) of a first method for preventing a dielectric breakdown in the gate insulating film of a MIS in each of the foregoing first circuit (FIGS. 2(a) and 2(b) mentioned above) and the foregoing second circuit (FIGS. 3(a) and 3(b) mentioned above). First, the first example of the first method will be described with reference to FIGS. 5 to 7, and then the second example of the first method will be described with reference to FIGS. 8 to 10. FIG. 5 is a circuit diagram illustrating the first example of the first method for preventing a dielectric breakdown in the gate insulating film of a MIS according to the present first embodiment. FIG. 6 is a principal-portion cross-sectional view of the first circuit illustrating the first example of the first method shown in FIG. 5 mentioned above. FIG. 7 is a principal-portion plan view of the first circuit illustrating the first example of the first method shown in FIG. 5 mentioned above. FIG. 8 is a circuit diagram illustrating the second example of the first method for preventing a dielectric breakdown in the gate insulating film of a MIS according to the present first embodiment. FIG. 9 is a principal-portion cross-sectional view of the first circuit illustrating the second example of the first method shown in FIG. 8 mentioned above. FIG. 10 is a principal-portion plan view of the first circuit illustrating the second example of the first method shown in FIG. 8 mentioned above.

First, the first example of the first method will be described.

As described above, the first circuit (FIGS. 2(a) and 2(b) mentioned above) includes the inverter circuit INV formed in the substrate Sub, and the inverter circuit INV0 formed in the deep n-type well DNW0. The respective gate electrodes of the pMIS 200p and the nMIS 200n which form the inverter circuit INV0 are electrically coupled to the respective drain electrodes of the pMIS 100p and the nMIS 100n which form the inverter circuit INV. In the gate insulating film of the pMIS 200p or the nMIS 200n forming the inverter circuit INV0, a dielectric breakdown has occurred.

On the other hand, as described above, the second circuit (FIGS. 3(a) and 3(b) mentioned above) includes the inverter circuit INV formed in the substrate Sub, and the inverter circuit INV0 formed in the deep n-type well DNW0. The respective gate electrodes of the pMIS 100p and the nMIS 100n which form the inverter circuit INV are electrically coupled to the respective drain electrodes of the pMIS 200p and the nMIS 200n which form the inverter circuit INV0. In the gate insulating film of the pMIS 100p or the nMIS 100n forming the inverter circuit INV, a dielectric breakdown has occurred.

As shown in FIG. 5, in the first example of the first method according to the present first embodiment, a shallow p-type well PW100 is formed in the substrate Sub, and a p-type diffusion tap PD100 for potential fixation is formed in the shallow p-type well PW100. The p-type diffusion tap PD100 is coupled to a p-type diffusion tap PD0 for potential fixation which is formed in the shallow p-type well PW0 in the deep n-type well DNW0 using an interconnection in a second or higher order layer.

The wiring of the inverter circuit INV formed in the substrate Sub to the inverter circuit INV0 formed in the deep n-type well DNW0, i.e., the wiring of the respective drain electrodes of the pMIS 100p and the nMIS 100n which form the inverter circuit INV to the respective gate electrodes of the pMIS 200p and the nMIS 200p which form the inverter circuit INV0, and the wiring of the respective gate electrodes of the pMIS 100p and the nMIS 100n which form the inverter circuit INV to the respective drain electrodes of the pMIS 200p and the nMIS 200n which form the inverter circuit INV0 are performed using an interconnection in the same layer as that of the interconnection used to wire the p-type diffusion tap PD100 to the p-type diffusion tap PD0, or an interconnection in a layer higher in order than that. For example, in the case where the wiring of the p-type diffusion tap PD100 to the p-type diffusion tap PD0 is performed using an interconnection in a second layer, the wiring of the inverter circuit INV formed in the substrate Sub to the inverter circuit INV0 formed in the deep n-type well DNW0 is performed using an interconnection in a second or higher order layer. In the case where the wiring of the p-type diffusion tap PD100 to the p-type diffusion tap PD0 is performed using an interconnection in a third layer, the wiring of the inverter circuit INV formed in the substrate Sub to the inverter circuit INV0 formed in the deep n-type well DNW0 is performed using an interconnection in a third or higher order layer.

As shown in FIG. 6, in the first circuit (circuit in which wiring is provided between the respective drain electrodes of the pMIS 100p and the nMIS 100n which form the inverter circuit INV and the respective gate electrodes of the pMIS 200p and the nMIS 200n which form the inverter circuit INV0), a parasitic pn diode is formed by the wiring of the p-type diffusion tap PD100 to the p-type diffusion tap PD0. The parasitic pn diode forms a forward discharge path extending from the substrate Sub to the deep n-type well DNW0 via the shallow p-type well PW100, the p-type diffusion tap PD100, the interconnection, the p-type diffusion tap PD0, and the shallow p-type well PW0.

In the first circuit, in a manufacturing step of forming the coupling holes for coupling the inverter circuit INV0 formed in the deep n-type well DNW0 to the inverter circuit INV formed in the substrate Sub, the gate electrode of the pMIS 200p formed in the shallow n-type well NW0 in the deep n-type well DNW0 is brought into a floating state to bring the pMIS 200p into a conducting state. As a result, a discharge path is formed which extends from the deep n-type well DNW0 to the substrate Sub via the shallow n-type well NW0, the n-type diffusion tap ND0, the pMIS 200p (the source electrode Sp thereof, the channel region thereof, and the drain region Dp thereof), the shallow p-type well PW0, the p-type diffusion tap PD0, the interconnection, the p-type diffusion tap PD100, and the shallow p-type well PW100.

The formation of the discharge path mentioned above allows discharge of the charge accumulated in the deep n-type well DNW0, the shallow n-type well NW0, and the shallow p-type well PW0. Therefore, it is possible to prevent a dielectric breakdown in each of the gate insulating films of the pMIS 200p and the nMIS 200n which are respectively formed in the shallow n-type well NW0 and the shallow p-type well PW0 in the deep n-type well DNW0.

In the second circuit (circuit in which the respective gate electrodes of the pMIS 100p and the nMIS 100n which form the inverter circuit INV are wired to the respective drain electrodes of the pMIS 200p and the nMIS 200n which form the inverter circuit INV0) also, the same effect as obtained in the first circuit described above can be obtained, though the description thereof is omitted herein. Therefore, it is possible to prevent a dielectric breakdown in each of the gate insulating films of the pMIS 100p and the nMIS 100n which are respectively formed in the shallow n-type well NW and the shallow p-type well PW in the substrate Sub.

FIG. 7 shows a principal-portion plan view of the p-type diffusion tap PD100 formed in the substrate Sub and the p-type diffusion tap PD0 formed in the shallow p-type well PW0 in the deep n-type well DNW0.

In the shallow p-type well PW100 in the substrate Sub, the p-type diffusion tap PD100 is formed, while in the interlayer insulating film (not shown) formed over the substrate Sub, coupling holes CNT1 are formed to reach the p-type diffusion tap PD100. Likewise, in the shallow p-type well PW0 in the deep n-type well DNW0, the p-type diffusion tap PD0 is formed, while in the interlayer insulating film (not shown) formed over the substrate Sub (deep n-type well DNW0), the coupling holes CNT1 are formed to reach the p-type diffusion tap PD0. There is also formed an interconnection M1 in a first layer which is electrically coupled to the p-type diffusion tap PD100 or the p-type diffusion tap PD0 through the coupling holes CNT1.

Further, in the interlayer insulating film (not shown) formed over the substrate Sub to cover the interconnection M1 in the first layer, there are formed coupling holes CNT2 reaching the interconnection M1 in the first layer which is electrically coupled to the p-type diffusion tap PD100 formed in the shallow p-type well PW100 in the substrate Sub, and the coupling holes CNT2 reaching the interconnection M1 in the first layer which is electrically coupled to the p-type diffusion tap PD0 formed in the shallow p-type well PW0 in the deep n-type well DNW0. The p-type diffusion tap PD100 formed in the shallow p-type well PW100 in the substrate Sub is electrically coupled to the p-type diffusion tap PD0 formed in the shallow p-type well PW0 in the deep n-type well DNW0 using an interconnection M2 in the second layer.

Next, the second example of the first method will be described.

In the second example of the first method also, a description is given of the method for preventing a dielectric breakdown in the gate insulating film of the pMIS 200p or the nMIS 200n forming the inverter circuit INV0, which occurs in the first circuit (FIGS. 2(a) and 2(b) mentioned above), and a dielectric breakdown in the gate insulating of the pMIS 100p or the nMIS 100n forming the inverter circuit INV, which occurs in the second circuit (FIGS. 3(a) and 3(b) mentioned above), in the same manner as in the first example of the first method described above. The first and second examples of the first method are different in that, in the first example, the shallow p-type well PW100 is formed in the substrate Sub, and the p-type diffusion tap PD100 which is electrically coupled to the p-type diffusion tap PD0 formed in the shallow p-type well PW0 in the deep n-type well DNW0 is formed in the shallow p-type well PW100, while in the second example, the p-type diffusion tap PD for potential fixation which is formed in the shallow p-type well PW in the substrate Sub is used also as a p-type diffusion tap for discharging accumulated charge.

As shown in FIG. 8, in the second example of the first method according to the present first embodiment, the p-type diffusion tap PD for potential fixation is formed in the shallow p-type well PW in the substrate Sub where the nMIS 100n is formed, while the p-type diffusion tap PD0 for potential fixation is formed in the shallow p-type well NW0 in the deep n-type well DNW0 where the nMIS 200n is formed. The p-type diffusion tap PD is further coupled to the p-type diffusion tap PD0 using an interconnection in a second or higher order layer.

The wiring of the inverter circuit INV formed in the substrate Sub to the inverter circuit INV0 formed in the deep n-type well DNW0, i.e., the wiring of the respective drain electrodes of the pMIS 100p and the nMIS 100n which form the inverter circuit INV to the respective gate electrodes of the pMIS 200p and the nMIS 200n which form the inverter circuit INV0, and the wiring of the respective gate electrodes of the pMIS 100p and the nMIS 100n which form the inverter circuit INV to the respective drain electrodes of the pMIS 200p and the nMIS 200n which form the inverter circuit INV0 are performed using the interconnection in the same layer as that of the interconnection used to wire the p-type diffusion tap PD to the p-type diffusion tap PD0, or an interconnection in a layer higher in order than that. For example, in the case where the wiring of the p-type diffusion tap PD to the p-type diffusion tap PD0 is performed using the interconnection in the second layer, the wiring of the inverter circuit INV formed in the substrate Sub to the inverter circuit INV0 formed in the deep n-type well DNW0 is performed using an interconnection in a second or higher order layer. In the case where the wiring of the p-type diffusion tap PD to the p-type diffusion tap PD0 is performed using the interconnection in the third layer, the wiring of the inverter circuit INV formed in the substrate Sub to the inverter circuit INV0 formed in the deep n-type well DNW0 is performed using an interconnection in a third or higher order layer.

As shown in FIG. 9, in the first circuit (circuit in which wiring is provided between the respective drain electrodes of the pMIS 100p and the nMIS 100n which form the inverter circuit INV and the respective gate electrodes of the pMIS 200p and the nMIS 200n which form the inverter circuit INV0), a parasitic pn diode is formed by the wiring of the p-type diffusion tap PD to the p-type diffusion tap PD0. The parasitic pn diode forms a discharge path extending from the substrate Sub to the deep n-type well DNW0 via the shallow p-type well PW, the p-type diffusion tap PD, the interconnection, the p-type diffusion tap PD0, and the shallow p-type well PW0.

In the first circuit, in the manufacturing step of forming the coupling holes for coupling the inverter circuit INV formed in the substrate Sub to the inverter circuit INV0 formed in the deep n-type well DNW0, the respective gate electrodes of the pMIS 200p and the nMIS 200n which are respectively formed in the shallow n-type well NW0 and the shallow p-type well PW0 in the deep n-type well DNW0 are each brought into a floating state to bring each of the pMIS 200p and the nMIS 200n into a conducting state. As a result, a discharge path is formed which extends from the deep n-type well DNW0 to the substrate Sub via the shallow n-type well NW0, the n-type diffusion tap ND0, the pMIS 200p (the source electrode Sp thereof, the channel region thereof, and the drain region Dp thereof), the nMIS 200n (the drain electrode Dn thereof, the channel region thereof, and the source electrode Sn thereof), the interconnection, the p-type diffusion tap PD, and the shallow p-type well WP.

The formation of the discharge path mentioned above allows discharge of the charge accumulated in the deep n-type well DNW0, the shallow n-type well NW0, and the shallow p-type well PW0. Therefore, it is possible to prevent a dielectric breakdown in each of the gate insulating films of the pMIS 200p and the nMIS 200n which are respectively formed in the shallow n-type well NW0 and the shallow p-type well PW0 in the deep n-type well DNW0.

It is to be noted that a parasitic diode Di is present between the shallow p-type well PW formed in the substrate Sub and the source electrode Sn of the nMIS 100n formed in the shallow p-type well PW. However, since the substrate Sub, the shallow p-type well PW, and the p-type diffusion tap DP are all p-type semiconductor regions, it is considered that the discharge path extending from the substrate Sub through the shallow p-type well PW and the p-type diffusion tap DP is more dominant than the parasitic diode Di.

In the second circuit (circuit in which the respective gate electrodes of the pMIS 100p and the nMIS 100n which form the inverter circuit INV are wired to the respective drain electrodes of the pMIS 200p and the nMIS 200n which form the inverter circuit INV0) also, the same effect as obtained in the first circuit described above can be obtained, though the description thereof is omitted herein. Therefore, it is possible to prevent a dielectric breakdown in each of the gate insulating films of the pMIS 100p and the nMIS 100n which are respectively formed in the shallow n-type well NW and the shallow p-type well PW in the substrate Sub.

FIG. 10 shows a principal-portion plan view of the inverter circuit INV0 formed in the substrate Sub and the inverter circuit INV0 formed in the deep n-type well DNW0.

In the shallow p-type well PW in the substrate Sub, the nMIS 100n is formed. The nMIS 100n includes n-type diffusion layers DIFn forming a source electrode and a drain electrode. On the other hand, in the shallow n-type well NW in the substrate Sub, the pMIS 100p is formed. The pMIS 100p includes p-type diffusion layers DIFp forming a source electrode and a drain electrode. In the interlayer insulating film (not shown) over the substrate Sub, the coupling holes CNT1 are formed in contact with the drain electrode (n-type diffusion layer DIFn) of the nMIS 100n or with the drain electrode (p-type diffusion layer DIFp) of the pMIS 100p. Through the coupling holes CNT1, the respective drain electrodes of the nMIS 100n and the pMIS 100p are electrically coupled via the interconnection M1 in the first layer.

In the shallow n-type well NW in the substrate Sub, an n-type diffusion tap ND is formed, while in the shallow p-type well PW, the p-type diffusion tap PD is formed. In the interlayer insulating film (not shown) over the substrate Sub, the coupling holes CNT1 are formed in contact with the n-type diffusion tap ND or with the source electrode (p-type diffusion layer DIFp) of the pMIS 100p. Through the coupling holes CNT1, the n-type diffusion tap ND and the source electrode of the pMIS 100p are electrically coupled via the interconnection in the first layer. The gate electrode of the nMIS 100n and the gate electrode of the pMIS 100p are formed of a conductive film in the same common layer. Through the coupling holes CNT1 formed in the interlayer insulating film (not shown) formed over the substrate Sub, the interconnection M1 in the first layer is electrically coupled to the conductive film.

Likewise, in the shallow p-type well PW0 in the deep n-type well DNW0, the nMIS 200n is formed. The nMIS 200n includes the n-type diffusion layers DIFn forming a source electrode and a drain electrode. On the other hand, in the shallow n-type well NW in the deep n-type well DNW0, the pMIS 200p is formed. The pMIS 200p includes the p-type diffusion layers DIFp forming a source electrode and a drain electrode. In the interlayer insulating film (not shown) over the substrate Sub (the deep n-type well DNW0), the coupling holes CNT1 are formed in contact with the drain electrode (n-type diffusion layer DIFn) of the nMIS 200n or with the drain electrode (p-type diffusion layer DIFp) of the pMIS 200p. Through the coupling holes CNT1, the respective drain electrodes of the nMIS 200n and the pMIS 200p are electrically coupling via the interconnection M1 in the first layer.

In the shallow n-type well NW0 in the deep n-type well DNW0, the n-type diffusion tap ND0 is formed, while in the shallow p-type well PW0, the p-type diffusion tap PD0 is formed. In the interlayer insulating film (not shown) over the substrate Sub (the deep n-type well DNW0), the coupling holes CNT1 are formed in contact with the n-type diffusion tap ND0 or with the source electrode (p-type diffusion layer DIFp) of the pMIS 200p. Through the coupling holes CNT1, the n-type diffusion tap ND0 and the source electrode of the pMIS 200p are electrically coupled via the interconnection M1 in the first layer. The gate electrode of the nMIS 200n and the gate electrode of the pMIS 200p are formed of a conductive film in the same common layer. Through the coupling holes CNT1 formed in the interlayer insulating film (not shown) formed over the substrate Sub, the interconnection M1 in the first layer is electrically coupled to the conductive film.

There are further formed the interconnection M1 in the first layer which is electrically coupled to the common gate electrode of the pMIS 100p and the nMIS 100n each formed in the substrate Sub through the coupling holes CNT1, and the interconnection M1 in the first layer which is electrically coupled to each of the respective drain electrodes of the pMIS 200p and the nMIS 200n each formed in the deep n-type well DNW0 through the coupling holes CNT1. Additionally, the coupling holes CNT2 are formed in the interlayer insulating film (not shown) formed over the substrate Sub to cover the interconnections M1 in the first layer. Through the coupling holes CNT2, the interconnection in the first layer which is electrically coupled to the common gate electrode of the pMIS 100p and the nMIS 100p is electrically coupled to the interconnection M1 in the first layer which is electrically coupled to each of the respective drain electrodes of the pMIS 200p and the nMIS 200n via the interconnection M2 in the second layer.

To the p-type diffusion tap PD formed in the shallow p-type well PW in the substrate Sub or to the p-type diffusion tap PD0 formed in the shallow p-type well PW0 in the deep n-type well DNW0, the interconnections M1 in the first layer are electrically coupled through the coupling holes CNT1. In the interlayer insulating film (not shown) formed over the substrate Sub to cover the interconnections M1 in the first layer, the coupling holes CNT2 are formed. Through the coupling holes CNT2, the p-type diffusion taps PD and PD0 are electrically coupled via the interconnection M2 in the second layer.

In the present first embodiment, it is assumed that the p-type diffusion taps PD and PD100 are wired to the p-type diffusion tap PD0 using an interconnection in a second or higher order layer. This is because, since an interconnection in a first layer is generally used as a signal interconnection, it is difficult to couple the p-type diffusion taps PD and PD100 to the p-type diffusion tap PD0 using the interconnection in the first layer. Therefore, in the case where layout using the interconnection in the first layer is possible, the interconnection in the first layer can also be used to wire the p-type diffusion taps PD and PD100 to the p-type diffusion tap PD0.

Thus, according to the present first embodiment, even when charge is accumulated in the deep n-type well DNW0, the shallow n-type well NW0, and the shallow p-type well PW0 due to a plasma charge-up phenomenon in, e.g., a dry etching step, the charge can be easily discharged to the substrate Sub. Therefore, it is possible to prevent a dielectric breakdown in each of the gate insulating films of the pMIS 200p and the nMIS 200n which are respectively formed in the shallow n-type well NW0 and the shallow n-type well PW0 in the deep n-type well DNW0 to form the inverter circuit INV0, and a dielectric breakdown in each of the gate insulating films of the pMIS 100p and the nMIS 100n which are respectively formed in the shallow n-type well NW and the shallow p-type well PW in the substrate Sub to form the inverter circuit INV. In particular, when, e.g., the shallow p-type well PW formed in the substrate Sub and the shallow p-type well PW0 formed in the deep n-type well DNW0 are at the same potential, the first method in the present first embodiment serves as an effective means.

Embodiment 2

Figure 11:
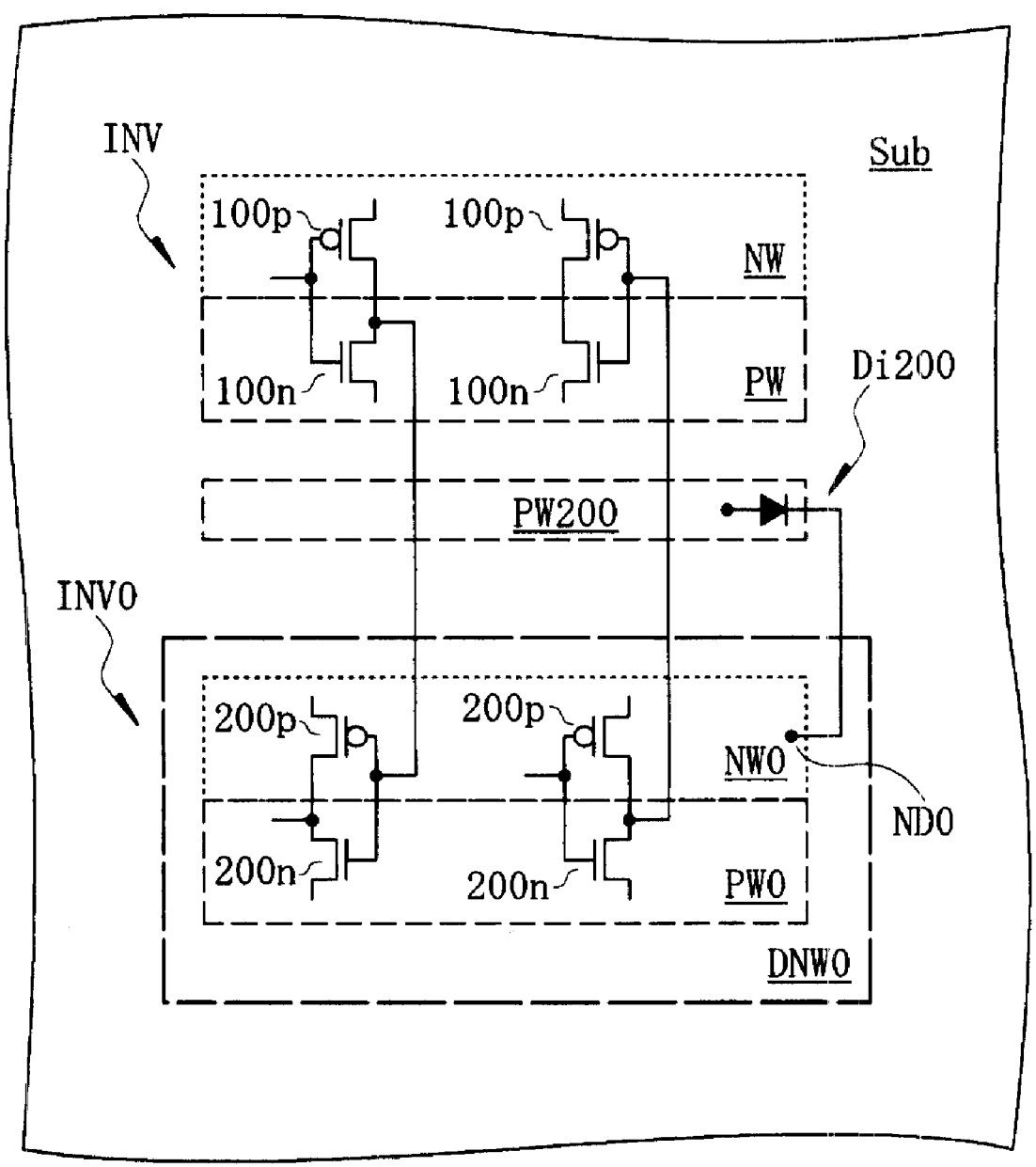
FIG. 11 is a circuit diagram illustrating a second method for preventing a dielectric breakdown in the gate insulating film of a MIS according to a second embodiment.
Figure 12:
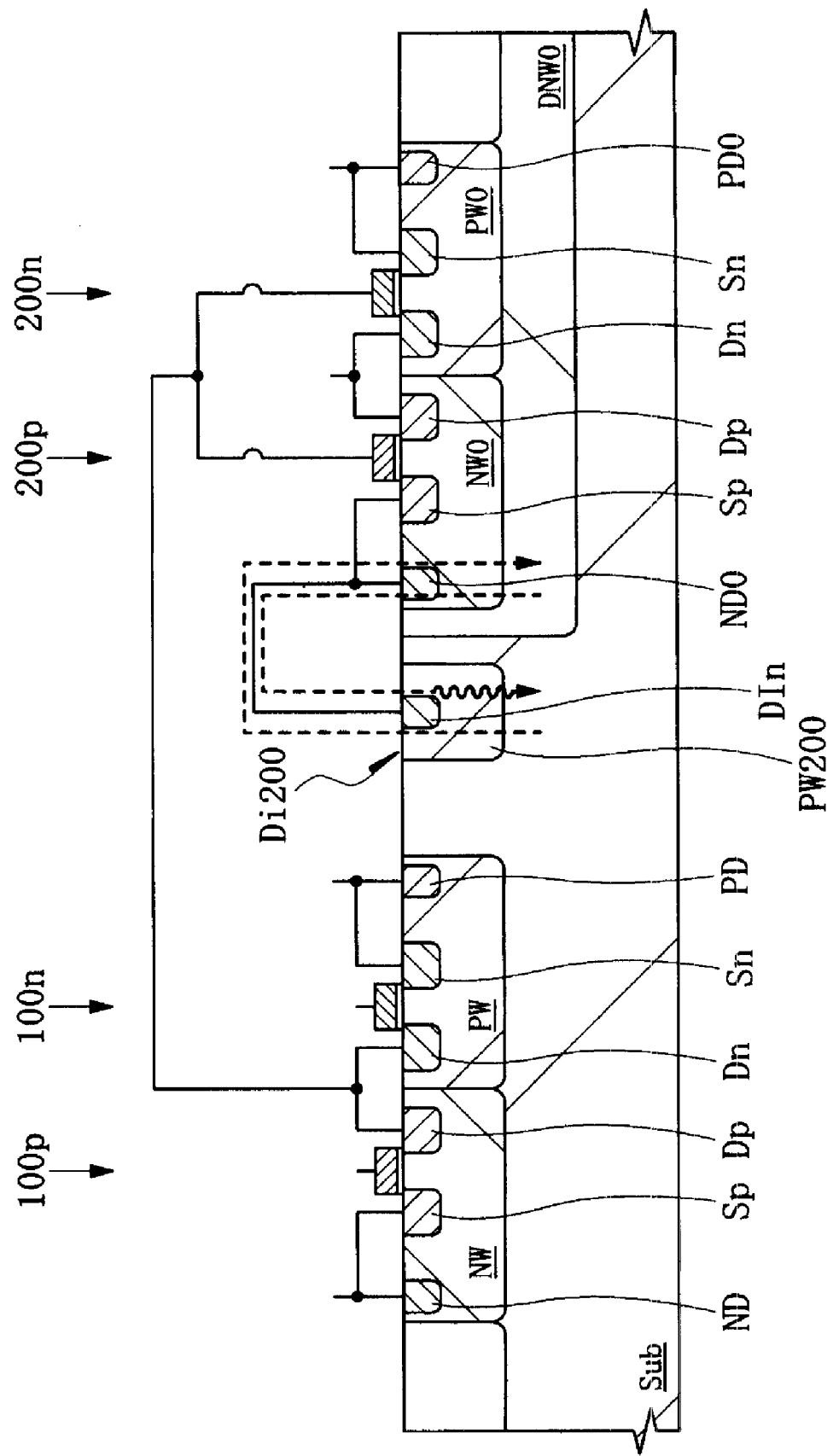
FIG. 12 is a principal-portion cross-sectional view of a first circuit illustrating the second method shown in FIG. 11 mentioned above.
Figure 13A:
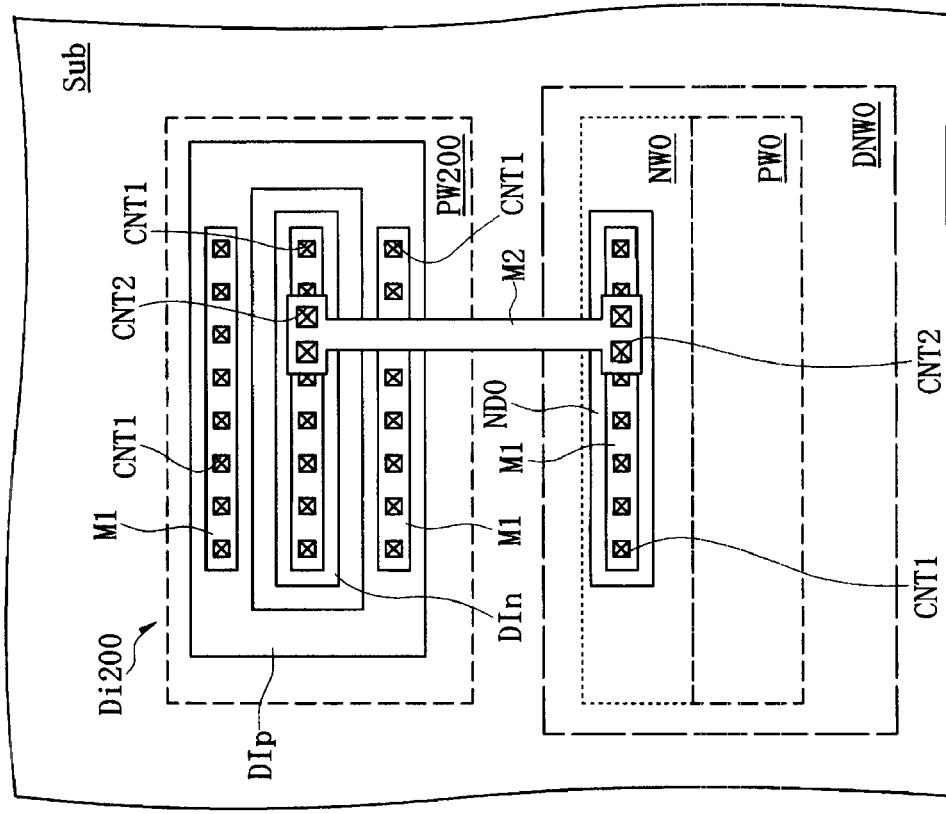
FIGS. 13(a) and 13(b) are principal-portion plan views of the first circuit illustrating the second method shown in FIG. 11 mentioned above.

In the present second embodiment, a description will be given of a second method for preventing a dielectric breakdown in the gate insulating film of a MIS in each of the foregoing first circuit (FIGS. 2(*a*) and 2(*b*) mentioned above) and the foregoing second circuit (FIGS. 3(*a*) and 3(*b*) mentioned above) with reference to FIG. 11 to 13. FIG. 11 is a circuit diagram illustrating the second method for preventing a dielectric breakdown in the gate insulating film of a MIS according to the present second embodiment. FIG. 12 is a principal-portion cross-sectional view of the first circuit illustrating the second method shown in FIG. 11 mentioned above. FIGS. 13(*a*) and 13(*b*) are principal-portion plan views of the first circuit illustrating the second method shown in FIG. 11 mentioned above.

As described above, the first circuit (FIGS. 2(*a*) and 2(*b*) mentioned above) includes the inverter circuit INV formed in the substrate Sub, and the inverter circuit INV0 formed in the deep n-type well DNW0. The respective gate electrodes of the pMIS 200*p* and the nMIS 200*n* which form the inverter circuit INV0 are electrically coupled to the respective drain electrodes of the pMIS 100*p* and the nMIS 100*n* which form the inverter circuit INV. In the gate insulating film of the pMIS 200*p* or the nMIS 200*n* which form the inverter circuit INV0, a dielectric breakdown has occurred.

On the other hand, as described above, the second circuit (FIGS. 3(*a*) and 3(*b*) mentioned above) includes the inverter circuit INV formed in the substrate Sub, and the inverter circuit INV0 formed in the deep n-type well DNW0. The respective gate electrodes of the pMIS 100*p* and the nMIS 100*n* which form the inverter circuit INV are electrically coupled to the respective drain electrodes of the pMIS 200*p* and the nMIS 200*n* which form the inverter circuit INV0. In the gate insulating film of the pMIS 100*p* or the nMIS 100*n* forming the inverter circuit INV, a dielectric breakdown has occurred.

As shown in FIG. 11, in the second method according to the present second embodiment, a shallow p-type well PW200 in the substrate Sub and an n-type diffusion layer in the shallow p-type well PW200 form a pn diode Di200. The cathode of the pn diode Di200 and the n-type diffusion tap ND0 for potential fixation which is formed in the shallow n-type well NW0 in the deep n-type well DNW0 are coupled using an interconnection in a second or higher order layer.

The wiring of the inverter circuit INV formed in the substrate Sub to the inverter circuit INV0 formed in the deep n-type well DNW0, i.e., the wiring of the respective drain electrodes of the pMIS 100*p* and the nMIS 100*n* which form the inverter circuit INV to the respective gate electrodes of the pMIS 200*p* and the nMIS 200 which form the inverter circuit INV0, and the wiring of the respective gate electrodes of the pMIS 100*p* and the nMIS 100*n* which form the inverter circuit INV to the respective drain electrodes of the pMIS 200*p* and the nMIS 200*n* which form the inverter circuit INV0 are performed using an interconnection in the same layer as that of the interconnection used to wire the n-type diffusion layer of the pn diode Di200 to the n-type diffusion tap ND0, or an interconnection in a layer higher in order than that. For example, in the case where the wiring of the n-type diffusion layer of the pn diode Di200 to the n-type diffusion tap ND0 is performed using the interconnection in the second layer, the wiring of the inverter circuit INV formed in the substrate Sub to the inverter circuit INV0 formed in the deep n-type well DNW0 is performed using an interconnection in a second or higher order layer. In the case where the wiring of the n-type diffusion layer of the pn diode Di200 to the n-type diffusion tap ND0 is performed using the interconnection in the third layer, the wiring of the inverter circuit INV formed in the substrate Sub to the inverter circuit INV0 formed in the deep n-type well DNW0 is performed using an interconnection in a third or higher order layer.

As shown in FIG. 12, in the first circuit (circuit in which wiring is provided between the respective drain electrodes of the pMIS 100*p* and the nMIS 100*n* which form the inverter circuit INV and the respective gate electrodes of the pMIS 200*p* and the nMIS 200*n* which form the inverter circuit INV0), when the potential of the substrate Sub is higher than the potential of the deep n-type well DNW0, the pn diode Di200 forms a forward discharge path extending from the substrate Sub to the deep n-type well DNW0 via the shallow p-type well PW200, an n-type diffusion layer DIn, the interconnection, the n-type diffusion tap ND0, and the shallow n-type well NW0. When the potential of the substrate Sub is lower than the potential of the deep n-type well DNW0, the pn diode Di200 is in a reverse direction. For example, in a manufacturing step using plasma discharge such as a dry etching step, optical excitation due to light emission or thermal excitation due to heat increases a leakage current in the reverse direction to form a discharge path.

The formation of the discharge path mentioned above allows discharge of the charge accumulated in the deep n-type well DNW0, the shallow n-type well NW0, and the shallow p-type well PW0. Therefore, it is possible to prevent a dielectric breakdown in each of the gate insulating films of the pMIS 200*p* and the nMIS 200*n* which are respectively formed in the shallow n-type well NW0 and the shallow p-type well PW0 in the deep n-type well DNW0.

In the second circuit (circuit in which the respective gate electrodes of the pMIS 100*p* and the names 100*n* which form the inverter circuit INV are wired to the respective drain electrodes of the pMIS 200*p* and the nMIS 200*n* which form the inverter circuit INV0) also, the same effect as obtained in the first circuit described above can be obtained, though the description thereof is omitted herein. Therefore, it is possible to prevent a dielectric breakdown in each of the gate insulating films of the pMIS 100*p* and the nMIS 100*n* which are respectively formed in the shallow n-type well NW and the shallow p-type well PW in the substrate Sub.

FIGS. 13(*a*) and 13(*b*) show principal-portion plan views of the pn diode Di200 formed in the substrate Sub and the n-type diffusion tap ND0 formed in the deep n-type well DNW0. FIG. 13(*a*) is a principal-portion plan view of the pn diode Di200 formed of the n-type diffusion layer DIn which is formed in the shallow p-type well PW200 in the substrate Sub. FIG. 13(*b*) is a principal-portion plan view of the pn diode Di200 formed of the n-type diffusion layer DIn which is formed in the shallow p-type well PW200 in the substrate Sub, and surrounded by a guard ring formed of a p-type diffusion layer DIp.

As shown in FIG. 13(*a*), the n-type diffusion layer DIn is formed in the shallow p-type well PW200 in the substrate Sub. In the interlayer insulating film (not shown) formed over the substrate Sub, the coupling holes CNT1 are formed to reach the n-type diffusion layer DIn. Likewise, in the shallow n-type well NW0 in the deep n-type well DNW0, the n-type diffusion tap ND0 is formed. In the interlayer insulating film (not shown) formed over the substrate Sub (the deep n-type well DNW0), the coupling holes CNT1 are formed to reach the n-type diffusion tap ND0. There is also formed the interconnection M1 in the first layer which is electrically coupled to the n-type diffusion layer DIn or the n-type diffusion tap ND0 through the coupling holes CNT1.

Further, in the interlayer insulating film (not shown) formed over the substrate Sub to cover the interconnection M1 in the first layer, there are formed the coupling holes CNT2 reaching the interconnection M1 in the first layer which is electrically coupled to the n-type diffusion layer DIn formed in the shallow p-type well PW200 in the substrate Sub, and the coupling holes CNT2 reaching the interconnection M1 in the first layer which is electrically coupled to the n-type diffusion tap ND0 formed in the shallow n-type well NW0 in the deep n-type well DNW0. The n-type diffusion layer DIn formed in the shallow p-type well PW200 in the substrate Sub is electrically coupled to the n-type diffusion tap ND0 formed in the shallow n-type well NW0 in the deep n-type well DNW0 using the interconnection M2 in the second layer.

Figure 13B:
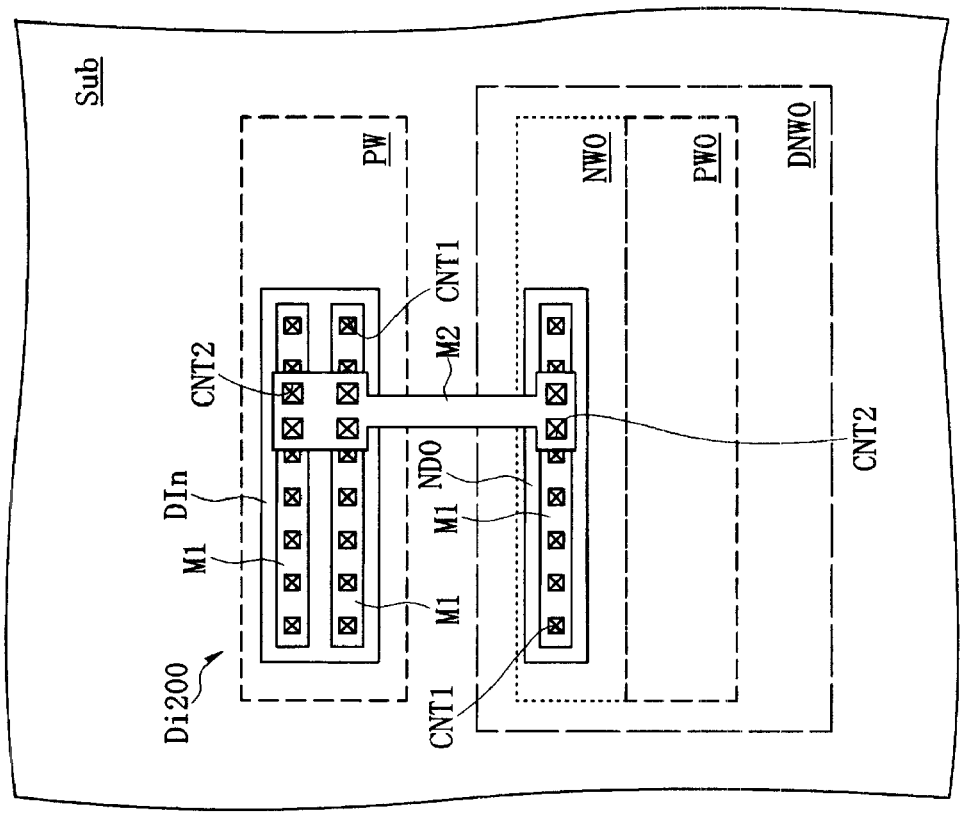

As shown in FIG. 13(b), the n-type diffusion layer DIn is formed in the shallow p-type well PW200 which is formed in the substrate Sub, and the p-type diffusion layer DIp is further formed to surround the n-type diffusion layer DIn at a given distance therefrom. In the interlayer insulating film (not shown) formed over the substrate Sub, the coupling holes CNT1 are formed to reach the n-type diffusion layer DIn or the p-type diffusion layer DIp. In the shallow n-type well NW0 in the deep n-type well DNW0, the n-type diffusion tap ND0 is formed. In the interlayer insulating film (not shown) formed over the substrate Sub (the deep n-type well DNW0), the coupling holes CNT1 are formed to reach the n-type diffusion tap ND0. There is also formed the interconnection M1 in the first layer which is electrically coupled to the n-type diffusion layer DIn, the p-type diffusion layer DIp, or the n-type diffusion tap ND0 through the coupling holes CNT1.

Further, in the interlayer insulating film (not shown) formed over the substrate Sub to cover the interconnection M1 in the first layer, there are formed the coupling holes CNT2 reaching the interconnection M1 in the first layer which is electrically coupled to the n-type diffusion layer DIn formed in the shallow p-type well PW200 in the substrate Sub, and the coupling holes CNT2 reaching the interconnection M1 in the first layer which is electrically coupled to the n-type diffusion tap ND0 formed in the shallow n-type well NW0 in the deep n-type well DNW0. The n-type diffusion layer DIn formed in the shallow p-type well PW200 in the substrate Sub is electrically coupled the n-type diffusion tap ND0 formed in the shallow n-type well NW0 in the deep n-type well DNW0 using the interconnection M2 in the second layer.

In the present second embodiment, it is assumed that the n-type diffusion tap ND0 is wired to the cathode of the pn diode Di200 using an interconnection in a second or higher order layer. However, in the case where layout using the interconnection in the first layer is possible, the interconnection in the first layer can also be used to wire the n-type diffusion tap ND0 to the cathode of the pn diode Di200.

Thus, according to the present second embodiment, even when charge is accumulated in the deep n-type well DNW0, the shallow n-type well NW0, and the shallow p-type well PW0, the charge can be easily discharged to the substrate Sub, in the same manner as in the first embodiment described above. Therefore, it is possible to prevent a dielectric breakdown in each of the gate insulating films of the pMIS 200p and the nMIS 200n which are respectively formed in the shallow n-type well NW0 and the shallow p-type well PW0 in the deep n-type well DNW0 to form the inverter circuit INV0, and a dielectric breakdown in each of the gate insulating films of the pMIS 100p and the nMIS 100n which are respectively formed in the shallow n-type well NW and the shallow p-type well PW in the substrate Sub to form the inverter circuit INV. In particular, in the case where the nMIS 100n and the pMIS 100p which are respectively formed in the shallow p-type well PW and the shallow n-type well NW in the substrate Sub are formed into a digital circuit, the nMIS 200n and the pMIS 200p which are respectively formed in the shallow p-type well PW0 and the shallow n-type well NW0 in the deep n-type well DNW0 are formed into an analog circuit, and each of the nMIS 100n, the pMIS 100p, the pMIS 200p, and the nMIS 200n has a dedicated power supply or ground, i.e., in the case where the power supply of the shallow n-type well NW formed in the substrate Sub is different from the power supply of the shallow n-type well NW0 formed in the deep n-type well DNW0, and the power supply of the shallow p-type well PW formed in the substrate Sub is different from the power supply of the shallow p-type well PW0 formed in the deep n-type well DNW0, the second method in the present second embodiment serves as an effective means.

Embodiment 3

Figure 14:
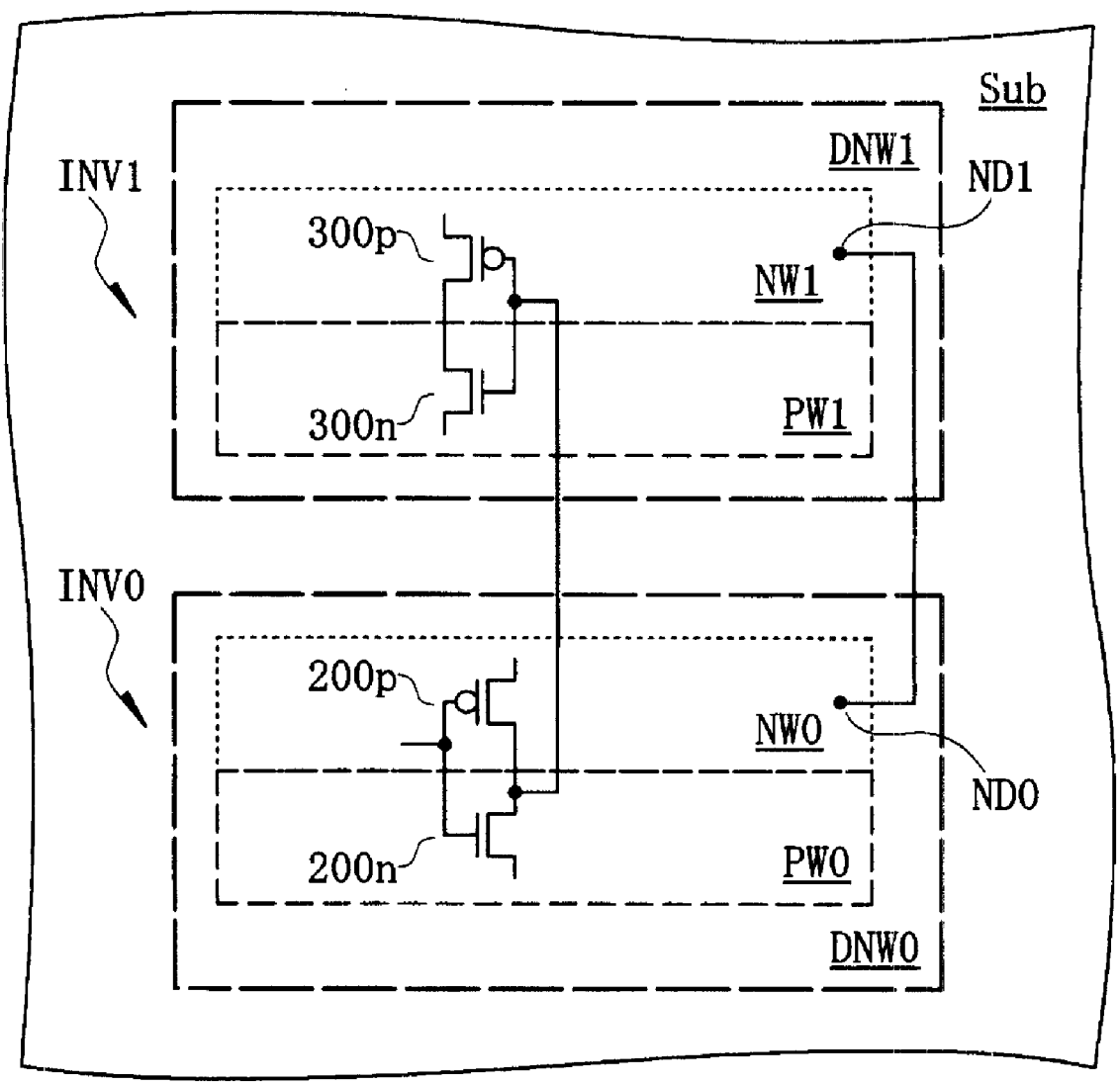
FIG. 14 is a circuit diagram illustrating a third method for preventing a dielectric breakdown in the gate insulating film of a MIS according to a third embodiment.
Figure 15:
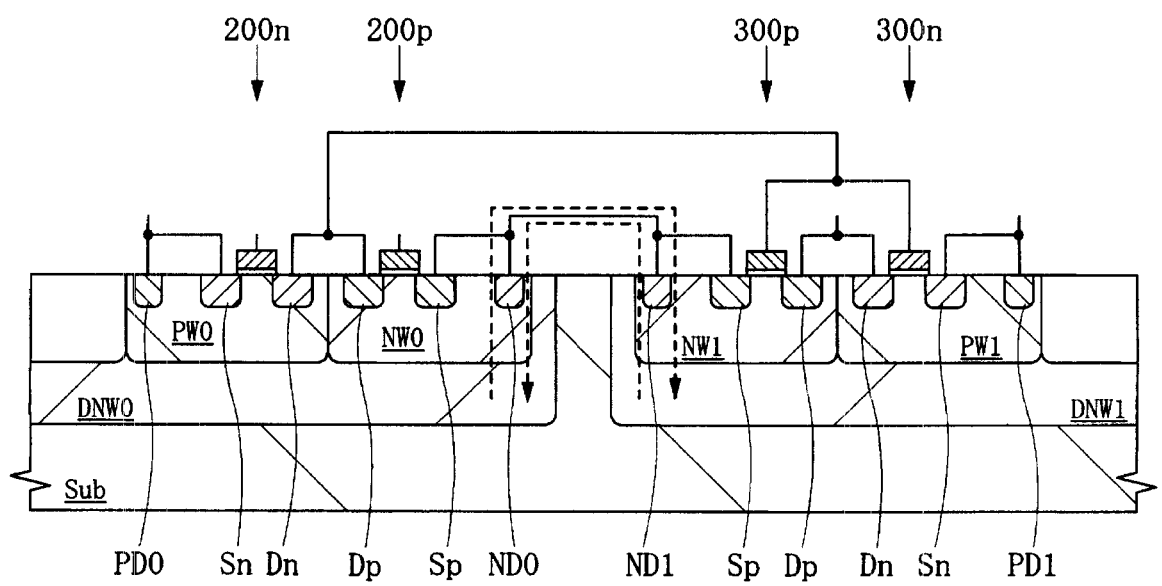
FIG. 15 is a principal-portion cross-sectional view of a third circuit illustrating the third method shown in FIG. 14 mentioned above.
Figure 16:
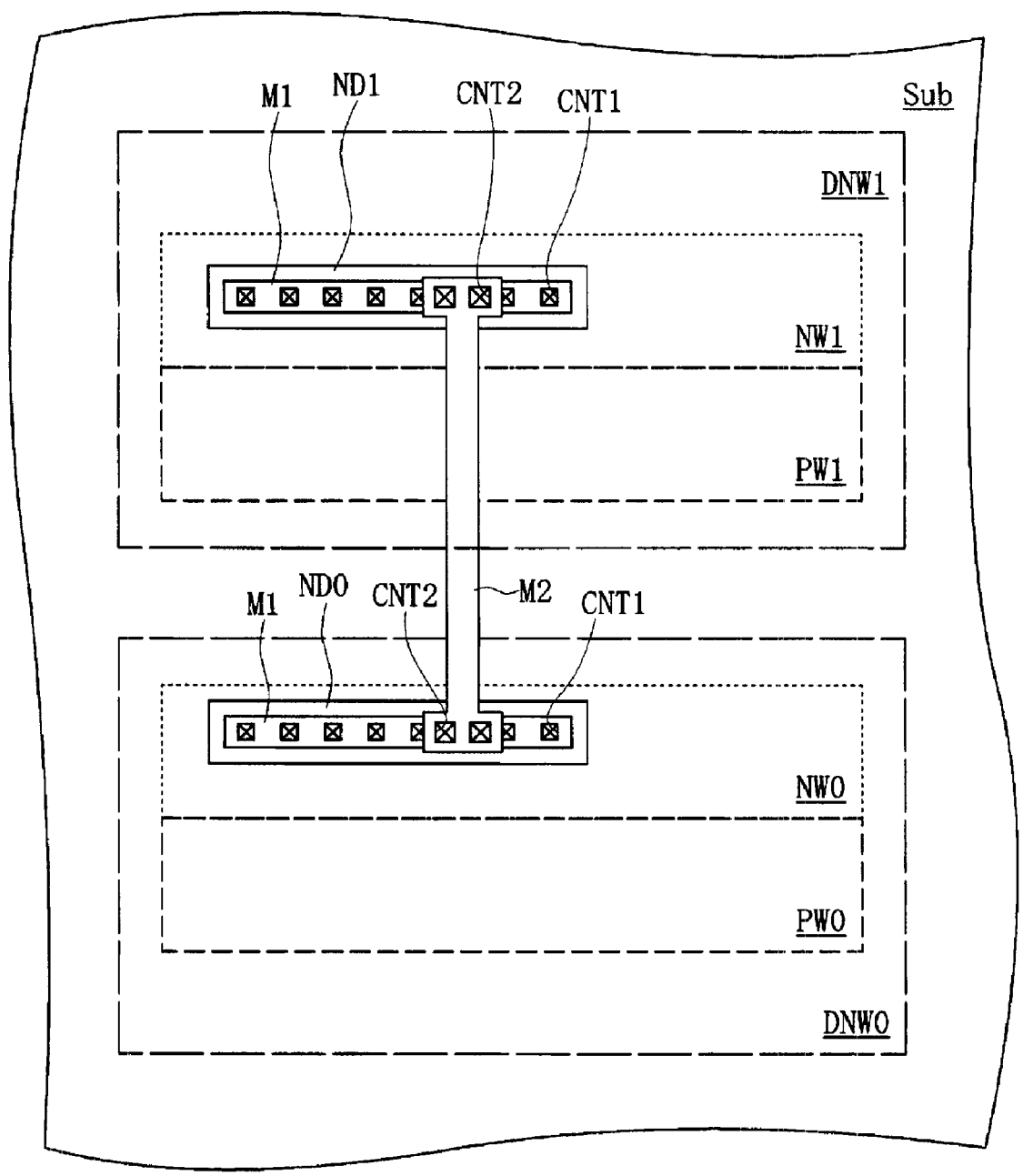
FIG. 16 is a principal-portion plan view of the third circuit illustrating the third method shown in FIG. 14 mentioned above.

In the present third embodiment, a description will be given of a third method for preventing a dielectric breakdown in the gate insulating film of a MIS in the foregoing third circuit (FIGS. 4(a) and 4(b) mentioned above) with reference to FIGS. 14 to 16. FIG. 14 is a circuit diagram illustrating the third method for preventing a dielectric breakdown in the gate insulating film of a MIS according to the present third embodiment. FIG. 15 is a principal-portion cross-sectional view of the third circuit illustrating the third method shown in FIG. 14 mentioned above. FIG. 16 is a principal-portion plan view of the third circuit illustrating the third method shown in FIG. 14 mentioned above.

As described above, the third circuit (FIGS. 4(a) and 4(b) mentioned above) includes the inverter circuit INV0 formed in the deep n-type well DNW0, and the inverter circuit INV1 formed in the deep n-type well DNW1. The respective gate electrodes of the pMIS 300p and the nMIS 300n which form the inverter circuit INV1 are electrically coupled to the respective drain electrodes of the pMIS 200p and the nMIS 200n which form the inverter circuit INV0. In the gate insulating film of the pMIS 300p or the nMIS 300n forming the inverter circuit INV1, a dielectric breakdown has occurred.

As shown in FIG. 14, in the third method according to the present third embodiment, the n-type diffusion tap ND0 for potential fixation is formed in the shallow n-type well NW0 in the deep n-type well DNW0 where the pMIS 200p is formed, while an n-type diffusion tap ND1 for potential fixation is formed in the shallow n-type well NW1 in the deep n-type well DNW1. The n-type diffusion tap ND0 is further coupled to the n-type diffusion tap ND1 using an interconnection in a second or higher order layer.

The wiring of the inverter circuit INV0 formed in the deep n-type well DNW0 to the inverter circuit INV1 formed in the deep n-type well DNW1, i.e., the wiring of the respective drain electrodes of the pMIS 200p and the nMIS 200n which form the inverter circuit INV0 to the respective gate electrodes of the pMIS 300p and the nMIS 300p which form the inverter circuit INV1 is performed using an interconnection in the same layer as that of the interconnection used to wire the n-type diffusion tap ND0 to the n-type diffusion tap ND1, or an interconnection in a layer higher in order than that. For example, in the case where the wiring of the n-type diffusion tap ND0 to the n-type diffusion tap ND1 is performed using the interconnection in the second layer, the wiring of the inverter circuit INV0 formed in the deep n-type diffusion well DNW0 to the inverter circuit INV1 formed in the deep n-type well DNW1 is performed using an interconnection in a second or higher order layer. In the case where the wiring of the n-type diffusion tap ND0 to the n-type diffusion tap ND1 is performed using the interconnection in the third layer, the wiring of the inverter circuit INV0 formed in the deep n-type well DNW0 to the inverter circuit INV1 formed in the deep n-type well DNW1 is performed using an interconnection in a third or higher order layer.

As shown in FIG. 15, in the third circuit (circuit in which wiring is provided between the respective drain electrodes of the pMIS 200$p$ and the nMIS 200$n$ which form the inverter circuit INV0 and the respective gate electrodes of the pMIS 300$p$ and the nMIS 300$n$ which form the inverter circuit INV1), the wiring of the n-type diffusion tap ND0 to the n-type diffusion tap ND1 forms a discharge path (or a discharge path in a direction reverse to that of the discharge path) extending from the deep n-type well DNW1 to the deep n-type well DNW0 via the shallow n-type well NW1, the n-type diffusion tap ND1, the interconnection, the n-type diffusion tap ND0, and the shallow n-type well NW0. As a result, the deep n-type well DNW0 and the deep n-type well DNW1 which are formed in mutually different regions are at the same potential.

The formation of the discharge path mentioned above allows discharge of the charge accumulated in the deep n-type well DNW1, the shallow n-type well NW1, and the shallow p-type well PW1 in a manufacturing step using plasma discharge such as, e.g., a dry etching step to another well region such as, e.g., the deep n-type well DNW0. As a result, the potential difference between the deep n-type well DNW1 and the deep n-type well DNW0 is reduced. Therefore, it is possible to prevent a dielectric breakdown in each of the gate insulating films of the pMIS 300$p$ and the nMIS 300$n$ which are respectively formed in the shallow n-type well NW1 and the shallow p-type well PW1 in the deep n-type well DNW1.

FIG. 16 shows a principal-portion plan view of the n-type diffusion tap ND0 formed in the deep n-type well DNW0 and the n-type diffusion tap ND1 formed in the deep n-type well DNW1.

In the shallow n-type well NW0 in the deep n-type well DNW0, the n-type diffusion tap ND0 is formed, while in the interlayer insulating film (not shown) formed over the substrate Sub (the deep n-type well DNW0), the coupling holes CNT1 are formed to reach the n-type diffusion tap ND0. Likewise, in the shallow n-type well NW1 in the deep n-type well DNW1, the n-type diffusion tap ND1 is formed, while in the interlayer insulating film (not shown) formed over the substrate Sub (the deep n-type well DNW1), the coupling holes CNT1 are formed to reach the n-type diffusion tap ND1. There is also formed the interconnection M1 in the first layer which is electrically coupled to the n-type diffusion taps ND0 and ND1 through the coupling holes CNT1.

Further, in the interlayer insulating film (not shown) formed over the substrate Sub to cover the interconnection M1 in the first layer, there are formed the coupling holes CNT2 reaching the interconnection M1 in the first layer which is electrically coupled to the n-type diffusion tap ND1 formed in the shallow n-type well NW1 in the deep n-type well DNW1, and the coupling holes CNT2 reaching the interconnection M1 in the first layer which is electrically coupled to the n-type diffusion tap ND0 formed in the shallow n-type well NW0 in the deep n-type well DNW0. The n-type diffusion tap ND1 formed in the shallow n-type well NW1 in the deep n-type well DNW1 is electrically coupled to the n-type diffusion tap ND0 formed in the shallow n-type well NW0 in the deep n-type well DNW0 using the interconnection M2 in the second layer.

In the present third embodiment, it is assumed that the n-type diffusion taps ND0 and ND1 are wired using an interconnection in a second or higher order layer. However, in the case where layout using the interconnection in the first layer is possible, the interconnection in the first layer can also be used to wire the n-type diffusion taps ND0 and ND1.

Thus, according to the present third embodiment, even when charge is accumulated in the deep n-type well DNW1, the shallow n-type well NW1, and the shallow p-type well PW1, the charge can be discharged to another well region such as the deep n-type well DNW0 only on the assumption that the potential of the deep n-type well DNW1 is the same as the potential of the deep n-type well DNW0. This allows a reduction in the potential difference between the deep n-type well DNW1 and the deep n-type well DNW0. Therefore, it is possible to prevent a dielectric breakdown in each of the gate insulating films of the pMIS 300$p$ and the nMIS 300$n$ which are each formed in the deep n-type well DNW1 to form the inverter circuit INV1. In particular, when, e.g., the shallow p-type well PW0 formed in the deep n-type well DNW0 is at a minus potential relative to the ground potential, i.e., when the power supply of the shallow n-type well NW1 formed in the deep n-type well DNW1 is the same as the power supply of the shallow n-type well NW0 formed in the deep n-type well DNW0, and the power supply of the shallow p-type well PW1 formed in the deep n-type well DNW1 is different from the power supply of the shallow p-type well PW0 formed in the deep n-type well DNW0, the third method in the present third embodiment serves as an effective means.

Embodiment 4

Figure 17:
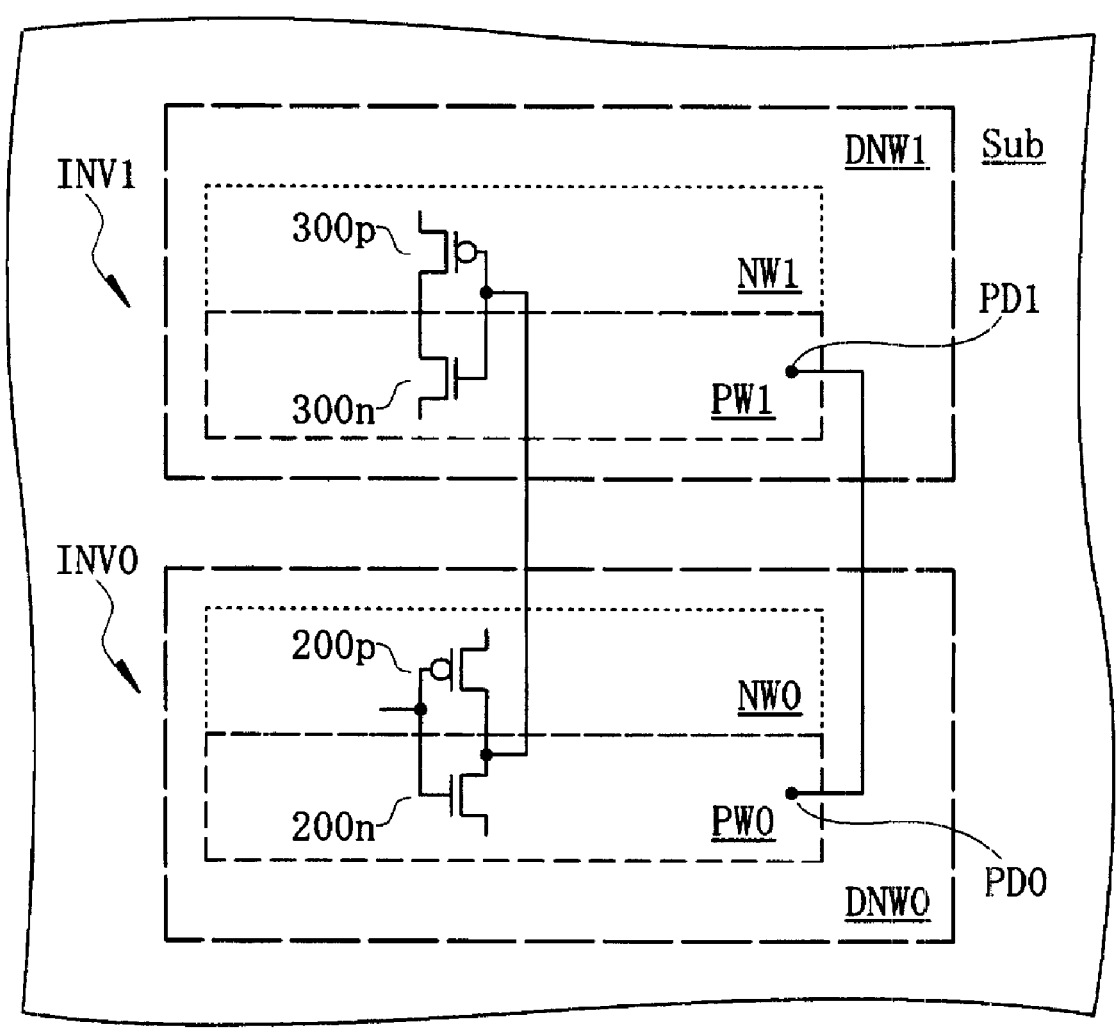
FIG. 17 is a circuit diagram illustrating a first example of a fourth method for preventing a dielectric breakdown in the gate insulating film of a MIS according to a fourth embodiment.
Figure 18:
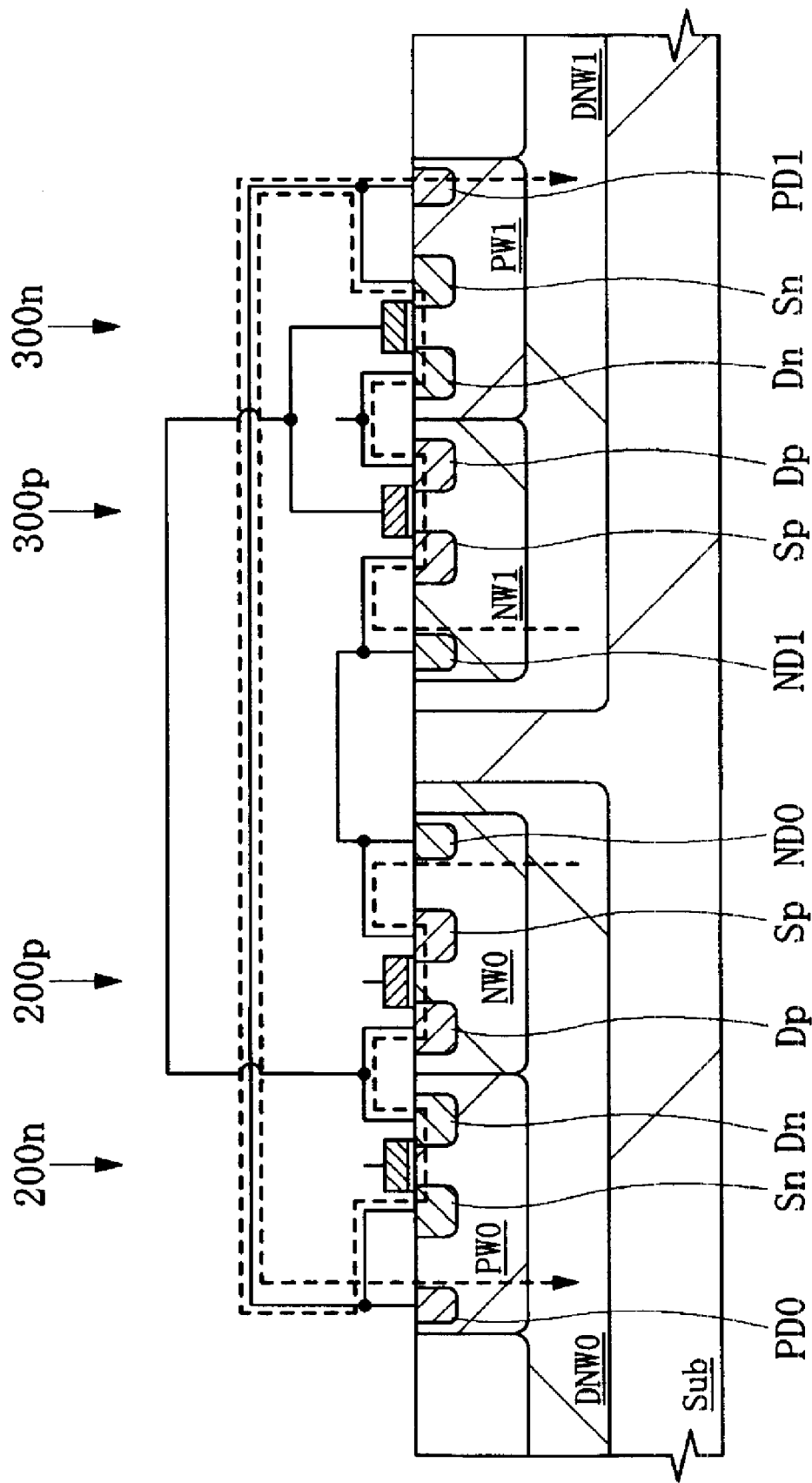
FIG. 18 is a principal-portion cross-sectional view of a third circuit illustrating the first example of the fourth method shown in FIG. 17 mentioned above.
Figure 19:
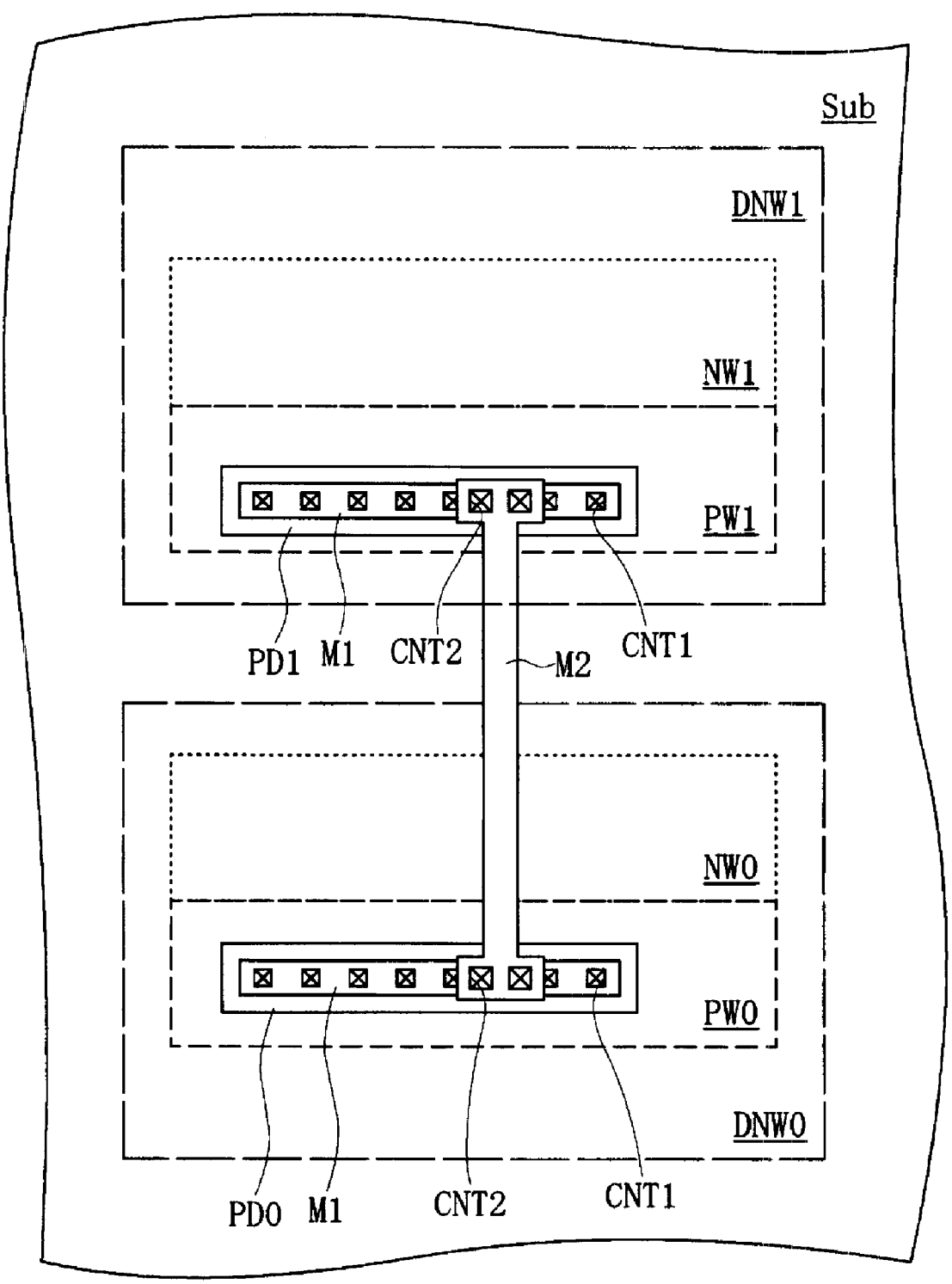
FIG. 19 is a principal-portion plan view of the third circuit illustrating the first example of the fourth method shown in FIG. 17 mentioned above.
Figure 20:
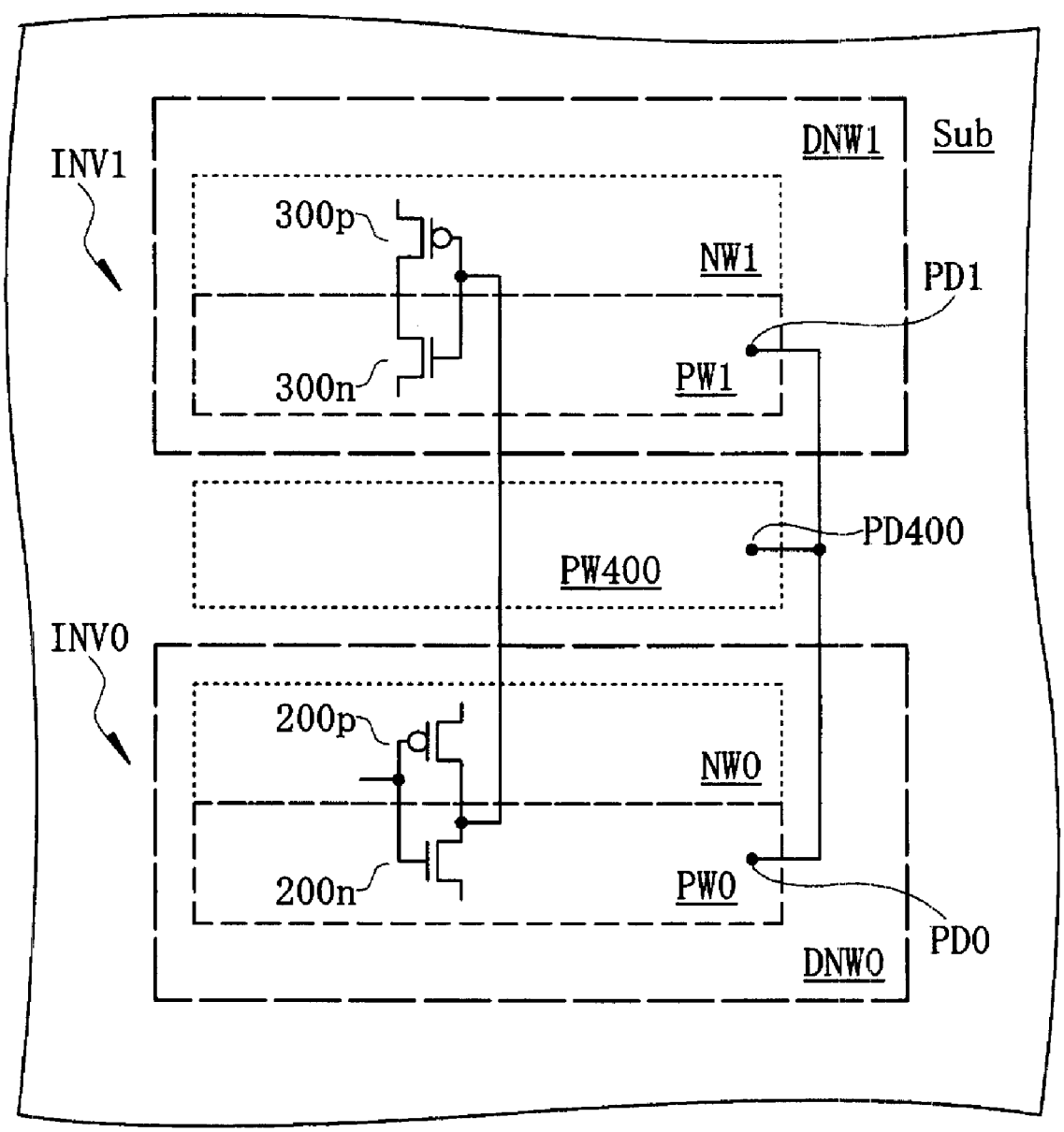
FIG. 20 is a circuit diagram illustrating a second example of the fourth method for preventing a dielectric breakdown in the gate insulating film of a MIS according to the fourth embodiment.
Figure 21:
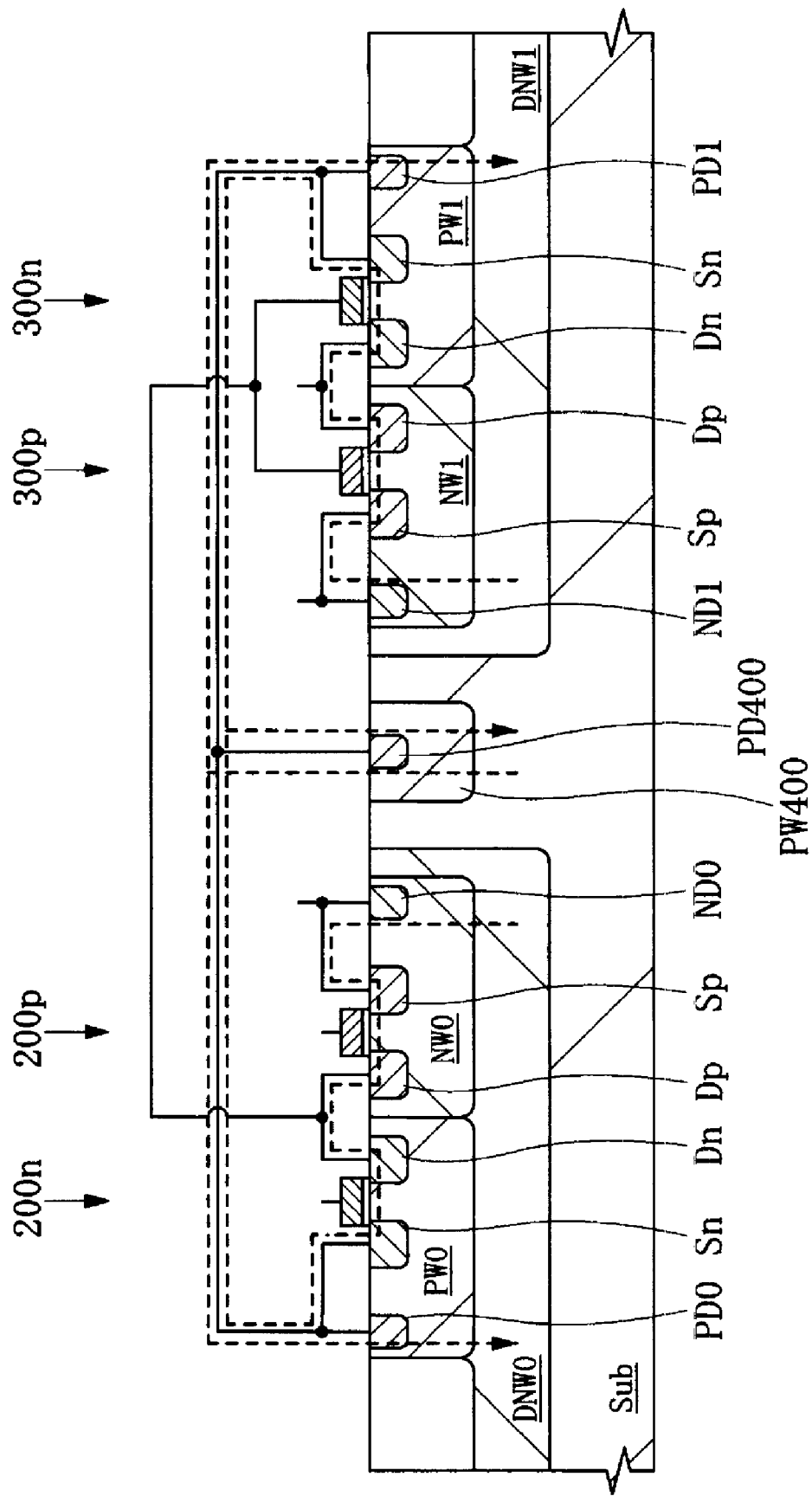
FIG. 21 is a principal-portion cross-sectional view of the third circuit illustrating the second example of the fourth method shown in FIG. 20 mentioned above.
Figure 22:
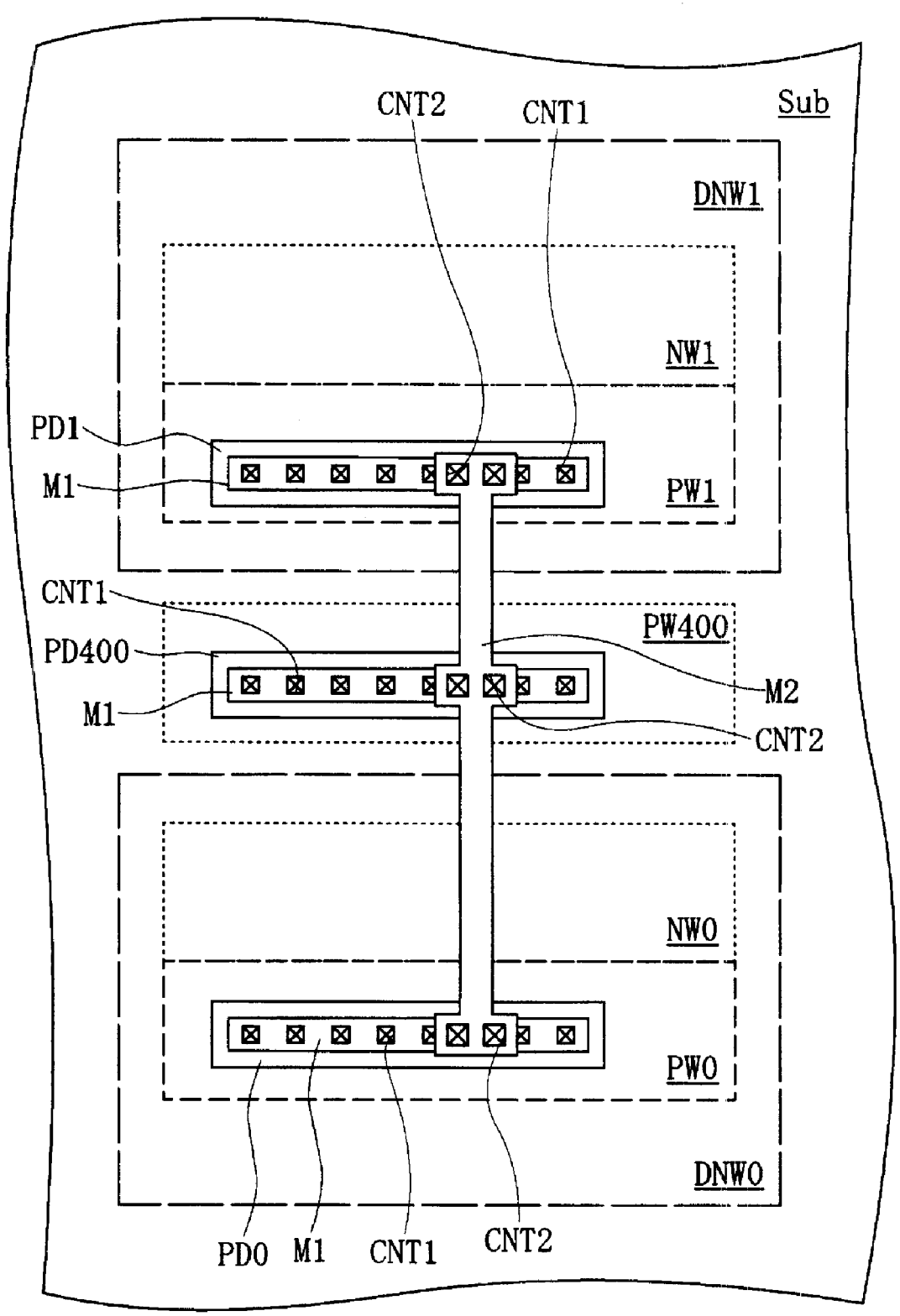
FIG. 22 is a principal-portion plan view of the third circuit illustrating the second example of the fourth method shown in FIG. 20 mentioned above.

In the present fourth embodiment, a description will be given of two examples (first and second examples) of a fourth method for preventing a dielectric breakdown in the gate insulating film of a MIS in the foregoing third circuit (FIGS. 4($a$) and 4($b$) mentioned above). First, the first example of the fourth method will be described with reference to FIGS. 17 to 19, and then the second example of the fourth method will be described with reference to FIGS. 20 to 22. FIG. 17 is a circuit diagram illustrating the first example of the fourth method for preventing a dielectric breakdown in the gate insulating film of a MIS according to the present fourth embodiment. FIG. 18 is a principal-portion cross-sectional view of the third circuit illustrating the first example of the fourth method shown in FIG. 17 mentioned above. FIG. 19 is a principal-portion plan view of the third circuit illustrating the first example of the fourth method shown in FIG. 17 mentioned above. FIG. 20 is a circuit diagram illustrating the second example of the fourth method for preventing a dielectric breakdown in the gate insulating film of a MIS according to the present fourth embodiment. FIG. 21 is a principal-portion cross-sectional view of the third circuit illustrating the second example of the fourth method shown in FIG. 20 mentioned above. FIG. 22 is a principal-portion plan view of the third circuit illustrating the second example of the fourth method shown in FIG. 20 mentioned above.

First, the first example of the fourth method will be described.

As described above, the third circuit (FIGS. 4($a$) and 4($b$) mentioned above) includes the inverter circuit INV0 formed in the deep n-type well DNW0, and the inverter circuit INV1 formed in the deep n-type well DNW1. The respective gate electrodes of the pMIS 300$p$ and the nMIS 300$n$ which form the inverter circuit INV1 are electrically coupled to the respective drain electrodes of the pMIS 200p and the nMIS 200n which form the inverter circuit INV0. In the gate insulating film of the pMIS 300p or the nMIS 300n forming the inverter circuit INV1, a dielectric breakdown has occurred.

As shown in FIG. 17, in the first example of the fourth method according to the present fourth embodiment, the p-type diffusion tap PD0 for potential fixation is formed in the shallow p-type well PW0 in the deep n-type well DNW0, while in the shallow p-type well PW1 in the deep n-type well DNW1, a p-type diffusion tap PD1 for potential fixation is formed. The p-type diffusion tap PD0 is coupled to the p-type diffusion tap PD1 using an interconnection in a second or higher order layer.

The wiring of the inverter circuit INV0 formed in the deep n-type well DNW0 to the inverter circuit INV1 formed in the deep n-type well DNW1, i.e., the wiring of the respective drain electrodes of the pMIS 200p and the nMIS 200n which form the inverter circuit INV0 to the respective gate electrodes of the pMIS 300p and the nMIS 300p which form the inverter circuit INV1 is performed using an interconnection in the same layer as that of the interconnection used to wire the p-type diffusion tap PD0 to the p-type diffusion tap PD1, or an interconnection in a layer higher in order than that. For example, in the case where the wiring of the p-type diffusion tap PD0 to the p-type diffusion tap PD1 is performed using the interconnection in the second layer, the wiring of the inverter circuit INV0 formed in the deep n-type well DNW0 to the inverter circuit INV1 formed in the deep n-type well DNW1 is performed using an interconnection in a second or higher order layer. In the case where the wiring of the p-type diffusion tap PD0 to the p-type diffusion tap PD1 is performed using the interconnection in the third layer, the wiring of the inverter circuit INV0 formed in the deep n-type well DNW0 to the inverter circuit INV1 formed in the deep n-type well DNW1 is performed using an interconnection in a third or higher order layer.

As shown in FIG. 18, in the third circuit (circuit in which wiring is provided between the respective gate electrodes of the pMIS 300p and the nMIS 300n which form the inverter circuit INV1 and the respective drain electrodes of the pMIS 200p and the nMIS 200n which form the inverter circuit INV0), a parasitic pn diode is formed by the wiring of the p-type diffusion tap PD0 to the p-type diffusion tap PD1. Because the parasitic pn diode is formed, and the respective gate electrodes of the nMIS 300n and the pMIS 300p which are formed in the deep n-type well DNW1 are each in a floating state, the nMIS 300n and the pMIS 300p are each brought into a conducting state. As a result, a discharge path (or a discharge path in a direction reverse to that of the discharge path) is formed which extends from the deep n-type well DNW1 to the deep n-type well DNW0 via the shallow n-type well NW1, the shallow n-type diffusion tap ND1, the pMIS 300p (the source electrode Sp thereof, the channel region thereof, and the drain electrode Dp thereof), the nMIS 300n (the drain electrode Dn thereof, the channel region thereof, and the source electrode Sn thereof), the interconnection, the p-type diffusion tap PD0, and the shallow p-type well PW0.

The formation of the discharge path mentioned above allows discharge of the charge accumulated in the deep n-type well DNW1, the shallow n-type well NW1, and the shallow p-type well PW1 in a manufacturing step using plasma discharge such as, e.g., a dry etching step to another well region such as, e.g., the deep n-type well DNW0. As a result, the potential difference between the deep n-type well DNW1 and the deep n-type well DNW0 is reduced. Therefore, it is possible to prevent a dielectric breakdown in each of the gate insulating films of the pMIS 300p and the nMIS 300n which are respectively formed in the shallow n-type well NW1 and the shallow p-type well PW1 in the deep n-type well DNW1.

FIG. 19 shows a principal-portion plan view of the p-type diffusion tap PD0 formed in the deep n-type well DNW0 and the p-type diffusion tap PD1 formed in the deep n-type well DNW1.

In the shallow p-type well PW0 in the deep n-type well DNW0, the p-type diffusion tap PD0 is formed, while in the interlayer insulating film (not shown) formed over the substrate Sub (the deep n-type well DNW0), the coupling holes CNT1 are formed to reach the p-type diffusion tap PD0. Likewise, in the shallow p-type well PW1 in the deep n-type well DNW1, the p-type diffusion tap PD1 is formed, while in the interlayer insulating film (not shown) formed over the substrate Sub (the deep n-type well DNW1), the coupling holes CNT1 are formed to reach the p-type diffusion tap PD1. There is also formed the interconnection M1 in the first layer which is electrically coupled to the p-type diffusion taps PD0 and PD1 through the coupling holes CNT1.

Further, in the interlayer insulating film (not shown) formed over the substrate Sub to cover the interconnection M1 in the first layer, there are formed the coupling holes CNT2 reaching the interconnection M1 in the first layer which is electrically coupled to the p-type diffusion tap PD1 formed in the shallow p-type well. PW1 in the deep n-type well DNW1, and the coupling holes CNT2 reaching the interconnection M1 in the first layer which is electrically coupled to the p-type diffusion tap PD0 formed in the shallow p-type well PW0 in the deep n-type well DNW0. The p-type diffusion tap PD1 formed in the shallow p-type well PW1 in the deep n-type well DNW1 is electrically coupled to the p-type diffusion tap PD0 formed in the shallow p-type well PW0 in the deep n-type well DNW0 using the interconnection M2 in the second layer.

Next, the second example of the fourth method will be described.

Figure 4B:
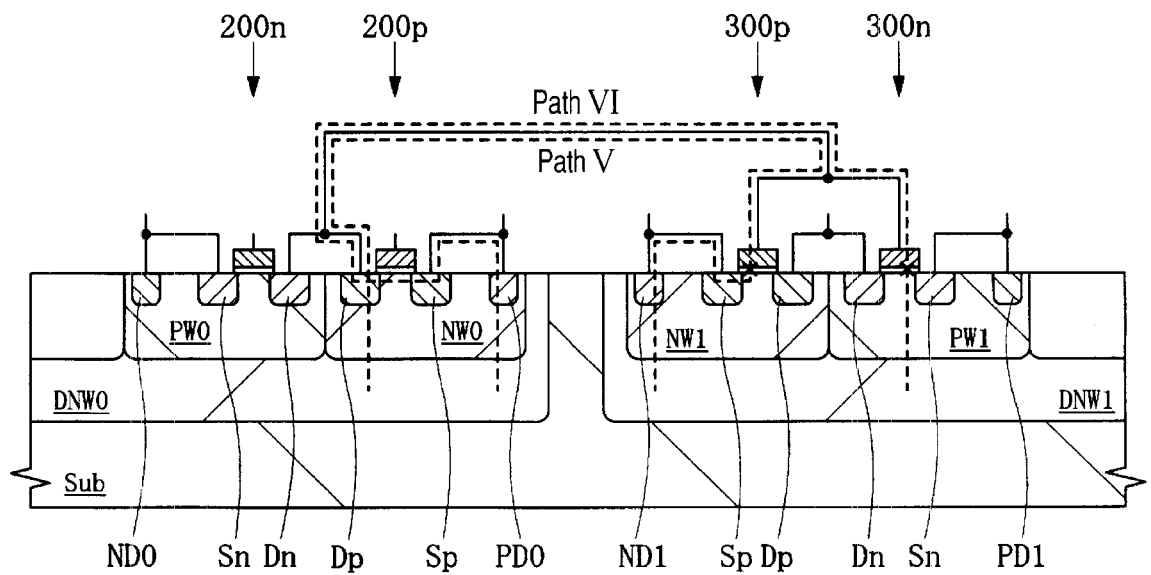
FIG. 4(b) is a principal-portion cross-sectional view of circuit elements for illustrating a dielectric breakdown model.

In the second example of the fourth method also, a description is given of the method for preventing a dielectric breakdown in the gate insulating film of the pMIS 300p or the nMIS 300n forming the inverter circuit INV1, which occurs in the third circuit (FIGS. 4(a) and 4(b) mentioned above). The first and second examples of the fourth method are different in that, in the first example, the p-type diffusion tap PD0 formed in the shallow p-type well PW0 in the deep n-type well DNW0 is electrically coupled to the p-type diffusion tap PD1 formed in the shallow p-type well PW1 in the deep n-type well DNW1, while in the second example, a shallow p-type well is further formed in the substrate Sub, and a p-type diffusion tap for potential fixation which is formed in the shallow p-type well is electrically coupled to the p-type diffusion taps PD0 and PD1 mentioned above.

As shown in FIG. 20, in the second example of the fourth method according to the present fourth embodiment, a p-type diffusion tap PD400 for potential fixation is formed in a shallow p-type well PW400 which is formed in the substrate Sub, and the p-type diffusion tap 400 is further coupled to the p-type diffusion tap PD0 for potential fixation which is formed in the shallow p-type well PW0 in the deep n-type well DNW0 and to the p-type diffusion tap PD1 for potential fixation which is formed in the shallow p-type well PW1 in the deep n-type well DNW1 using an interconnection in a second or higher order layer.

The wiring of the inverter circuit INV0 formed in the deep n-type well DNW0 to the inverter circuit INV1 formed in the deep n-type well DNW1, i.e., the wiring of the respective drain electrodes of the pMIS 200*p* and the nMIS 200*n* which form the inverter circuit INV0 to the respective gate electrodes of the pMIS 300*p* and the nMIS 300*n* which form the inverter circuit INV1 is performed using the interconnection in the same layer as that of the interconnection used to wire the p-type diffusion tap PD0 to the p-type diffusion tap PD1, or an interconnection in a layer higher in order than that. For example, in the case where the wiring of the p-type diffusion tap PD0 to the p-type diffusion tap PD1 is performed using the interconnection in the second layer, the wiring of the inverter circuit INV0 formed in the deep n-type well DNW0 to the inverter circuit INV1 formed in the deep n-type well DNW1 is performed using an interconnection in a second or higher order layer. In the case where the wiring of the p-type diffusion tap PD0 to the p-type diffusion tap PD1 is performed using the interconnection in the third layer, the wiring of the inverter circuit INV0 formed in the deep n-type well DNW0 to the inverter circuit INV1 formed in the deep n-type well DNW1 is performed using an interconnection in a third or higher order layer.

As shown in FIG. 21, in the third circuit (circuit in which wiring is provided between the respective gate electrodes of the pMIS 300*p* and the nMIS 300*n* forming the inverter circuit INV1 and the respective drain electrodes of the pMIS 200*p* and the nMIS 200*n* forming the inverter circuit INV0), the respective gate electrodes of the nMIS 300*n* and the pMIS 300*p* which are respectively formed in the shallow p-type well PW1 and the shallow n-type well NW1 in the deep n-type well DNW1 are each in a floating state so that the nMIS 300*n* and the pMIS 300*p* are each brought into a conducting state. As a result, a discharge path is formed which extends from the deep n-type well DNW1 to the substrate Sub via the shallow n-type well NW1, the n-type diffusion tap ND1, the pMIS 300a*p* (the source electrode Sp thereof, the channel region thereof, and the drain electrode Dp thereof), the nMIS 300*n* (the drain electrode Dn thereof, the channel region thereof, and the source electrode Sn thereof), the interconnection, the p-type diffusion tap PD400, and the shallow p-type well PW400. Likewise, the respective gate electrodes of the nMIS 200*n* and the pMIS 200*p* which are respectively formed in the shallow p-type well PW0 and the shallow n-type well NW0 in the deep n-type well DNW0 are each in a floating state so that the nMIS 200*n* and the pMIS 200*p* are each brought into a conducting state. As a result, a discharge path is formed which extends from the deep n-type well DNW0 to the substrate Sub via the shallow n-type well NW0, the n-type diffusion tap ND0, the pMIS 200*p* (the source electrode Sp thereof, the channel region thereof, and the drain electrode Dp thereof), the nMIS 200*n* (the drain electrode Dn thereof, the channel region thereof, and the source electrode Sn thereof), the interconnection, the p-type diffusion tap PD400, and the shallow p-type well PW400.

In addition, a discharge path is formed which extends from the substrate Sub to the deep n-type well DNW1 via the shallow p-type well PW400, the p-type diffusion tap PD400, the interconnection, the p-type diffusion tap PD1, and the shallow p-type well PW1. Likewise, a discharge path is formed which extends from the substrate Sub to the deep n-type well DNW0 via the shallow p-type well PW400, the p-type diffusion tap PD400, the interconnection, the p-type diffusion tap PD0, and the shallow p-type well PW0.

The formation of the discharge paths mentioned above allows discharge of the charge accumulated in the deep n-type well DNW1, the shallow n-type well NW1, and the shallow p-type well PW1 or the change accumulated in the deep n-type well DNW0, the shallow n-type well NW0, and the shallow p-type well PW0 in a manufacturing step using plasma discharge such as, e.g., a dry etching step to the substrate Sub. As a result, the potential difference between the deep n-type well DNW1 and the deep n-type well DNW0 is reduced. Therefore, it is possible to prevent a dielectric breakdown in each of the gate insulating films of the pMIS 300*p* and the gate insulating film of the nMIS 300*n* which are respectively formed in the shallow n-type well NW1 and the shallow p-type well PW1 in the deep n-type well DNW1.

FIG. 22 shows a principal-portion plan view of the p-type diffusion tap PD0 formed in the deep n-type well DNW0, the p-type diffusion tap PD1 formed in the deep n-type well DNW1, and the p-type diffusion tap PD400 formed in the substrate Sub.

In addition to the p-type diffusion tap PD1 formed in the shallow p-type well PW1 in the deep n-type well DNW1 and the p-type diffusion tap PD0 formed in the shallow n-type well NW0 in the deep n-type well DNW0 which are shown in FIG. 19 mentioned above, the p-type diffusion tap PD400 is formed in the shallow p-type well PW400 formed in the substrate Sub, similarly to the p-type diffusion taps PD0 and PD1. In the interlayer insulating film (not shown) formed over the substrate Sub, the coupling holes CNT1 are formed to respectively reach the p-type diffusion tap PD1 formed in the shallow p-type well PW1 in the deep n-type well DNW1, the p-type diffusion tap PD0 formed in the shallow n-type well NW0 in the deep n-type well DNW0, and the p-type diffusion tap PD400 formed in the shallow p-type well PW400 in the substrate Sub. There is also formed the interconnection M1 in the first layer which is electrically coupled to the p-type diffusion tap PD1 formed in the shallow p-type well PW1 in the deep n-type well DNW1, the p-type diffusion tap PD0 formed in the shallow n-type well NW0 in the deep n-type well DNW0, and the p-type diffusion tap PD400 formed in the shallow p-type well PW400 in the substrate Sub through the coupling holes CNT1.

Further, in the interlayer insulating film (not shown) formed over the substrate Sub to cover the interconnection M1 in the first layer, the coupling holes CNT2 are formed to reach the interconnection M1 in the first layer which is electrically coupled to the p-type diffusion tap PD1 formed in the shallow p-type well PW1 in the deep n-type well DNW1, to the p-type diffusion tap PD0 formed in the shallow n-type well NW0 in the deep n-type well DNW0, and to the p-type diffusion tap PD400 formed in the shallow p-type well PW400 in the substrate Sub. Through the coupling holes CNT2, the p-type diffusion tap PD1 formed in the shallow p-type well PW1 in the deep n-type well DNW1, the p-type diffusion tap PD0 formed in the shallow n-type well NW0 in the deep n-type well DNW0, and the p-type diffusion tap PD400 formed in the shallow p-type well PW400 in the substrate Sub are electrically coupled using the interconnection M2 in the second layer.

In the present fourth embodiment, it is assumed that the wiring of the p-type diffusion taps PD0 and PD1 in the first example and the wiring of the p-type diffusion taps PD0, PD1, and PD400 in the second example are performed using an interconnection in a second or higher order layer. However, in the case where layout using the interconnection in the first layer is possible, the interconnection in the first layer can also be used for the wiring.

Thus, according to the present fourth embodiment, even when charge is accumulated in the deep n-type well DNW0, the shallow n-type well NW0, and the shallow p-type well PW0, or in the deep n-type well DNW1, the shallow n-type well NW1, and the shallow p-type well PW1 due to a plasma charge-up phenomenon in, e.g., a dry etching step, the charge can be easily discharged to the substrate Sub to allow a reduction in the potential difference between the deep n-type well DNW1 and the deep n-type well DNW0. As a result, it is possible to prevent a dielectric breakdown in each of the gate insulating films of the pMIS 300p and the nMIS300n each formed the deep n-type well DNW1 to form the inverter circuit INV1. In particular, when the shallow p-type well PW0 formed in the deep n-type well NDW0 and the shallow p-type well PW1 formed in the deep n-type well DNW1 are at the same ground potential, i.e., when the power supply of the shallow n-type well NW0 formed in the deep n-type well DNW0 is different from the power supply of the shallow n-type well NW1 formed in the deep n-type well DNW1, the fourth method in the present fourth embodiment serves as an effective means.

Embodiment 5

Figure 23:
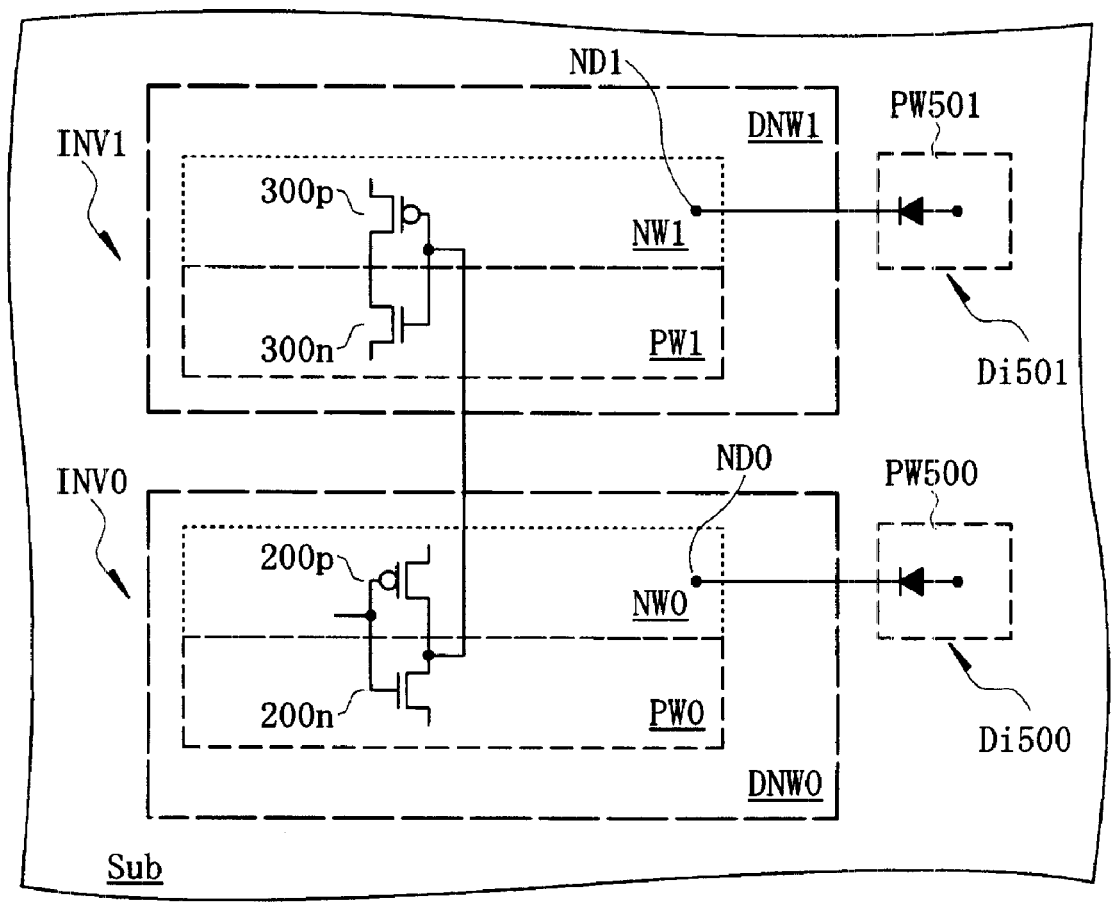
FIG. 23 is a circuit diagram illustrating a fifth method for preventing a dielectric breakdown in the gate insulating film of a MIS according to a fifth embodiment.
Figure 24:
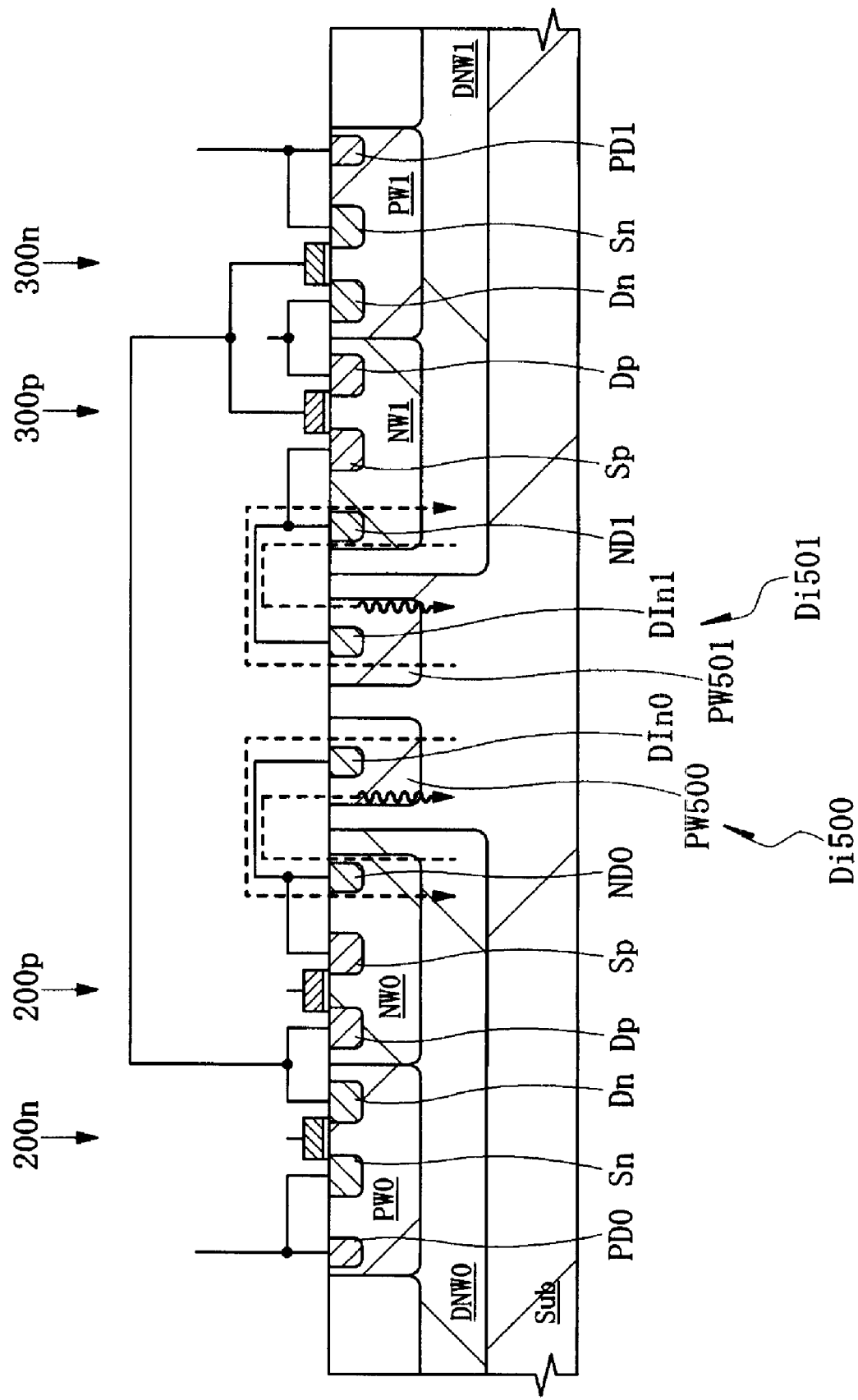
FIG. 24 is a principal-portion cross-sectional view of the third circuit illustrating the fifth method shown in FIG. 23 mentioned above.
Figure 25:
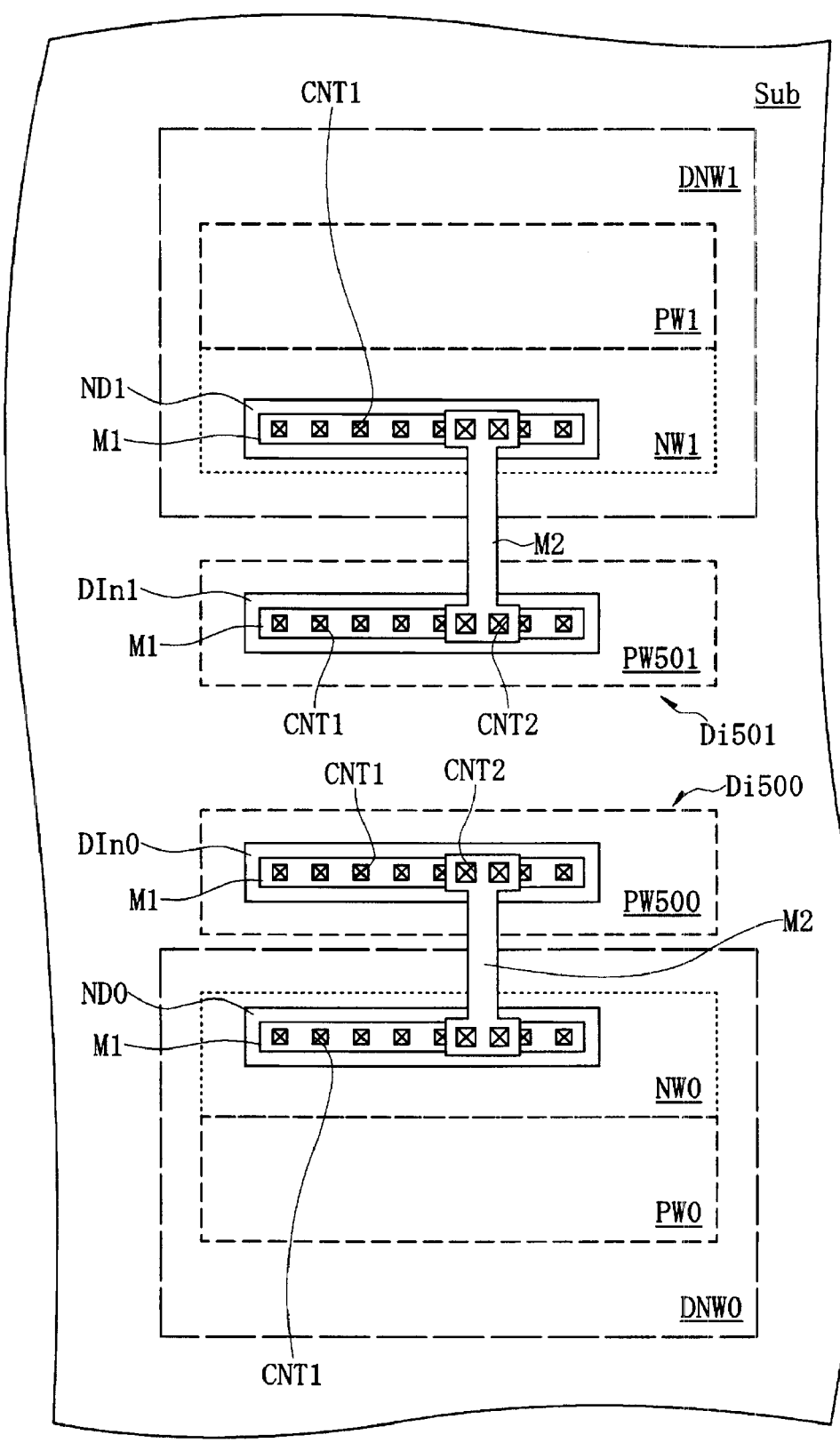
FIG. 25 is a principal-portion plan view of the third circuit illustrating the fifth method shown in FIG. 23 mentioned above.

In the present fifth embodiment, a description will be given of a fifth method for preventing a dielectric breakdown in the gate insulating film of a MIS in the foregoing third circuit (FIGS. 4(a) and 4(b) mentioned above) with reference to FIGS. 23 to 25. FIG. 23 is a circuit diagram illustrating the fifth method for preventing a dielectric breakdown in the gate insulating film of a MIS according to the present fifth embodiment. FIG. 24 is a principal-portion cross-sectional view of the third circuit illustrating the fifth method shown in FIG. 23 mentioned above. FIG. 25 is a principal-portion plan view of the third circuit illustrating the fifth method shown in FIG. 23 mentioned above.

As described above, the third circuit (FIGS. 4(a) and 4(b) mentioned above) includes the inverter circuit INV0 formed in the deep n-type well DNW0, and the inverter circuit INV1 formed in the deep n-type well DNW1. The respective gate electrodes of the pMIS 300p and the nMIS 300n which form the inverter circuit INV1 are electrically coupled to the respective drain electrodes of the pMIS 200p and the nMIS 200n which form the inverter circuit INV0. In the gate insulating film of the pMIS 300p or the nMIS 300n forming the inverter circuit INV1, a dielectric breakdown has occurred.

As shown in FIG. 23, in the fifth method according to the present fifth embodiment, a shallow p-type well PW500 formed in the substrate Sub and an n-type diffusion layer formed in the shallow p-type well PW500 form a pn diode Di500, and the cathode of the pn diode Di500 is coupled to the n-type diffusion tap ND0 for potential fixation which is formed in the shallow n-type well NW0 in the deep n-type well DNW0 using an interconnection in a second or higher order layer. In addition, a shallow p-type well PW501 formed in the substrate Sub and an n-type diffusion layer formed in the shallow p-type well PW501 form a pn diode Di501, and the cathode of the pn diode Di501 is coupled to the n-type diffusion tap ND1 for potential fixation which is formed in the shallow n-type well NW1 in the deep n-type well DNW1 using an interconnection in a second or higher order layer.

The wiring of the inverter circuit INV0 formed in the deep n-type well DNW0 to the inverter circuit INV1 formed in the deep n-type well DNW1, i.e., the wiring of the respective drain electrodes of the pMIS 200p and the nMIS 200n which form the inverter circuit INV0 to the respective gate electrodes of the pMIS 300p and the nMIS 300p which form the inverter circuit INV1 is performed using an interconnection in the same layer as that of the interconnection used to wire the n-type diffusion layer of the pn diode Di500 to the n-type diffusion tap ND0, and the interconnection used to wire the n-type diffusion layer of the pn diode Di501 to the n-type diffusion tap ND1, or an interconnection in a layer higher in order than that. For example, in the case where the wiring of the n-type diffusion layer of the pn diode Di500 to the n-type diffusion tap ND0, and the wiring of the n-type diffusion layer of the pn diode Di501 to the n-type diffusion tap ND1 are performed using the interconnection in the second layer, the wiring of the inverter circuit INV0 formed in the deep n-type well DNW0 to the inverter circuit INV1 formed in the deep n-type well DNW1 is performed using an interconnection in a second or higher order layer. In the case where the wiring of the n-type diffusion layer of the pn diode Di500 to the n-type diffusion tap ND0, and the wiring of the n-type diffusion layer of the pn diode Di501 to the n-type diffusion tap ND1 are performed using the interconnection in the third layer, the wiring of the inverter circuit INV0 formed in the deep n-type well DNW0 to the inverter circuit INV1 formed in the deep n-type well DNW1 is performed using an interconnection in a third or higher order layer.

As shown in FIG. 24, in the third circuit (circuit in which wiring is provided between the respective drain electrodes of the pMIS 200p and the nMIS 200n which form the inverter circuit INV0 and the respective gate electrodes of the pMIS 300p and the nMIS 300n which form the inverter circuit INV1), when the potential of the substrate Sub is higher than the potential of the deep n-type well DNW0, the pn diode Di500 forms a forward discharge path extending from the substrate Sub to the deep n-type well DNW0 via the shallow p-type well PW500, an n-type diffusion layer DIn0, the interconnection, the n-type diffusion tap ND0, and the shallow n-type well NW0. When the potential of the substrate Sub is lower than the potential of the deep n-type well DNW0, the pn diode Di500 is in a reverse direction. For example, in a manufacturing step using plasma discharge such as a dry etching step, optical excitation due to light emission or thermal excitation due to heat increases a leakage current in the reverse direction to form a discharge path.

Likewise, when the potential of the substrate Sub is higher than the potential of the deep n-type well DNW1, the pn diode Di501 forms a forward discharge path extending from the substrate Sub to the deep n-type well DNW1 via the shallow p-type well PW501, an n-type diffusion layer DIn1, the interconnection, the n-type diffusion tap ND1, and the shallow n-type well NW0. When the potential of the substrate Sub is lower than the potential of the deep n-type well DNW1, the pn diode Di501 is in a reverse direction. For example, in a manufacturing step using plasma discharge such as a dry etching step, optical excitation due to light emission or thermal excitation due to heat increases a leakage current in the reverse direction to form a discharge path.

The formation of the discharge paths mentioned above allows discharge of the charge accumulated in the deep n-type well DNW0, the shallow n-type well NW0, and the shallow p-type well PW0 via the discharge path mentioned above, and likewise allows discharge of the charge accumulated in the deep n-type well DNW1, the shallow n-type well NW1, and the shallow p-type well PW1 via the discharge path mentioned above. As a result, the potential difference between the deep n-type well DNW1 and the deep n-type well DNW0 is reduced. Therefore, it is possible to prevent a dielectric breakdown in each of the gate insulating films of the pMIS 300p and the nMIS 300n which are respectively formed in the shallow n-type well NW1 and the shallow p-type well PW1 in the deep n-type well DNW1.

FIG. 25 shows a principal-portion plan view of the pn diode Di500 formed in the substrate Sub, the n-type diffusion tap ND0 formed in the shallow p-type well NW0 in the deep n-type well DNW0, the pn diode Di501 formed in the substrate Sub, and the n-type diffusion tap ND1 formed in the shallow n-type well NW1 in the deep n-type well DNW1.

The n-type diffusion layer DIn0 is formed in the shallow p-type well PW500 in the substrate Sub, while the n-type diffusion layer DIn1 is formed in the shallow p-type well PW501 in the substrate Sub. In the interlayer insulating film (not shown) formed over the substrate Sub, the coupling holes CNT1 are formed to reach the n-type diffusion layers DIn0 and DIn1. In the shallow n-type well NW0 in the deep n-type well DNW0, the n-type diffusion tap ND0 is formed, while in the shallow n-type well NW1 in the deep n-type well DNW1, the n-type diffusion tap ND1 is formed. In the interlayer insulating film (not shown) formed over the substrate Sub (the deep n-type wells DNW0 and DNW1), the coupling holes CNT1 are formed to reach the n-type diffusion taps ND0 and ND1. There is also formed the interconnection M1 in the first layer which is electrically coupled to the n-type diffusion taps ND0 and ND1 through the coupling holes CNT1.

Further, in the interlayer insulating film (not shown) formed over the substrate Sub to cover the interconnection M1 in the first layer, the coupling holes CNT2 are formed to reach the interconnection M1 in the first layer which is electrically coupled to the n-type diffusion layer DIn0 formed in the shallow p-type well PW500 in the substrate Sub or to the n-type diffusion layer DIn1 formed in the shallow p-type well PW501 in the substrate Sub. Likewise, the coupling holes CNT2 are formed to reach the interconnection M1 in the first layer which is electrically coupled to the n-type diffusion tap ND0 formed in the shallow n-type well NW0 in the deep n-type well DNW0 or to the n-type diffusion tap ND1 formed in the shallow n-type well NW1 in the deep n-type well DNW1. The n-type diffusion layer DIn0 formed in the shallow p-type well PW500 in the substrate Sub is electrically coupled to the n-type diffusion tap ND0 formed in the shallow n-type well NW0 in the deep n-type well DNW0 coupled using the interconnection M2 in the second layer. Likewise, the n-type diffusion layer DIn1 formed in the shallow p-type well PW501 in the substrate Sub is electrically coupled to the n-type diffusion tap ND1 formed in the shallow n-type well NW1 in the deep n-type well DNW1 using the interconnection M2 in the second layer.

In the present fifth embodiment, it is assumed that the wiring of the n-type diffusion tap ND0 to the cathode of the pn diode Di500, and the wiring of the n-type diffusion tap ND1 to the cathode of the pn diode Di501 are performed using an interconnection in a second or higher order layer. However, in the case where layout using the interconnection in the first layer is possible, the interconnection in the first layer can also be used for the wiring.

Thus, according to the present fifth embodiment, even when charge is accumulated in the deep n-type well DNW0, the shallow n-type well NW0, and the shallow p-type well PW0 or in the deep n-type well DNW1, the shallow n-type well NW1, and the shallow p-type well PW1, the charge can be easily discharged to the substrate Sub to allow a reduction in the potential difference between the deep n-type well DNW1 and the deep n-type well DNW0. Therefore, it is possible to prevent a dielectric breakdown in each of the gate insulating films of the pMIS 300p and the nMIS 300n which are respectively formed in the shallow n-type well NW1 and the shallow p-type well PW1 in the deep n-type well DNW1 to form the inverter circuit INV1. In particular, in the case where the semiconductor device has, e.g., an analog leased ground and a back bias in combination, the shallow p-type well PW0 formed in the deep n-type well DNW0 and the shallow p-type well PW1 formed in the deep n-type well DNW1 are provided with grounds independent of each other, and a power supply given to the shallow n-type well NW0 formed in the deep n-type well DNW0 is interrupted for leakage current prevention, i.e., in the case where the power supply of the shallow n-type well NW0 formed in the deep n-type well DNW0 is different from the power supply of the shallow n-type well NW1 formed in the deep n-type well DNW1, and the power supply of the shallow p-type well PW0 formed in the deep n-type well DNW0 is different from the power supply of the shallow p-type well PW1 formed in the deep n-type well DNW1, the fifth method in the present fifth embodiment serves as an effective means.

Embodiment 6

Figure 26:
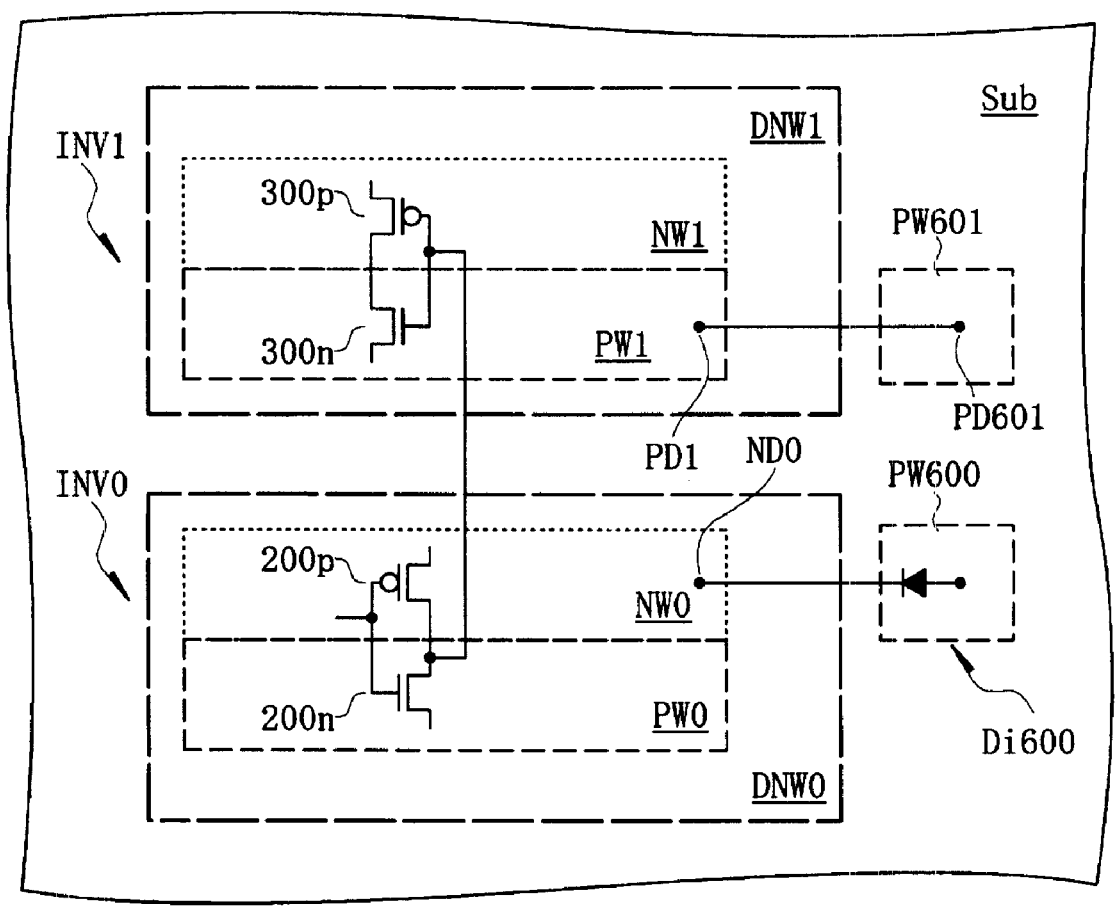
FIG. 26 is a circuit diagram illustrating a first example of a sixth method for preventing a dielectric breakdown in the gate insulating film of a MIS according to a sixth embodiment.
Figure 27:
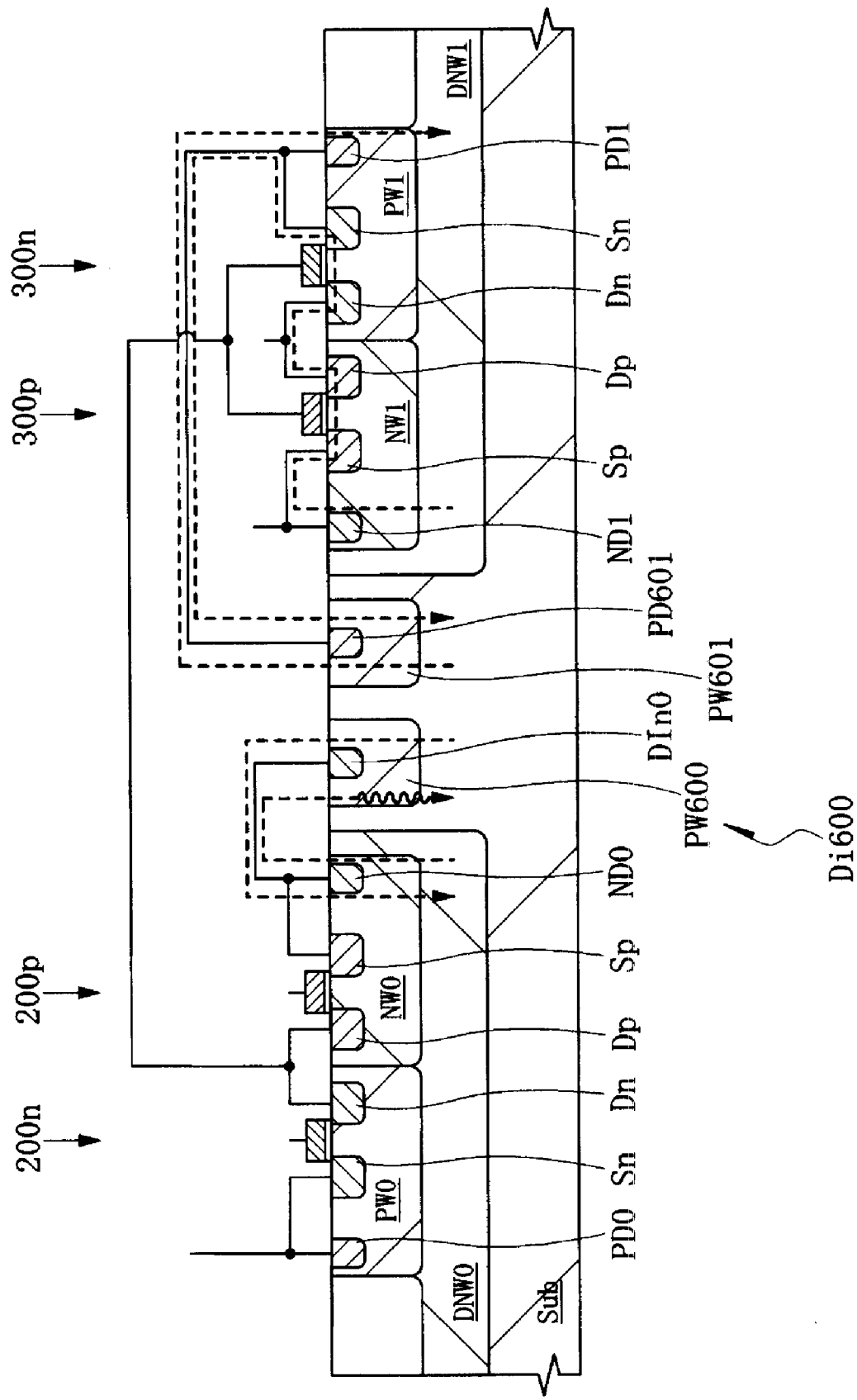
FIG. 27 is a principal-portion cross-sectional view of a third circuit illustrating the first example of the sixth method shown in FIG. 26 mentioned above.
Figure 28:
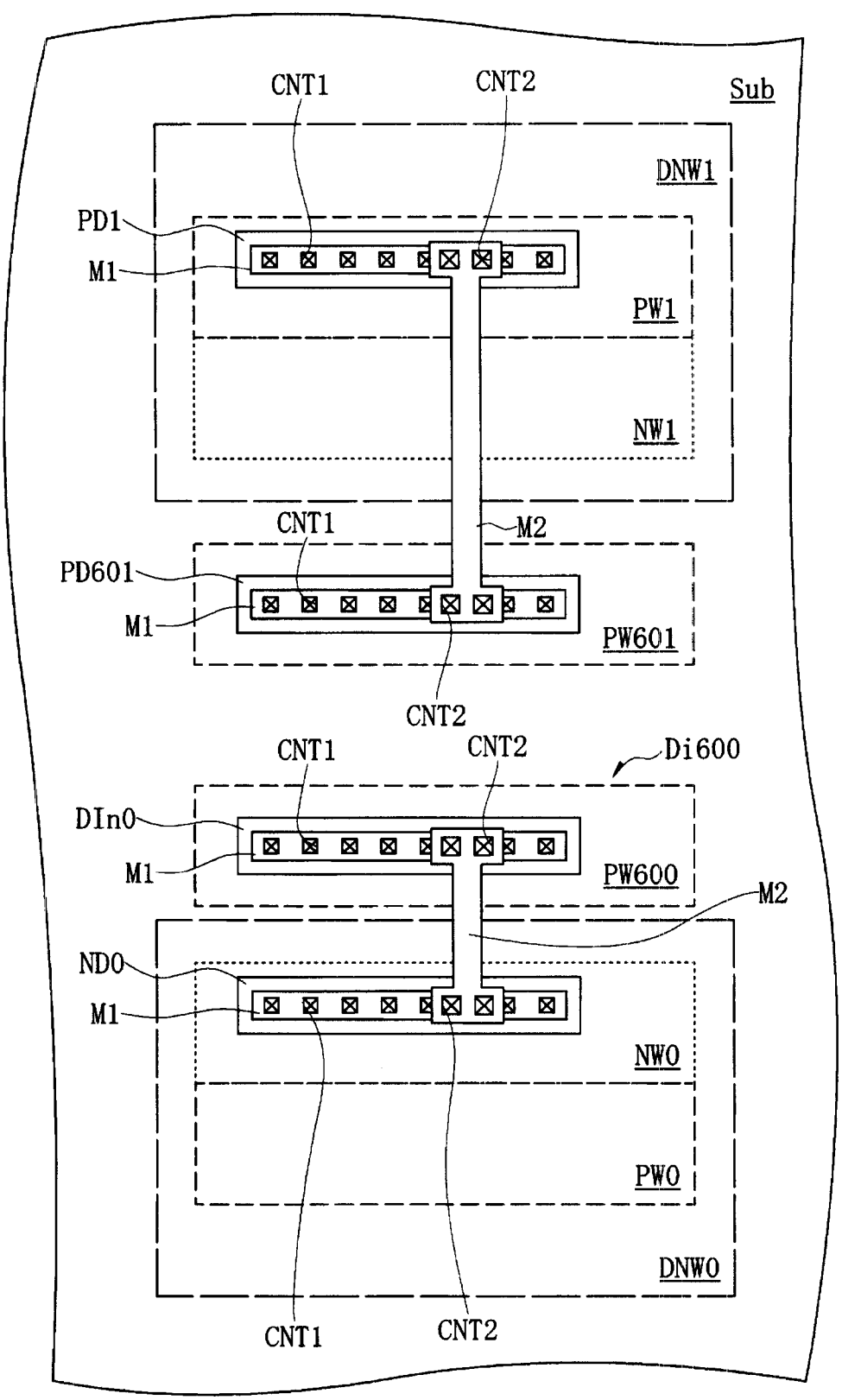
FIG. 28 is a principal-portion plan view of the third circuit illustrating the first example of the sixth method shown in FIG. 26 mentioned above.
Figure 29:
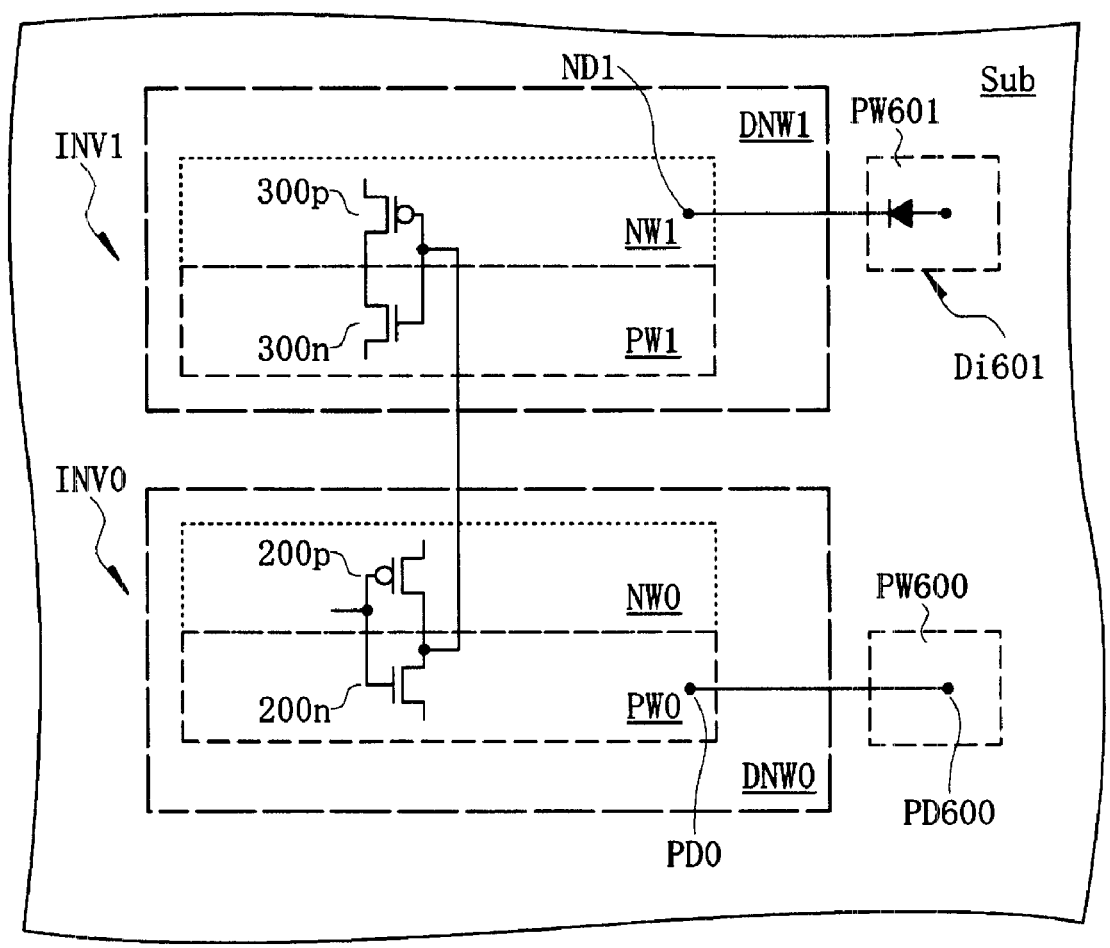
FIG. 29 is a circuit diagram illustrating a second example of the sixth method for preventing a dielectric breakdown in the gate insulating film of a MIS according to the sixth embodiment.
Figure 30:
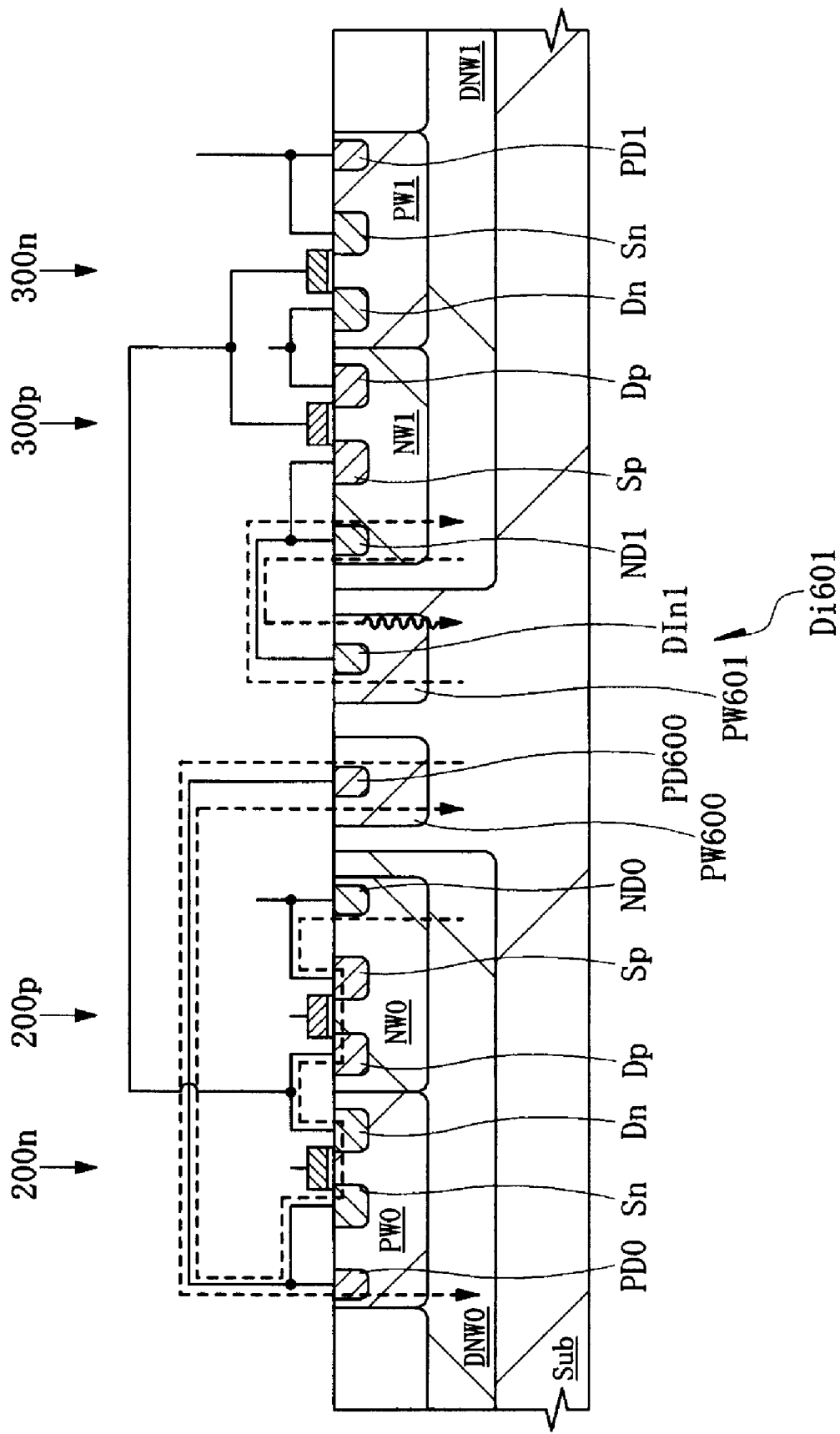
FIG. 30 is a principal-portion cross-sectional view of the third circuit illustrating the second example of the sixth method shown in FIG. 29 mentioned above.

In the present sixth embodiment, a description will be given of two examples (first and second examples) of a sixth method for preventing a dielectric breakdown in the gate insulating film of a MIS in the foregoing third circuit (FIGS. 4(a) and 4(b) mentioned above). First, the first example of the sixth method will be described with reference to FIGS. 26 to 28, and then the second example of the sixth method will be described with reference to FIGS. 29 and 30. FIG. 26 is a circuit diagram illustrating the first example of the sixth method for preventing a dielectric breakdown in the gate insulating film of a MIS according to the present sixth embodiment. FIG. 27 is a principal-portion cross-sectional view of the third circuit illustrating the first example of the sixth method shown in FIG. 26 mentioned above. FIG. 28 is a principal-portion plan view of the third circuit illustrating the first example of the sixth method shown in FIG. 26 mentioned above. FIG. 29 is a circuit diagram illustrating the second example of the sixth method for preventing a dielectric breakdown in the gate insulating film of a MIS according to the present sixth embodiment. FIG. 30 is a principal-portion cross-sectional view of the third circuit illustrating the second example of the sixth method shown in FIG. 29 mentioned above.

First, the first example of the sixth method will be described.

As described above, the third circuit (FIGS. 4(a) and 4(b) mentioned above) includes the inverter circuit INV0 formed in the deep n-type well DNW0, and the inverter circuit INV1 formed in the deep n-type well DNW1. The respective gate electrodes of the pMIS 300p and the nMIS 300n which form the inverter circuit INV1 are electrically coupled to the respective drain electrodes of the pMIS 200p and the nMIS 200n which form the inverter circuit INV0. In the gate insulating film of the pMIS 300p or the nMIS 300n forming the inverter circuit INV1, a dielectric breakdown has occurred.

As shown in FIG. 26, in the first example of the sixth method according to the present sixth embodiment, a shallow p-type well PW600 formed in the substrate Sub and an n-type diffusion layer formed in the shallow p-type well PW600 form a pn diode Di600. The cathode of the pn diode Di600 and the n-type diffusion tap ND0 for potential fixation which is formed in the shallow n-type well NW0 in the deep n-type well DNW0 are coupled using an interconnection in a second or higher order layer.

In the shallow p-type well PW601 formed in the substrate Sub, a p-type diffusion tap PD601 for potential fixation is formed. In the shallow p-type well PW1 in the deep n-type well DNW1, the p-type diffusion tap PD1 for potential fixation is formed. Further, the p-type diffusion tap PD600 and the p-type diffusion tap PD1 are coupled using an interconnection in a second or higher order layer.

The wiring of the inverter circuit INV0 formed in the deep n-type well DNW0 to the inverter circuit INV1 formed in the deep n-type well DNW1, i.e., the wiring of the respective drain electrodes of the pMIS 200p and the nMIS 200n which form the inverter circuit INV0 to the respective gate electrodes of the pMIS 300p and the nMIS 300p which form the inverter circuit INV1 is performed using an interconnection in the same layer as that of the interconnection used to wire the n-type diffusion layer of the pn diode Di600 to the n-type diffusion tap ND0, and the interconnection used to wire the p-type diffusion tap PD601 to the p-type diffusion tap PD1, or an interconnection in a layer higher in order than that. For example, in the case where the wiring of the n-type diffusion layer of the pn diode Di600 to the n-type diffusion tap ND0 and the wiring of the p-type diffusion tap PD601 to the p-type diffusion tap PD1 are performed using the interconnection in the second layer, the wiring of the inverter circuit INV0 formed in the deep n-type well DNW0 to the inverter circuit INV1 formed in the deep n-type well DNW1 is performed using an interconnection in a second or higher order layer. In the case where the wiring of the n-type diffusion layer of the pn diode Di600 to the n-type diffusion tap ND0 and the wiring of the p-type diffusion tap PD601 to the p-type diffusion tap PD1 are performed using the interconnection in the third layer, the wiring of the inverter circuit INV0 formed in the deep n-type well DNW0 to the inverter circuit INV1 formed in the deep n-type well DNW1 is performed using an interconnection in a third or higher order layer.

As shown in FIG. 27, in the third circuit (circuit in which wiring is provided between the respective drain electrodes of the pMIS 200p and the nMIS 200n which form the inverter circuit INV0 and the respective gate electrodes of the pMIS 300p and the nMIS 300n which form the inverter circuit INV1), when the potential of the substrate Sub is higher than the respective potentials of the deep n-type wells DNW0 and DNW1, the pn diode Di600 forms a forward discharge path extending from the substrate Sub to the deep n-type well DNW0 via the shallow p-type well PW600, the n-type diffusion layer DIn0, the interconnection, the n-type diffusion tap ND0, and the shallow n-type well NW0. In addition, a pn parasitic diode forms a discharge path extending from the substrate Sub to the deep n-type well DNW1 via the shallow p-type well PW601, the p-type diffusion tap PD601, the interconnection, the p-type diffusion tap PD1, and the shallow p-type well PW1.

When the potential of the substrate Sub is lower than the respective potentials of the deep n-type wells DNW0 and DNW1, the pn diode Di600 is in a reverse direction. For example, in a manufacturing step using plasma discharge such as a dry etching step, optical excitation due to light emission or thermal excitation due to heat increases a leakage current in the reverse direction to form a discharge path. Because the respective gate electrodes of the nMIS 300n and the pMIS 300p which are respectively formed in the shallow p-type well PW1 and the shallow n-type well NW1 in the deep n-type well DNW1 are each in a floating state, the nMIS 300n and the pMIS 300p are each brought into a conductive state. As a result, a discharge path is formed which extends from the deep n-type well DNW1 to the substrate Sub via the shallow n-type well NW1, the n-type diffusion tap ND1, the pMIS 300p (the source electrode Sp thereof, the channel region thereof, and the drain electrode Dp thereof), the nMIS 300n (the drain electrode Dn thereof, the channel region thereof, and the source electrode Sn thereof), the interconnection, the p-type diffusion tap PD1, the p-type diffusion tap PD601, and the shallow p-type well PW601.

The formation of the discharge paths mentioned above allows discharge of the charge accumulated in the deep n-type well DNW0, the shallow n-type well NW0, and the shallow p-type well PW0 via the discharge path mentioned above, and likewise allows discharge of the charge accumulated in the deep n-type well DNW1, the shallow n-type well NW1, and the shallow p-type well PW1 via the discharge path mentioned above. As a result, the potential difference between the deep n-type well DNW1 and the deep n-type well DNW0 can be reduced. Therefore, it is possible to prevent a dielectric breakdown in each of the gate insulating films of the pMIS 300p and the nMIS 300n which are respectively formed in the shallow n-type well NW1 and the shallow p-type well PW1 in the deep n-type well DNW1.

FIG. 28 shows a principal-portion plan view of the pn diode Di600 formed in the substrate Sub, the p-type diffusion tap PD601 formed in the shallow p-type well PW601 in the substrate Sub, the n-type diffusion tap ND0 formed in the shallow n-type well NW0 in the deep n-type well DNW0, and the p-type diffusion tap PD1 formed in the shallow p-type well PW1 in the deep n-type well DNW1.

The n-type diffusion layer DIn0 is formed in the shallow p-type well PW600 formed in the substrate Sub, and the p-type diffusion tap PD601 is formed in the shallow p-type well PW601 formed in the substrate Sub. In the interlayer insulating film (not shown) formed over the substrate Sub, the coupling holes CNT1 are formed to reach the n-type diffusion layer DIn0 or the p-type diffusion tap PD601. The interconnection M1 in the first layer is formed to be electrically coupled to the n-type diffusion layer DIn0 or the p-type diffusion tap PD601 through the coupling holes CNT1. In the shallow n-type well NW0 in the deep n-type well DNW0, the n-type diffusion tap ND0 is formed, while in the shallow p-type well PW1 in the deep n-type well DNW1, the p-type diffusion tap PD1 is formed. In the interlayer insulating film (not shown) formed on the substrate (the deep n-type wells DNW0 and DNW1), the coupling holes CNT1 are formed to reach the n-type diffusion tap ND0 or the p-type diffusion tap PD1. The interconnection M1 in the first layer is formed to be electrically coupled to the n-type diffusion tap ND0 or the p-type diffusion tap PD1 through the coupling holes CNT1.

Further, in the interlayer insulating film (not shown) formed over the substrate Sub to cover the interconnection M1 in the first layer, there are formed the coupling holes CNT2 reaching the interconnection M1 in the first layer which is electrically coupled to the n-type diffusion layer DIn0 formed in the shallow p-type well PW600 in the substrate Sub and to the p-type diffusion tap PD601 formed in the shallow p-type well PW601 in the substrate Sub, and the coupling holes CNT2 reaching the interconnection M1 in the first layer which is electrically coupled to the n-type diffusion tap ND0 formed in the shallow n-type well NW0 in the deep n-type well DNW0 and to the p-type diffusion tap PD1 formed in the shallow p-type well PW1 in the deep n-type well DNW1. The n-type diffusion layer DIn0 formed in the shallow p-type well PW600 in the substrate Sub is electrically coupled to the n-type diffusion tap ND0 formed in the shallow n-type well NW0 in the deep n-type well DNW0 using the interconnection M2 in the second layer. Likewise, the p-type diffusion tap PD601 formed in the shallow p-type well PW601 in the substrate Sub is electrically coupled to the p-type diffusion tap PD1 formed in the shallow p-type well PW1 in the deep n-type well DNW1 using the interconnection M2 in the second layer.

Next, the second example of the sixth method will be described.

As described above, the third circuit (FIGS. 4(a) and 4(b) mentioned above) includes the inverter circuit INV0 formed in the deep n-type well DNW0, and the inverter circuit INV1 formed in the deep n-type well DNW1. The respective gate electrodes of the pMIS 300p and the nMIS 300n which form the inverter circuit INV1 are electrically coupled to the respective drain electrodes of the pMIS 200p and the nMIS 200n which form the inverter circuit INV0. In the gate insulating film of the pMIS 300p or the nMIS 300n forming the inverter circuit INV1, a dielectric breakdown has occurred.

As shown in FIG. 29, in the second example of the sixth method according to the present sixth embodiment, the p-type diffusion tap PD600 for potential fixation is formed in the shallow p-type well PW600 in the substrate Sub, and the p-type diffusion tap PD0 for potential fixation is formed in the shallow p-type well PW0 in the deep n-type well DNW0. Further, the p-type diffusion tap PD600 and the p-type diffusion tap PD0 are coupled using an interconnection in a second or higher order layer.

In addition, the shallow p-type well PW601 formed in the substrate Sub and an n-type diffusion layer formed in the shallow p-type well PW601 form a pn diode Di601. The cathode of the pn diode Di601 is coupled to the n-type diffusion tap ND1 for potential fixation which is formed in the shallow n-type well NW1 in the deep n-type well DNW1 using an interconnection in a second or higher order layer.

The wiring of the inverter circuit INV0 formed in the deep n-type well DNW0 to the inverter circuit INV1 formed in the deep n-type well DNW1, i.e., the wiring of the respective drain electrodes of the pMIS 200p and the nMIS 200n which form the inverter circuit INV0 to the respective gate electrodes of the pMIS 300p and the nMIS 300n which form the inverter circuit INV1 is performed using the interconnection in the same layer as that of the interconnection used to wire the p-type diffusion tap PD600 to the p-type diffusion tap PD0, and the interconnection used to wire the n-type diffusion layer of the pn diode Di601 to the n-type diffusion tap ND1, or an interconnection in a layer higher in order than that. For example, in the case where the wiring of the p-type diffusion tap PD600 to the p-type diffusion tap PD0 and the wiring of the n-type diffusion layer of the pn diode Di601 to the n-type diffusion tap ND1 are performed using the interconnection in the second layer, the wiring of the inverter circuit INV0 formed in the deep n-type well DNW0 to the inverter circuit INV1 formed in the deep n-type well DNW1 is performed using an interconnection in a second or higher order layer. In the case where the wiring of the p-type diffusion tap PD600 to the p-type diffusion tap PD0 and the wiring of the n-type diffusion layer of the pn diode Di601 to the n-type diffusion tap ND1 are performed using the interconnection in the third layer, the wiring of the inverter circuit INV0 formed in the deep n-type well DNW0 to the inverter circuit INV1 formed in the deep n-type well DNW1 is performed using an interconnection in a third or higher order layer.

As shown in FIG. 30, in the third circuit (circuit in which wiring is provided between the respective drain electrodes of the pMIS 200p and the nMIS 200n which form the inverter circuit INV0 and the respective gate electrodes of the pMIS 300p and the nMIS 300n which form the inverter circuit INV1), when the potential of the substrate Sub is higher than the respective potentials of the deep n-type wells DNW0 and DNW1, the pn diode Di600 forms a forward discharge path extending from the substrate Sub to the deep n-type well DNW1 via the shallow p-type well PW601, the n-type diffusion layer DIn1, the interconnection, the n-type diffusion tap ND1, and the shallow n-type well NW1. In addition, a pn parasitic diode forms a discharge path extending from the substrate Sub to the deep n-type well DNW0 via the shallow p-type well PW600, the p-type diffusion tap PD600, the interconnection, the p-type diffusion tap PD0, and the shallow p-type well PW0.

When the potential of the substrate Sub is lower than the respective potentials of the deep n-type wells DNW0 and DNW1, the pn diode Di601 is in a reverse direction. For example, in a manufacturing step using plasma discharge such as a dry etching step, optical excitation due to light emission or thermal excitation due to heat increases a leakage current in the reverse direction to form a discharge path. Because the respective gate electrodes of the nMIS 200n and the pMIS 200p which are respectively formed in the shallow p-type well PW0 and the shallow n-type well NW0 in the deep n-type well DNW0 are each in a floating state, the nMIS 200n and the pMIS 200p are each brought into a conductive state. As a result, a discharge path is formed which extends from the deep n-type well DNW0 to the substrate Sub via the shallow n-type well NW0, the p-type diffusion tap ND0, the pMIS 100p (the source electrode Sp thereof, the channel region thereof, and the drain electrode Dp thereof), the nMIS 100n (the drain electrode Dn thereof, the channel region thereof, and the source electrode Sn thereof), the interconnection, the p-type diffusion tap PD600, and the shallow p-type well PW600.

The formation of the discharge path mentioned above allows discharge of the charge accumulated in the deep n-type well DNW0, the shallow n-type well NW0, and the shallow p-type well PW0 via the discharge path mentioned above, and likewise allows discharge of the charge accumulated in the deep n-type well DNW1, the shallow n-type well NW1, and the shallow p-type well PW1 via the discharge path mentioned above. As a result, the potential difference between the deep n-type well DNW1 and the deep n-type well DNW0 is reduced. Therefore, it is possible to prevent a dielectric breakdown in each of the gate insulating films of the pMIS 300p and the nMIS 300n which are respectively formed in the shallow n-type well NW1 and the shallow p-type well PW1 in the deep n-type well DNW1.

In the present sixth embodiment, it is assumed that the n-type diffusion tap ND0 is wired to the cathode of the pn diode Di600 using an interconnection in a second or higher order layer. However, in the case where layout using the interconnection in the first layer is possible, the interconnection in the first layer can also be used for the wiring.

Thus, according to the present sixth embodiment, even when charge is accumulated in the deep n-type well DNW0, the shallow n-type well NW0, and the shallow p-type well PW0, or in the deep n-type well DNW1, the shallow n-type well NW1, and the shallow p-type well PW1, the charge can be easily discharged to the substrate Sub to allow a reduction in the potential difference between the deep n-type well DNW1 and the deep n-type well DNW0. Therefore, it is possible to prevent a dielectric breakdown in each of the gate insulating films of the pMIS 300p and the nMIS 300n which are respectively formed in the shallow n-type well NW1 and the shallow p-type well PW1 in the deep n-type well DNW1 to form the inverter circuit INV1. In particular, in the case where the pMIS 300p and the nMIS 300n which are respectively formed in the shallow n-type well NW1 and the shallow p-type well PW1 in the deep n-type well DNW1 form a digital circuit, the pMIS 200p and the nMIS 200n which are respectively formed in the shallow n-type well NW0 and the shallow p-type well PW0 in the deep n-type well DNW0 form an analog circuit, and each of the pMIS 300p, the nMIS 300n, the pMIS 200p, and the nMIS 200n has a dedicated power supply or ground, i.e., in the case where the power supply of the shallow n-type well NW0 formed in the deep n-type well DNW0 is different from the power supply of the shallow n-type well NW1 formed in the deep n-type well DNW1, and the power supply of the shallow p-type well PW0 formed in the deep n-type well DNW0 is different from the power supply of the shallow p-type well PW1 formed in the deep n-type well DNW1, the sixth method in the present sixth embodiment serves as an effective means.

Embodiment 7

Figure 31:
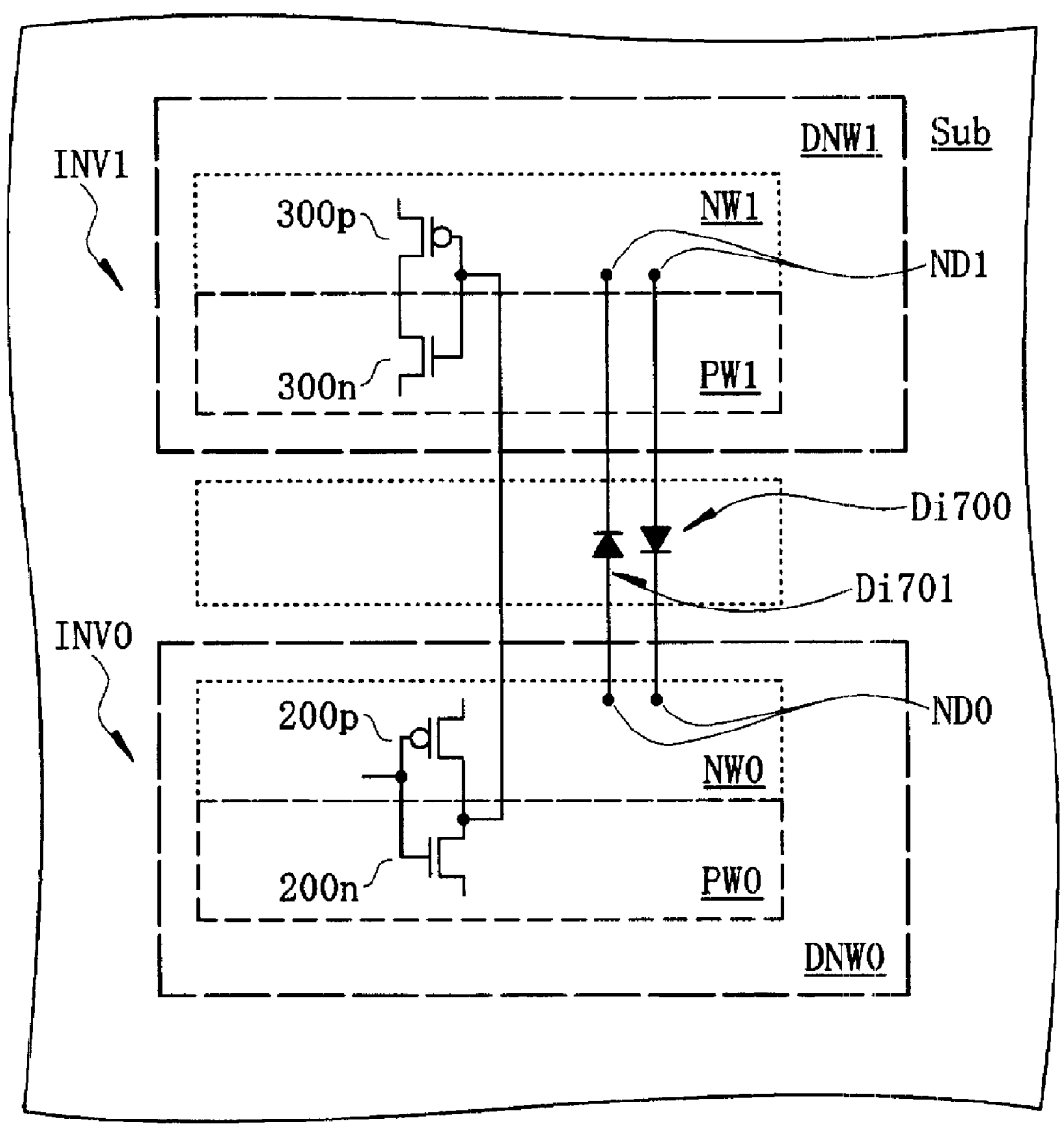
FIG. 31 is a circuit diagram illustrating a first example of a seventh method for preventing a dielectric breakdown in the gate insulating film of a MIS according to a seventh embodiment.
Figure 32:
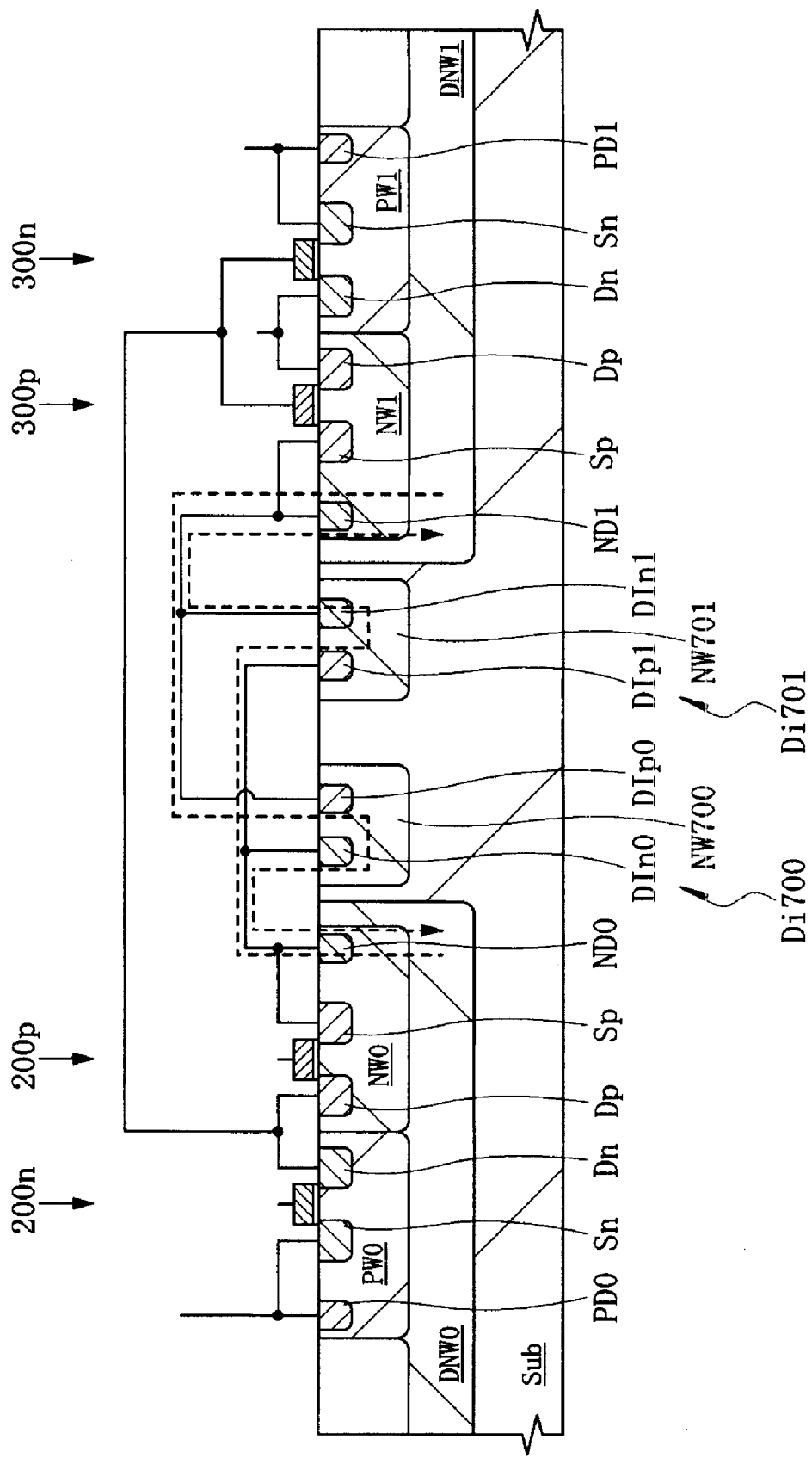
FIG. 32 is a principal-portion cross-sectional view of a third circuit illustrating the first example of the seventh method shown in FIG. 31 mentioned above.
Figure 33:
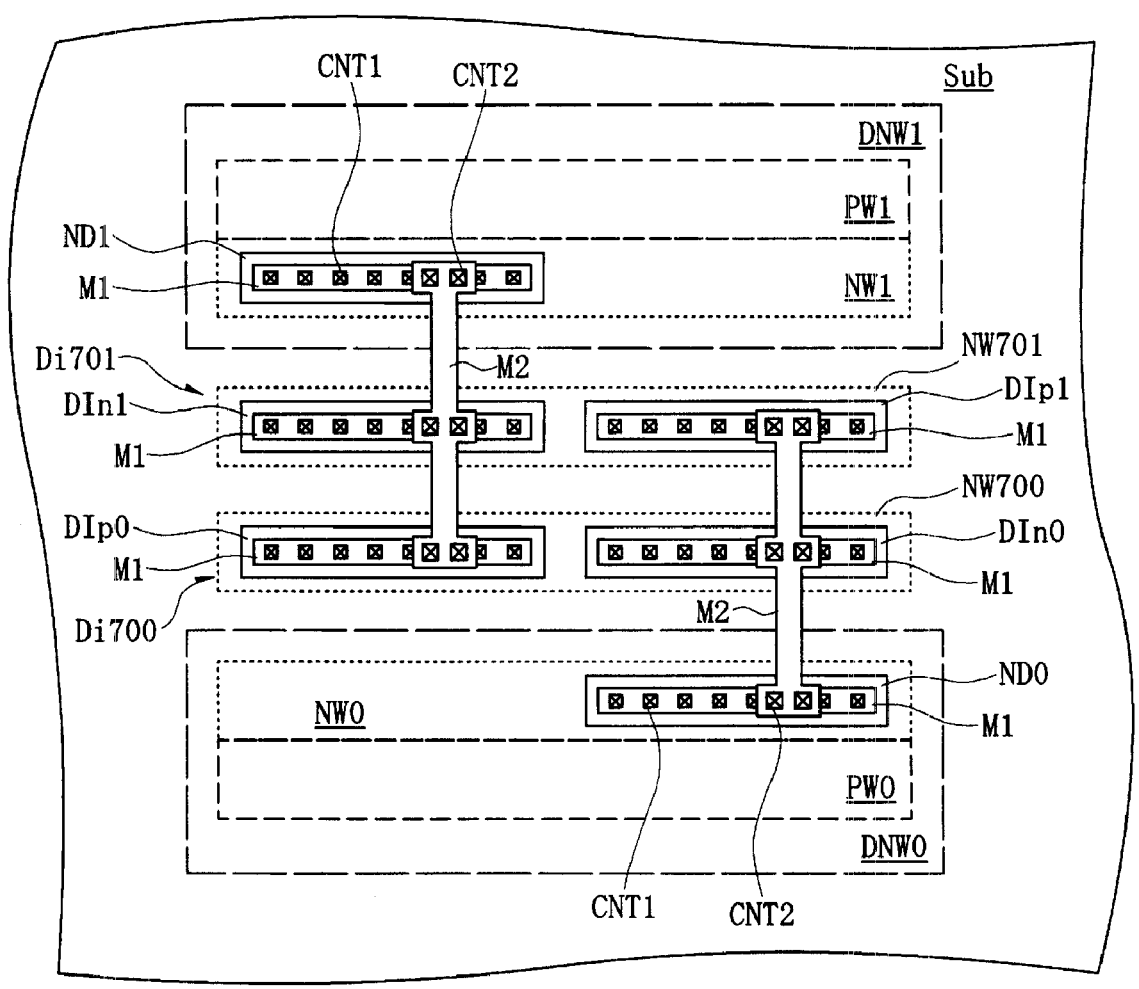
FIG. 33 is a principal-portion plan view of the third circuit illustrating the first example of the seventh method shown in FIG. 31 mentioned above.
Figure 34:
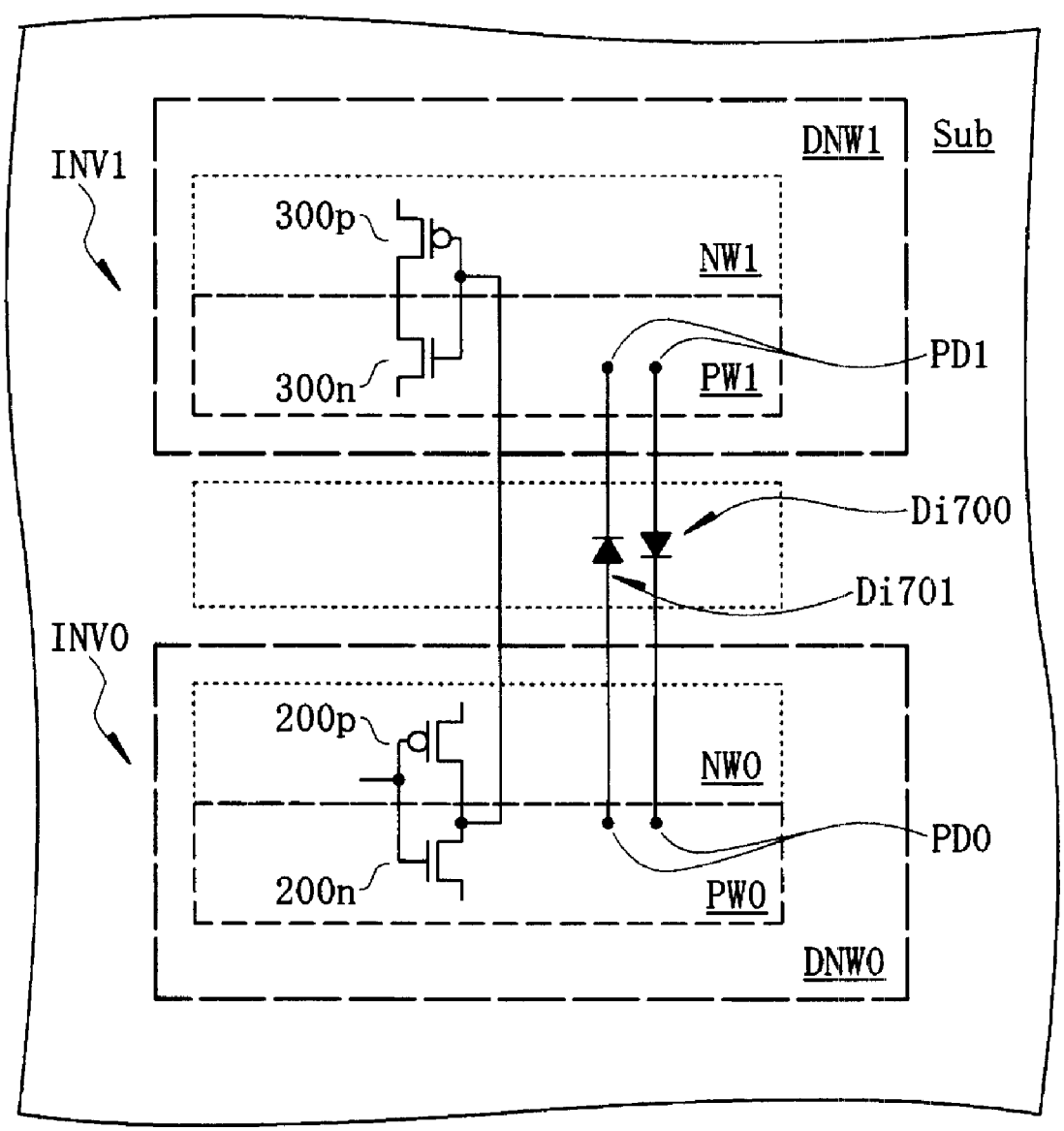
FIG. 34 is a circuit diagram illustrating a second example of the seventh method for preventing a dielectric breakdown in the gate insulating film of a MIS according to the seventh embodiment.
Figure 35:
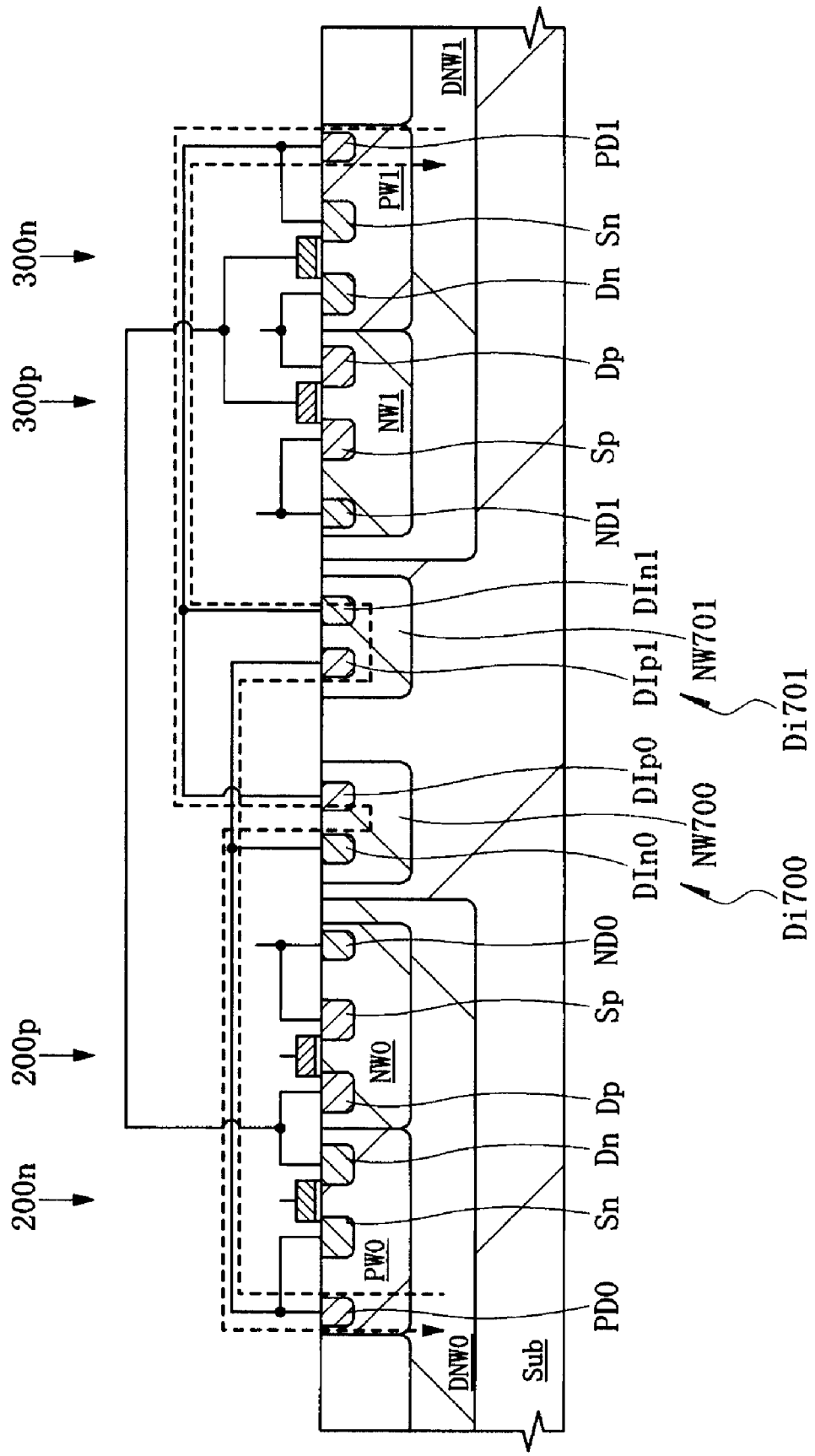
FIG. 35 is a principal-portion cross-sectional view of the third circuit illustrating the second example of the seventh method shown in FIG. 34 mentioned above.
Figure 36:
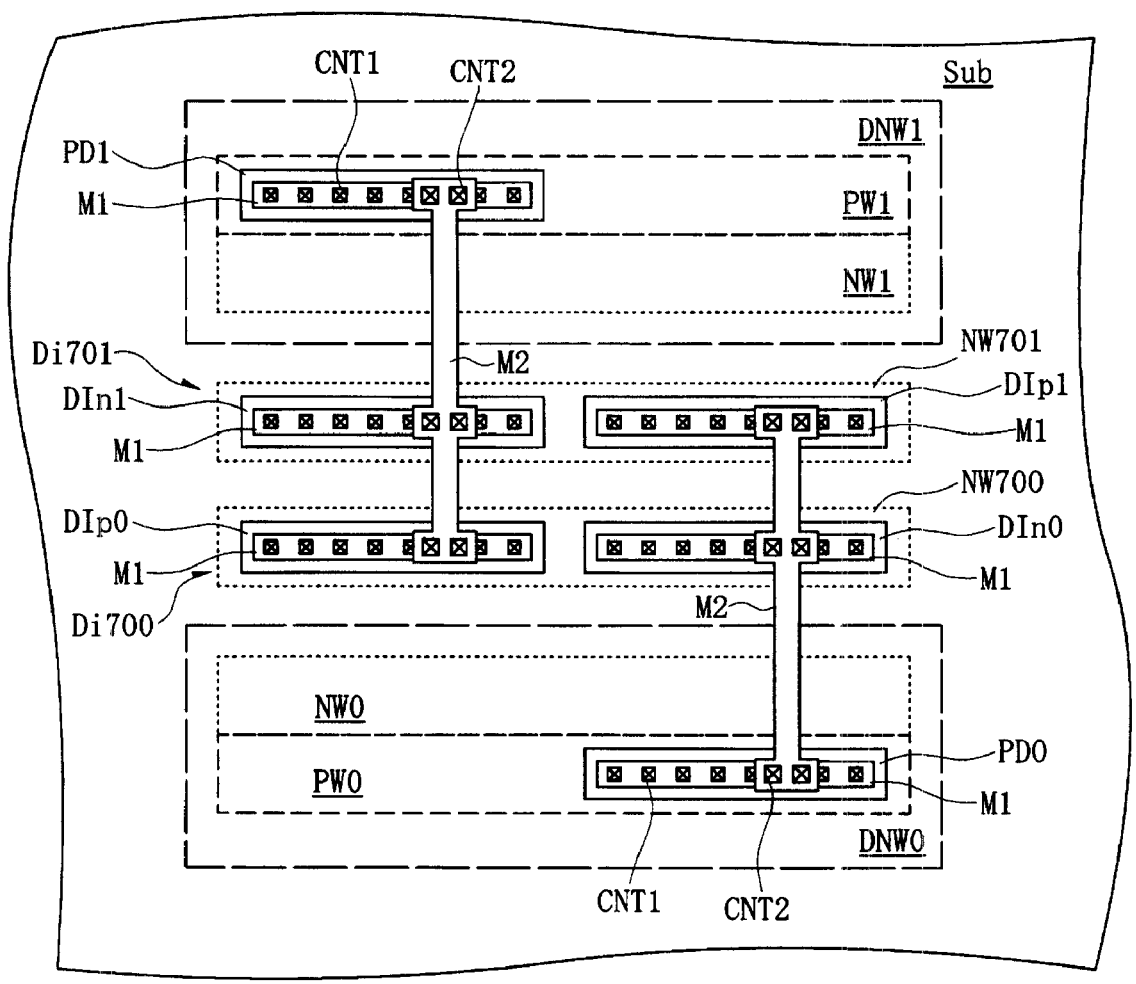
FIG. 36 is a principal-portion plan view of the third circuit illustrating the second example of the seventh method shown in FIG. 34 mentioned above.

In the present seventh embodiment, a description will be given of two examples (first and second examples) of a seventh method for preventing a dielectric breakdown in the gate insulating film of a MIS in the foregoing third circuit (FIGS. 4(a) and 4(b) mentioned above). First, the first example of the seventh method will be described with reference to FIGS. 31 to 33, and then the second example of the seventh method will be described with reference to FIGS. 34 to 36. FIG. 31 is a circuit diagram illustrating the first example of the seventh method for preventing a dielectric breakdown in the gate insulating film of a MIS according to the present seventh embodiment. FIG. 32 is a principal-portion cross-sectional view of the third circuit illustrating the first example of the seventh method shown in FIG. 31 mentioned above. FIG. 33 is a principal-portion plan view of the third circuit illustrating the first example of the seventh method shown in FIG. 31 mentioned above. FIG. 34 is a circuit diagram illustrating the second example of the seventh method for preventing a dielectric breakdown in the gate insulating film of a MIS according to the present seventh embodiment. FIG. 35 is a principal-portion cross-sectional view of the third circuit illustrating the second example of the seventh method shown in FIG. 34 mentioned above. FIG. 36 is a principal-portion cross-sectional view of the third circuit illustrating the second example of the seventh method shown in FIG. 34 mentioned above.

First, the first example of the seventh method will be described.

As described above, the third circuit (FIGS. 4(a) and 4(b) mentioned above) includes the inverter circuit INV0 formed in the deep n-type well DNW0, and the inverter circuit INV1 formed in the deep n-type well DNW1. The respective gate electrodes of the pMIS 300p and the nMIS 300n which form the inverter circuit INV1 are electrically coupled to the respective drain electrodes of the pMIS 200p and the nMIS 200n which form the inverter circuit INV0. In the gate insulating film of the pMIS 300p or the nMIS 300n forming the inverter circuit INV1, a dielectric breakdown has occurred.

As shown in FIG. 31, in the first example of the seventh method according to the present seventh embodiment, the n-type diffusion tap ND0 for potential fixation is formed in the shallow n-type well NW0 in the deep n-type well DNW0, while the n-type diffusion tap ND1 for potential fixation is formed in the shallow n-type well NW1 in the deep n-type well NW1. Further, between the n-type diffusion tap ND0 and the n-type diffusion tap ND1, bidirectional diodes Di700 and Di701 are formed using an interconnection in a second or higher order layer.

The wiring of the inverter circuit INV0 formed in the deep n-type well DNW0 to the inverter circuit INV1 formed in the deep n-type well DNW1, i.e., the wiring of the respective drain electrodes of the pMIS 200p and the nMIS 200n which form the inverter circuit INV0 to the respective gate electrodes of the pMIS 300p and the nMIS 300p which form the inverter circuit INV1 is performed using an interconnection in the same layer as that of the interconnection used to form the bidirectional diodes Di700 and Di 701, or an interconnection in a layer higher in order than that. For example, in the case where the interconnection in the second layer is used to form the bidirectional diodes Di700 and Di 701, the wiring of the inverter circuit INV0 formed in the deep n-type well DNW0 to the inverter circuit INV1 formed in the deep n-type well DNW1 is performed using an interconnection in a second or higher order layer. In the case where the interconnection in the third layer is used to form the bidirectional diodes Di700 and Di 701, the wiring of the inverter circuit INV0 formed in the deep n-type well DNW0 to the inverter circuit INV1 formed in the deep n-type well DNW1 is performed using an interconnection in a third or higher order layer.

As shown in FIG. 32, in the third circuit (circuit in which wiring is provided between the respective drain electrodes of the pMIS 200p and the nMIS 200n which form the inverter circuit INV0 and the respective gate electrodes of the pMIS 300p and the nMIS 300n which form the inverter circuit INV1), the n-type diffusion tap ND0 formed in the shallow n-type well NW0 in the deep n-type well DMW0 is wired to the cathode (the n-type diffusion layer DIn0 formed in a shallow n-type well NW700 in the substrate Sub) of the bidirectional diode Di700 and to the anode (the p-type diffusion layer DIp1 formed in a shallow n-type well NW701 in the substrate Sub) of the bidirectional diode Di701, and the n-type diffusion tap ND1 formed in the shallow n-type well NW1 in the deep n-type well DMW1 is wired to the anode (a p-type diffusion layer DIp0 formed in the shallow n-type well NW700 in the substrate Sub) of the bidirectional diode Di700 and to the cathode (the n-type diffusion layer DIn1 formed in the shallow n-type well NW701 in the substrate Sub) of the bidirectional diode Di701. This forms a discharge path extending from the deep n-type well DNW0 to the deep n-type well DNW1 via the shallow n-type well NW0, the n-type diffusion tap ND0, the interconnection, the bidirectional diode Di701 (the n-type diffusion layer DIn1, the shallow n-type well NW701, and the p-type diffusion layer DIp1), the interconnection, the n-type diffusion tap ND1, and the shallow n-type well NW1. This also forms a discharge path extending from the deep n-type well DNW1 to the deep n-type well DNW0 via the shallow n-type well NW1, the n-type diffusion tap ND1, the interconnection, the pn diode Di700 (the p-type diffusion layer DIp0, the shallow n-type well NW700, and the n-type diffusion layer DIn0), the interconnection, the n-type diffusion tap ND0, and the shallow n-type well NW0.

The formation of the discharge paths mentioned above allows discharge of the charge accumulated in the deep n-type well DNW0, the shallow n-type well NW0, and the shallow p-type well PW0 or the charge accumulated in the deep n-type well DNW1, the shallow n-type well NW1, and the shallow p-type well PW1 via the discharge path mentioned above even when a potential difference occurs between the deep n-type well DNW1 and the deep n-type well DNW0. As a result, the potential difference between the deep n-type well DNW1 and the deep n-type well DNW0 is reduced. Therefore, it is possible to prevent a dielectric breakdown in each of the gate insulating films of the pMIS 300p and the nMIS 300n which are respectively formed in the shallow n-type well NW1 and the shallow p-type well PW1 in the deep n-type well DNW1.

FIG. 33 shows a principal-portion plan view of the bidirectional diodes Di700 and Di701 formed in the substrate Sub, the n-type diffusion tap ND0 formed in the deep n-type well DNW0, and the n-type diffusion tap ND1 formed in the deep n-type well DNW1.

In the mutually different regions in the shallow n-type well NW700 formed in the substrate Sub, the n-type diffusion layer DIn0 and the p-type diffusion layer DIp0 are formed (Di700). In the mutually different regions in the shallow n-type well NW701 formed in the substrate Sub, the n-type diffusion layer DIn1 and the p-type diffusion layer DIp1 are formed (Di701). In the interlayer insulating film (not shown) formed over the substrate Sub, the coupling holes CNT1 are formed to individually reach the n-type diffusion layers DIn0 and DIn1 and the p-type diffusion layers DIp0 and DIp1. The n-type diffusion tap ND0 is formed in the shallow n-type well NW0 in the deep n-type well DNW0, while the n-type diffusion tap ND1 is formed in the shallow n-type well NW1 in the deep n-type well DNW1. In the interlayer insulating film (not shown) formed over the substrate Sub (the deep n-type wells DNW0 and DNW1), the coupling holes CNT1 are formed to individually reach the n-type diffusion taps ND0 and ND1, the n-type diffusion layers DIn0 and DIn1, and the p-type diffusion layers DIp0 and DIp1. The interconnection M1 in the first layer is formed to be electrically coupled to the n-type diffusion taps ND0 and ND1, the n-type diffusion layers DIn0 and DIn1, and the p-type diffusion layers DIp0 and DIp1 through the coupling holes CNT1.

Further, in the interlayer insulating film (not shown) formed over the substrate Sub to cover the interconnection M1 in the first layer, there are formed the coupling holes CNT2 reaching the interconnection M1 in the first layer which is electrically coupled to the n-type diffusion layer DIn0 and the p-type diffusion layer DIp0 each formed in the shallow n-type well NW700 in the substrate Sub and to the n-type diffusion layer DIn1 and the p-type diffusion layer DIp1 each formed in the shallow n-type well NW701 in the substrate Sub, and the coupling holes CNT2 reaching the interconnection M1 in the first layer which is electrically coupled to the n-type diffusion tap ND0 and the n-type diffusion tap ND1 which are respectively formed in the shallow n-type well NW0 in the deep n-type well DNW0 and the shallow n-type well NW1 in the deep n-type well DNW1. The p-type diffusion layer DIp1 (the bidirectional diode Di701) formed in the shallow n-type well NW701 in the substrate Sub, the n-type diffusion layer DIn0 (the bidirectional diode Di700) formed in the shallow n-type well NW700 in the substrate Sub, and the n-type diffusion tap ND0 formed in the shallow n-type well NW0 in the deep n-type well DNW0 are electrically coupled using the interconnection M2 in the second layer. The p-type diffusion layer DIp0 (the bidirectional diode Di700) formed in the shallow n-type well NW700 in the substrate Sub, the n-type diffusion layer DIn1 (the bidirectional diode Di701) formed in the shallow n-type well NW701 in the substrate Sub, and the n-type diffusion tap ND1 in the shallow n-type well NW1 formed in the deep n-type well DNW1 are electrically coupled using the interconnection M2 in the second layer.

Next, the second example of the seventh method will be described.

As described above, the third circuit (FIGS. 4(a) and 4(b) mentioned above) includes the inverter circuit INV0 formed in the deep n-type well DNW0, and the inverter circuit INV1 formed in the deep n-type well DNW1. The respective gate electrodes of the pMIS 300p and the nMIS 300n which form the inverter circuit INV1 are electrically coupled to the respective drain electrodes of the pMIS 200p and the nMIS 200n which form the inverter circuit INV0. In the gate insulating film of the pMIS 300p or the nMIS 300n which form the inverter circuit INV1, a dielectric breakdown has occurred.

As shown in FIG. 34, in the second example of the seventh method according to the present seventh embodiment, the p-type diffusion tap PD0 for potential fixation is formed in the shallow p-type well PW0 in the deep n-type well DNW0, and the p-type diffusion tap PD1 for potential fixation is formed in the shallow p-type well PW1 in the deep n-type well DNW1. Further, the bidirectional diodes Di700 and Di701 are formed between the p-type diffusion tap PD0 and the p-type diffusion tap PD1 using an interconnection in a second or higher order layer.

The wiring of the inverter circuit INV0 formed in the deep n-type well DNW0 and the inverter circuit INV1 formed in the deep n-type well DNW1, i.e., the wiring of the respective drain electrodes of the pMIS 200p and the nMIS 200n which form the inverter circuit INV0 to the respective gate electrodes of the pMIS 300p and the nMIS 300p which form the inverter circuit INV1 is performed using an interconnection in the same layer as that of the interconnection used to form the bidirectional diodes Di700 and Di 701, or an interconnection in a layer higher in order than that. For example, in the case where the interconnection in the second layer is used to form the bidirectional diodes Di700 and Di 701, the wiring of the inverter circuit INV0 formed in the deep n-type well DNW0 to the inverter circuit INV1 formed in the deep n-type well DNW1 is performed using an interconnection in a second or higher order layer. In the case where the interconnection in the third layer is used to form the bidirectional diodes Di700 and Di 701, the wiring of the inverter circuit INV0 formed in the deep n-type well DNW0 to the inverter circuit INV1 formed in the deep n-type well DNW1 is performed using an interconnection in a third or higher order layer.

As shown in FIG. 35, in the third circuit (circuit in which wiring is provided between the respective drain electrodes of the pMIS 200p and the nMIS 200n which form the inverter circuit INV0 and the respective gate electrodes of the pMIS 300p and the nMIS 300n which form the inverter circuit INV1), the p-type diffusion tap PD0 formed in the shallow p-type well PW0 in the deep n-type well DMW0 is wired to the cathode (the n-type diffusion layer DIn0 formed in the shallow n-type well NW700 in the substrate Sub) of the bidirectional diode Di700 and to the anode (the p-type diffusion layer DIp1 formed in the shallow n-type well NW701 in the substrate Sub) of the bidirectional diode Di701, and the p-type diffusion tap PD1 formed in the shallow p-type well PW1 in the deep n-type well DMW1 is wired to the cathode (the n-type diffusion layer DIn1 formed in the shallow n-type well NW701 in the substrate Sub) of the bidirectional diode Di701 and to the anode (the p-type diffusion layer DIp0 formed in the shallow n-type well NW700 in the substrate Sub) of the bidirectional diode Di700. This forms a discharge path extending from the deep n-type well DNW0 to the deep n-type well DNW1 via the shallow p-type well PW0, the p-type diffusion tap PD0, the interconnection, the pn diode Di701 (the p-type diffusion layer DIp1, the shallow n-type well NW701, and the n-type diffusion layer DIn1), the interconnection, the p-type diffusion tap PD1, and the shallow p-type well PW1. This also forms a discharge path extending from the deep n-type well DNW1 to the deep n-type well DNW0 via the shallow p-type well PW1, the p-type diffusion tap PD1, the interconnection, the pn diode Di700 (the p-type diffusion layer DIp0, the shallow n-type well NW700, and the n-type diffusion layer DIn0), the interconnection, the p-type diffusion tap PD0, and the shallow p-type well PW0.

The formation of the discharge paths mentioned above allows discharge of the charge accumulated in the deep n-type well DNW0, the shallow n-type well NW0, and the shallow p-type well PW0 or the charge accumulated in the deep n-type well DNW1, the shallow n-type well NW1, and the shallow p-type well PW1 via the discharge path mentioned above even when a potential difference occurs between the deep n-type well DNW1 and the deep n-type well DNW0. As a result, the potential difference between the deep n-type well DNW1 and the deep n-type well DNW0 is reduced. Therefore, it is possible to prevent a dielectric breakdown in each of the gate insulating films of the pMIS 300p and the nMIS 300n which are respectively formed in the shallow n-type well NW1 and the shallow p-type well PW1 in the deep n-type well DNW1.

FIG. 36 shows a principal-portion plan view of the bidirectional diodes Di700 and Di701 formed in the substrate Sub, the n-type diffusion tap ND0 formed in the deep n-type well DNW0, and the n-type diffusion tap ND1 formed in the deep n-type well DNW1.

In the mutually different regions in the shallow n-type well NW700 formed in the substrate Sub, the n-type diffusion layer DIn0 and the p-type diffusion layer DIp0 are formed (Di700). In the mutually different regions in the shallow n-type well NW701 formed in the substrate Sub, the n-type diffusion layer DIn1 and the p-type diffusion layer DIp1 are formed (Di701). In the interlayer insulating film (not shown) formed over the substrate Sub, the coupling holes CNT1 are formed to individually reach the n-type diffusion layers DIn0 and DIn1 and the p-type diffusion layers DIp0 and DIp1. The p-type diffusion tap PD0 is formed in the shallow p-type well PW0 in the deep n-type well DNW0, while the p-type diffusion tap PD1 is formed in the shallow p-type well PW1 in the deep n-type well DNW1. In the interlayer insulating film (not shown) formed over the substrate Sub (the deep n-type wells DNW0 and DNW1), the coupling holes CNT1 are formed to individually reach the p-type diffusion taps PD0 and PD1, the n-type diffusion layers DIn0 and DIn1, and the p-type diffusion layers DIp0 and DIp1. The interconnection M1 in the first layer is formed to be electrically coupled to the p-type diffusion taps PD0 and PD1, the n-type diffusion layers DIn0 and DIn1, and the p-type diffusion layers DIp0 and DIp1 through the coupling holes CNT1.

Further, in the interlayer insulating film (not shown) formed over the substrate Sub to cover the interconnection M1 in the first layer, there are formed the coupling holes CNT2 reaching the interconnection M1 in the first layer which is electrically coupled to the n-type diffusion layer DIn0 and the p-type diffusion layer DIp0 each formed in the shallow n-type well NW700 in the substrate Sub and to the n-type diffusion layer DIn and the p-type diffusion layer DIp1 each formed in the shallow n-type well NW701 in the substrate Sub, and the coupling holes CNT2 reaching the interconnection M1 in the first layer which is electrically coupled to the p-type diffusion tap PD0 and the p-type diffusion tap PD1 which are respectively formed in the shallow p-type well PW0 in the deep n-type well DNW0 and the shallow p-type well PW1 in the deep n-type well DNW1. The n-type diffusion layer DIn1 (the bidirectional diode Di701) formed in the shallow n-type well NW701 in the substrate Sub, the n-type diffusion layer DIn0 (the bidirectional diode Di700) formed in the shallow n-type well NW700 in the substrate Sub, and the p-type diffusion tap PD0 formed in the shallow p-type well PW0 in the deep n-type well DNW0 are electrically coupled using the interconnection M2 in the second layer. The p-type diffusion layer DIp0 (the bidirectional diode Di700) formed in the shallow n-type well NW700 in the substrate Sub, the n-type diffusion layer DIn1 (the bidirectional diode Di701) formed in the shallow n-type well NW701 in the substrate Sub, and the p-type diffusion tap PD1 in the shallow p-type well PW1 formed in the deep n-type well DNW1 are electrically coupled using the interconnection M2 in the second layer.

In the present seventh embodiment, it is assumed that the wiring of the n-type diffusion tap ND0 to the cathode of the pn diode Di700 and to the anode of the pn diode Di701 and the wiring of the n-type diffusion tap ND1 to the anode of the pn diode Di700 and to the cathode of the pn diode Di701 in the first example, and the wiring of the p-type diffusion tap PD0 to the cathode of the pn diode 700 and to the anode of the pn diode Di701 and the wiring of the p-type diffusion tap PD1 to the anode of the pn diode 700 and to the cathode of the pn diode 701 are each performed using an interconnection in a second or higher order layer. However, in the case where layout using the interconnection in the first layer is possible, the interconnection in the first layer can also be used for the wiring.

Thus, according to the present seventh embodiment, even when charge is accumulated in the deep n-type well DNW0, the shallow n-type well NW0, and the shallow p-type well PW0, or in the deep n-type well DNW1, the shallow n-type well NW1, and the shallow p-type well PW1, the charge can be easily discharged to another well region to allow a reduction in the potential difference between the deep n-type well DNW1 and the deep n-type well DNW0. Therefore, it is possible to prevent a dielectric breakdown in each of the gate insulating films of the pMIS 300p and the nMIS 300n which are respectively formed in the shallow n-type well NW1 and the shallow p-type well PW1 in the deep n-type well DNW1 to form the inverter circuit INV1. In particular, in the case where the shallow p-type well PW0 and the shallow n-type well NW0 each formed in the deep n-type well DNW0 form an analog circuit, and have respective particular power supplies or ground potentials, and the shallow p-type well PW1 and the shallow n-type well N1 each formed in the deep n-type well DNW1 form another analog circuit, and have respective particular power supplies or ground potential which are different from the power supplies or the ground potentials applied to the shallow p-type well PW0 and the shallow n-type well NW0 each formed in the deep n-type well DNW0, i.e., in the case where the power supply of the shallow p-type well PW0 formed in the deep n-type well DNW0 is different from the power supply of the shallow p-type well PW1 formed in the deep n-type well DNW1, and the power supply of the shallow n-type well NW0 formed in the deep n-type well DNW0 is different from the power supply of the shallow n-type well NW1 formed in the deep n-type well DNW1, the seventh method in the present seventh embodiment serves as an effective means.

While the invention achieved by the present inventors has been described specifically based on the embodiments of the invention, it will be easily appreciated that the present invention is not limited to the embodiments described above, and various changes and modification can be made therein without departing from the gist thereof.

The present invention provides a technology which is effective when applied to a semiconductor device having a triple well structure adopted to, e.g., a versatile SOC product.

What is claimed is:

1. A semiconductor device comprising:
   a substrate of a first conductivity type;
   a deep well of a second conductivity type different from the first conductivity type which is formed in the substrate;
   a first shallow well of the first conductivity type and a second shallow well of the second conductivity type which are formed in mutually different regions in the substrate;
   a first field effect transistor of the second conductivity type which is formed in the first shallow well;
   a second field effect transistor of the first conductivity type which is formed in the second shallow well;

a third shallow well of the first conductivity type and a fourth shallow well of the second conductivity type which are formed in mutually different regions in the deep well;

a third field effect transistor of the second conductivity type which is formed in the third shallow well; and a fourth field effect transistor of the first conductivity type which is formed in the fourth shallow well, wherein the semiconductor device further comprises:

a fifth shallow well of the first conductivity type which is formed in a region different from respective regions in the substrate where the deep well, the first shallow well, and the second shallow well are formed; and a fifth diffusion tap of the first conductivity type which is formed in the fifth shallow well, wherein the fifth diffusion tap is wired to a third diffusion tap of the first conductivity type which is formed in the third shallow well using an interconnection in an n-th layer, and wherein respective gate electrodes of the third field effect transistor and the fourth field effect transistor are wired to respective drain electrodes of the first field effect transistor and the second field effect transistor using an interconnection in an n-th or higher order layer.

2. A semiconductor device according to claim 1, wherein the substrate and the third shallow well are at the same potential.

3. A semiconductor device according to claim 1, wherein the interconnection in the n-th layer is an interconnection in a second layer.

4. A semiconductor device according to claim 1, wherein the first field effect transistor and the second field effect transistor form an inverter circuit, and the third field effect transistor and the fourth field effect transistor form another inverter circuit.

* * * * *